United States Patent [19]
Nakazato et al.

[11] Patent Number: 5,324,982
[45] Date of Patent: Jun. 28, 1994

[54] SEMICONDUCTOR MEMORY DEVICE HAVING BIPOLAR TRANSISTOR AND STRUCTURE TO AVOID SOFT ERROR

[75] Inventors: Shinji Nakazato; Hideaki Uchida; Yoshikazu Saito; Masahiro Yamamura, all of Takasaki; Yutaka Kobayashi, Katsuta; Takahide Ikeda, Tokorozawa; Ryoichi Hori, Tokyo; Goro Kitsukawa, Tokyo; Kiyoo Itoh, Tokyo, all of Japan; Nobuo Tanba, Alto, Calif.; Takao Watanabe, New Haven, Conn.; Katsuhiro Shimohigashi; Noriyuki Homma, both of Tokyo, Japan

[73] Assignee: Hitachi, Ltd., Tokyo, Japan

[21] Appl. No.: 769,680

[22] Filed: Oct. 2, 1991

Related U.S. Application Data

[63] Continuation of Ser. No. 645,351, Jan. 23, 1991, Pat. No. 5,148,255, which is a continuation of Ser. No. 262,030, Oct. 25, 1988, abandoned, which is a continuation-in-part of Ser. No. 87,256, Jul. 13, 1987, abandoned, Ser. No. 29,681, Mar. 24, 1987, abandoned, and Ser. No. 899,405, Aug. 22, 1986, abandoned.

[30] Foreign Application Priority Data

| Sep. 25, 1985 | [JP] | Japan | 60-209971 |
| Nov. 20, 1985 | [JP] | Japan | 60-258506 |
| Mar. 24, 1986 | [JP] | Japan | 61-64055 |
| Mar. 26, 1986 | [JP] | Japan | 61-65696 |
| Aug. 1, 1986 | [JP] | Japan | 61-179913 |

[51] Int. Cl.$^5$ .................. H01L 27/04; H01L 29/70
[52] U.S. Cl. ..................... 257/546; 257/355; 257/376; 257/904
[58] Field of Search ................ 257/355–363, 257/370, 372, 373, 376, 546, 904

[56] References Cited

U.S. PATENT DOCUMENTS

| 4,044,373 | 8/1977 | Nomiya et al. | 257/356 |
| 4,143,391 | 3/1979 | Suzuki et al. | 257/372 |
| 4,325,180 | 4/1982 | Curran | 257/370 |
| 4,724,221 | 2/1988 | Jochems | 257/370 |
| 4,757,363 | 7/1988 | Bohm | 257/373 |

FOREIGN PATENT DOCUMENTS

| 7147270 | 9/1982 | Japan | 257/356 |
| 0254651 | 12/1985 | Japan | 257/363 |

*Primary Examiner*—Robert Limanek
*Attorney, Agent, or Firm*—Antonelli, Terry, Stout & Kraus

[57] ABSTRACT

Disclosed is a semiconductor device, such as a semiconductor memory device, having structure wherein invasion of minority carriers from the semiconductor substrate into components of the device, formed on the substrate, can be avoided. The semiconductor memory device can be an SRAM or DRAM, for example, and includes a memory array and peripheral circuit on a substrate. In one aspect of the present invention, a buried layer of the same conductivity type as that of the substrate, but with a higher impurity concentration than that of the substrate, is provided beneath at least one of the peripheral circuit and memory array. A further region can extend from the buried layer, for example, to the surface of the semiconductor substrate, the buried layer and further region in combination acting as a shield to prevent minority carriers from penetrating to the device elements. As a second aspect of the present invention, first carrier absorbing areas (to absorb minority carriers) are located between the memory array and the switching circuit of the peripheral circuit, and second carrier absorbing areas are provided to surround input protective elements of the device. As a third embodiment of the present invention, a plurality of isolation regions of the same conductivity type are provided, with unequal voltages applied to these isolation regions, or unequal voltages applied to the substrate, on the one hand, and to these isolation regions, on the other.

31 Claims, 32 Drawing Sheets

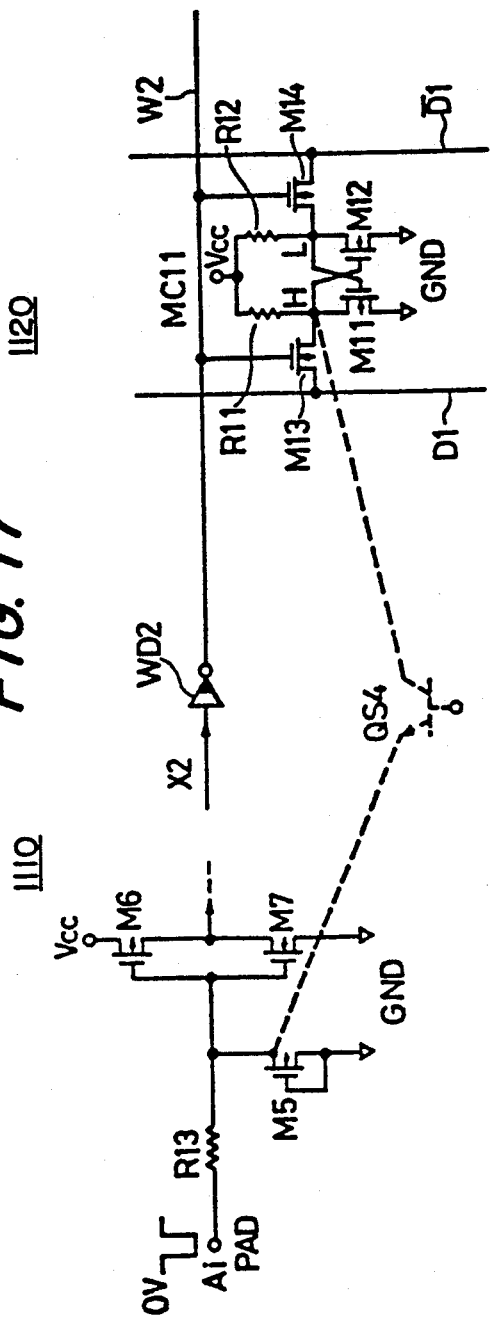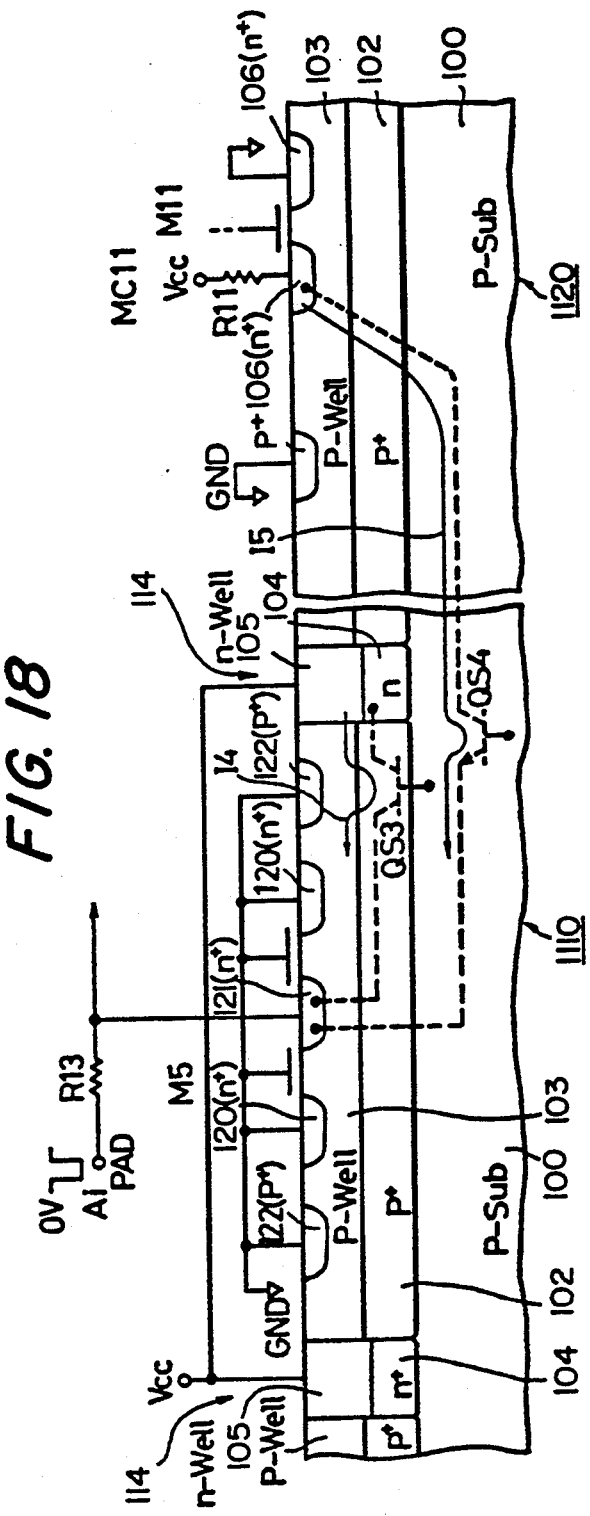
FIG. 17
FIG. 18

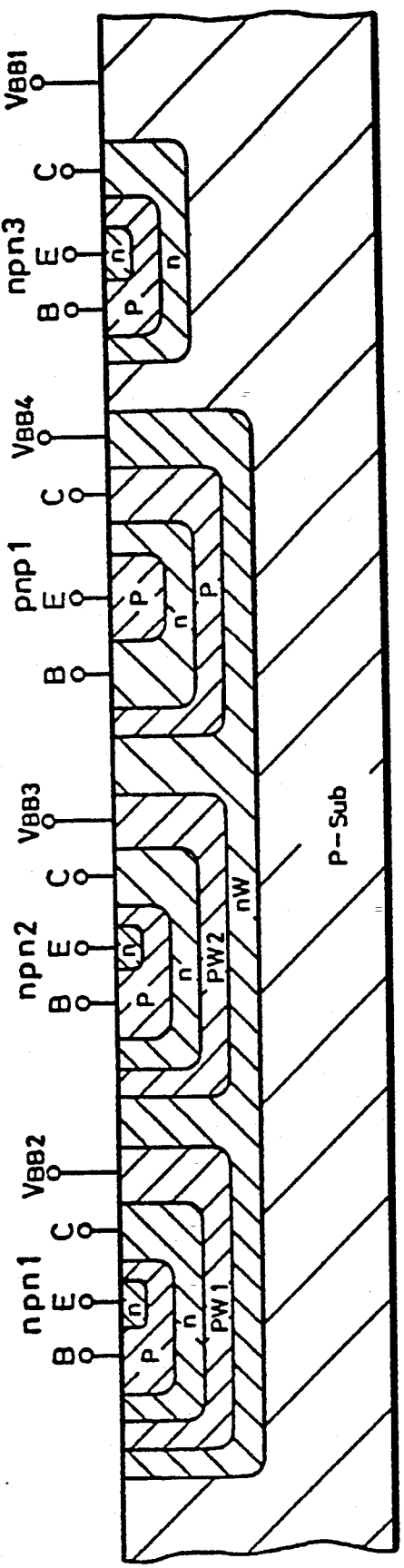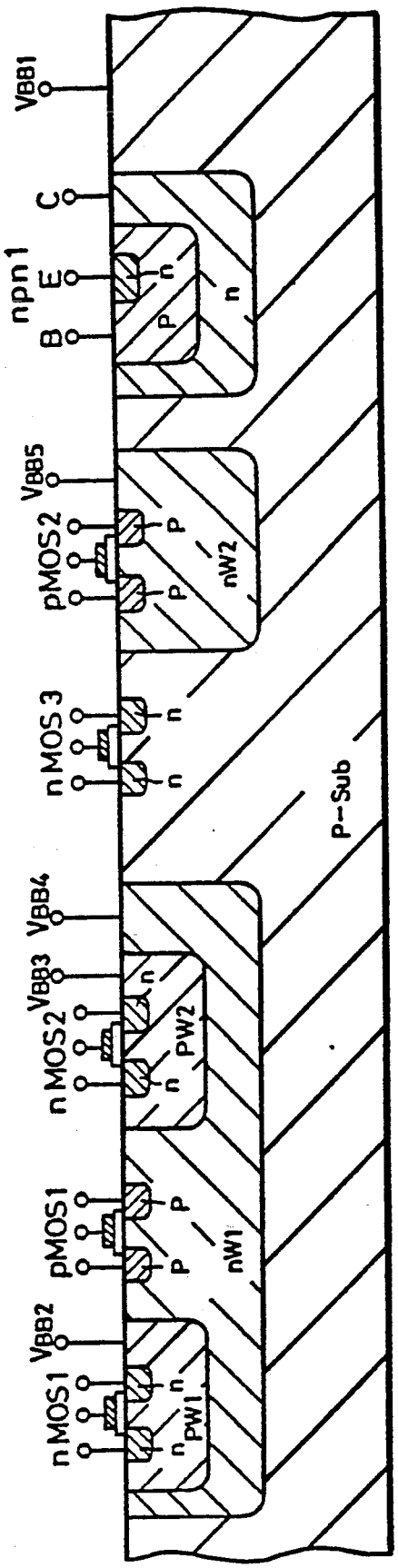

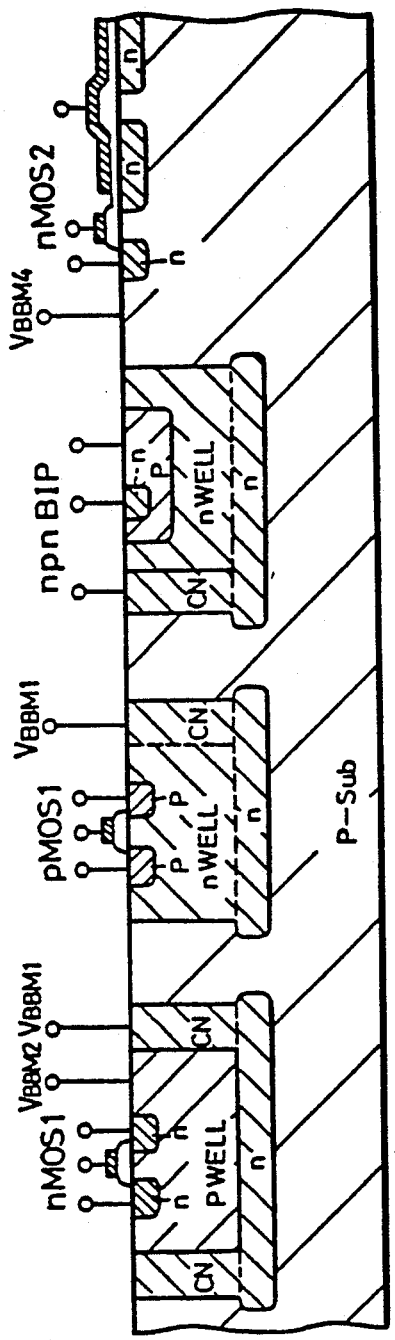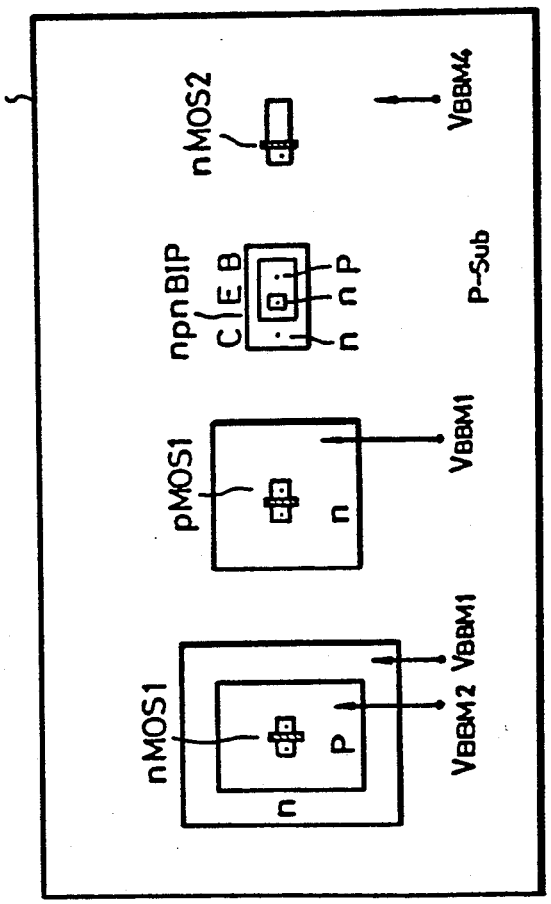
FIG. 48
FIG. 49

FIG. 50
(a)
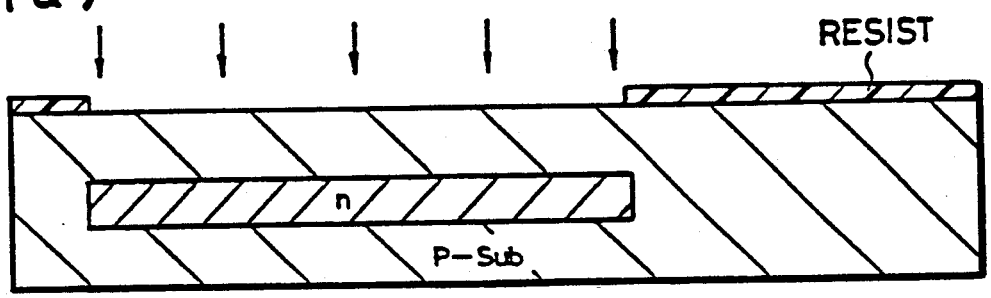
(b)
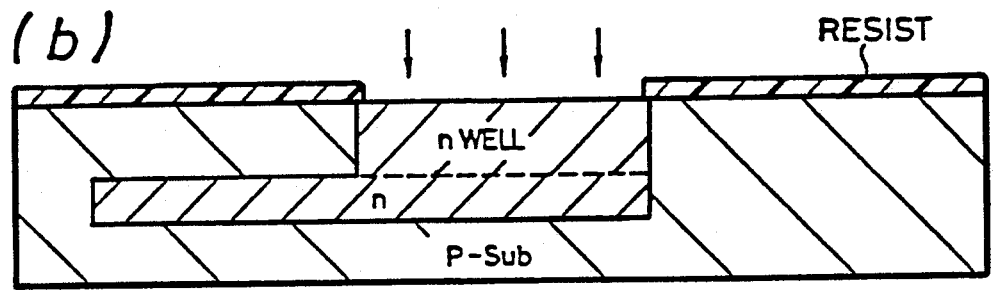
(c)
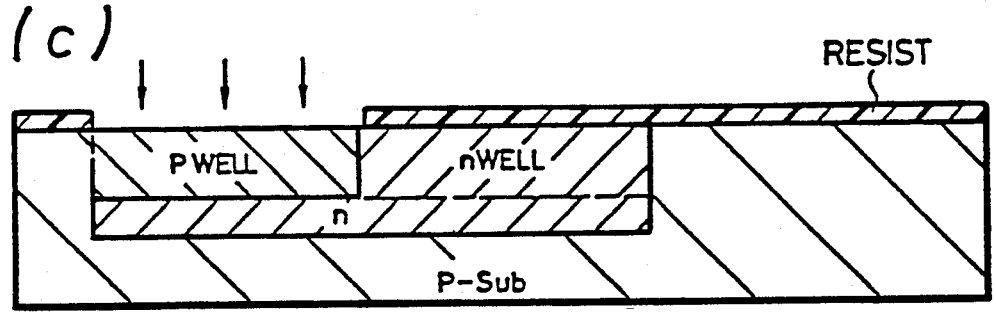
(d)
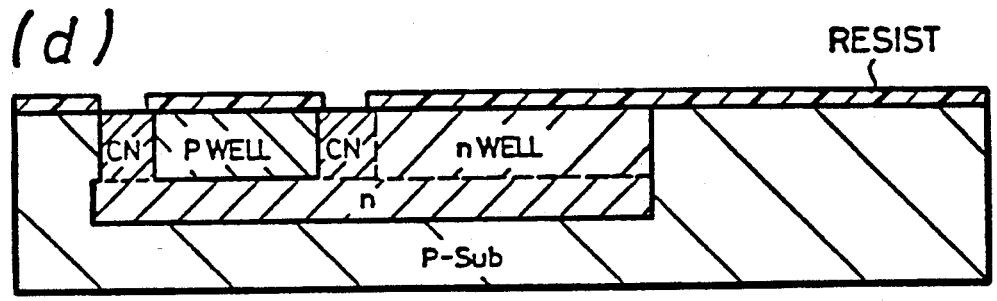

SEMICONDUCTOR MEMORY DEVICE HAVING BIPOLAR TRANSISTOR AND STRUCTURE TO AVOID SOFT ERROR This application is a continuing application of application Ser. No. 07/645,351, filed Jan. 23, 1991, now U.S. Pat. No. 5,148,255, which is a continuing application of application Ser. No. 07/262,030, filed on Oct. 25, 1988, now abandoned, (2) application Ser. No. 087,256, filed Jul. 13, 1987 now abandoned; and (3) application Ser. No. 029,681, filed Mar. 24, 1987 now abandoned, which is a continuation-in-part application of (1) application Ser. No. 899,405, filed Aug. 22, 1986, now abandoned.

BACKGROUND OF THE INVENTION

The present invention relates to a semiconductor integrated circuit device which has a bipolar transistor and a MISFET (Metal-Insulator-Semiconductor Field Effect Transistor). More particularly, it relates to techniques which are effective when applied to a memory device, such as a DRAM (Dynamic Random Access Memory) device or a SRAM (Static Random Access Memory) device having bipolar transistors, particularly both bipolar transistors and MISFETs.

Even more particularly, it relates to a random access memory with high speed and low consumption of power, where a switching circuit as a complex circuit of a bipolar transistor and metal-oxide semiconductor field effect transistor (hereinafter referred to as "MOSFET") is adopted as a peripheral circuit (address circuit, timing circuit or the like) of the memory. Moreover, this invention relates to techniques for isolation between elements of the device.

Generally, the present invention is directed to techniques in semiconductor memories, such as Bi-CMOS (bipolar transistor-complementary metal-oxide-semiconductor structure) memories, to avoid destruction of information due to minority carries.

Semiconductor memories are manufactured as products of large capacity, such as 64K bits, 256K bits, in recent years. Much developmental work has been done on various semiconductor memories, such as dynamic random access memories (DRAMs) and static random access memories (SRAMs).

The so-called one-MOSFET type memory cell, which is composed of one capacitor for storing information charges and one MOS (Metal-Oxide-Semiconductor) FET for switching, has a small occupation area and is suited to raise the density of integration. Therefore, it is extensively adopted as the memory cell of a DRAM.

In the DRAM, circuits other than a memory cell array, namely, peripheral circuits such as various timing generators, an address buffer circuit, an address decoder circuit, data input/output circuits, a sense amplifier and a main amplifier are constructed of CMOS (Complementary MOS) circuits in each of which an N-channel MOSFET and a P-channel MOSFET are combined. Thus, the DRAM is permitted to exhibit a lower power consumption as well as a higher operating speed and to have a higher density of integration. The DRAM which employs the CMOS circuits for the peripheral circuits is described in, for example, "Nikkei Electronics," Jul. 18, 1983, pp. 188–190.

In order to meet the needs of the age for memories of large capacity, investigations have been made from a viewpoint of manufacturing memories with large capacity, high speed and low consumption of power.

Illustratively, in order to attain a still higher operating speed and higher integration density, devices constituting a DRAM need to be made smaller, but the magnitudes of signals to be treated decrease with the smaller devices. In order to treat the small signal magnitude at high speed, a high drivability is required of the constituent device of the circuitry. However, insofar as a CMOS circuit is used as the device, the sizes of MOSFETs cannot be made very large from the viewpoint of the density of integration, and the drivability (conductance $g_m$) of each MOSFET is low, so that the operating speed of the memory lowers along with the density of integration. As a result, development of a memory in a mixed state of bipolar transistor and complementary metal-oxide semiconductor field effect transistors (CMOSFET) (the memory being hereinafter referred to as "Bi-CMOS memory"), as shown in Japanese patent application No. 22811/1984 (corresponding to U.S. patent application Ser. No. 701,226), has been considered. Specifically, in order to simultaneously achieve the higher density of integration and the higher operating speed, we have made studies of using a bipolar transistor in the peripheral circuit of the DRAM.

FIG. 29 illustrates a fundamental sectional structure of a Bi-CMOS system. Of course, the system shown is merely exemplary. Such Bi-CMOS system is stated in detail in "Nikkei Electronics", Aug. 12, 1985, pp. 187–208. Shown in the figure are one n-channel MOS (nMOS) transistor, as well as one p-channel MOS (pMOS) transistor, and an n-p-n bipolar (npnBIP) transistor.

Here, letters S, G and D affixed to the nMOS or pMOS indicate the nodes of the source, gate and drain thereof, respectively, while letters C, E and B affixed to the npnBIP transistor, indicate the nodes of the collector, emitter and base thereof, respectively. Besides, in the figure, diffusion layers have only the impurity types thereof written down for the sake of brevity. Accordingly, as regards portions to which the same symbols are assigned, it is merely indicated that the conductivity types are the same, and the impurity materials and impurity concentrations are selected at will properly according to the purposes of the portions.

The Bi-CMOS memory will now be described briefly.

In an address circuit, a timing circuit or the like as a peripheral circuit within a semiconductor memory, an output transistor for charging and discharging parasitic capacitance in signal lines of long distance, and an output transistor with large fan-out are constituted by bipolar transistors, and a logical circuit for performing logical processing such as inversion, non-inversion, NAND, NOR is constituted by a CMOS circuit. The logical circuit constituted by the CMOS circuit is of low power consumption, and an output signal of the logical circuit is transmitted through the bipolar output transistor with low output impedance to the signal lines of long distance. Since the output signal is transmitted to the signal lines using the bipolar output transistor with low output impedance, dependence of the signal propagation delay time on the parasitic capacitance of the signal lines can be reduced, whereby a semiconductor memory with low consumption power and high speed is obtained.

However, as discussed further below, problems arise in using bipolar transistors in the peripheral circuits of, for example, the DRAM.

Heretofore, in an integrated circuit employing insulated-gate filed effect transistors (hereinafter, abbreviated to "MOS transistors") or bipolar transistors (hereinafter, abbreviated to "BIP transistors"), isolation among the elements of the integrated circuit has been performed by applying reverse bias voltages to p-n junctions. The details are stated in, for example, "Integrated Circuit Technology (1)"(Corona Publishing Co., Ltd.) by Yanai and Nagata, pp. 21-31. In a Bi-CMOS system, a similar device isolation method similar to the above is adopted.

In such a Bi-CMOS system, in the prior art, the isolation among a large number of devices within a chip is executed by applying the lowest potential in the circuitry to a p-type substrate (p-Sub) and the highest potential in the circuity to the n-type isolation layer (nWELL) for forming the pMOS transistor, whereby the junctions of various parts are prevented from falling into the condition of forward bias. That is, with the prior art, in a case where the circuitry operates between a supply voltage (for example, 5 V) and the earth (0 V), the devices are isolated by applying 0 V to the substrate p-Sub and 5 V to the n-type isolation layer. Since, in such a system, the applied voltage to the substrate p-Sub or to the n-type isolation layer is selected at the lowest voltage required for the device isolation, reverse bias voltages to be applied to the p-n junctions can be rendered small, and therefore it is possible to cope with the problems of lowering in the breakdown voltages of devices, etc. attendant upon the future microminiaturization of the devices.

PROBLEMS FOUND AND ADDRESSED IN THE PRESENT INVENTION

In studying Bi-CMOS memories, the inventors have found various modes for destruction of information in the memory. Thus, the inventors have studies the information destruction modes of the information stored in the memory cell of the Bi-CMOS memory, and have found a novel information destruction mode as hereinafter described and have completed one aspect of the present invention as a means for preventing such information destruction.

In addition, the inventors have found that, in a memory device including a bipolar transistor, minority carriers created by the existence of the bipolar transistor incur the so-called soft error in which they invert information stored in a memory cell or information read out from a memory cell to a data line.

The mechanism of the soft error attributed to the bipolar transistor is interpreted as below by way of example.

The switching MOSFET of the memory cell (exemplified by, but not limited to, a DRAM) is constructed of an N-channel MOSFET which is formed within a $p^-$-type substrate. The capacitor of the memory cell has an $n^+$-type semiconductor region being one electrode thereof within the $p^-$-type substrate. Meanwhile, as a desirable device for attaining a high drivability at high speed, a vertical npn-type bipolar transistor is constructed of an $n^+$-type emitter region, a p-type base region, and $n^-$-type and $n^+$-type collector regions within the $p^-$-type substrate. In order to lead the electrode of the collector of this bipolar transistor out of the surface of the substrate, the $n^+$-type buried collector region is formed larger (longer) than the emitter region. For this reason, a potential fluctuation is liable to occur within the buried collector region due to a resistance possessed by itself. The potential fluctuation of the buried collector region causes a pnp-type parasitic bipolar transistor to operate and injects holes into the substrate, to induce a fluctuation in the potential of the substrate. The parasitic bipolar transistor appears with the base region as its emitter region, the buried collector region as its base region and the substrate as its collector region. On account of the fluctuation of the substrate potential, the substrate is injected with electrons (minority carriers) from an $n^+$-type semiconductor region of high impurity concentration near the parasitic bipolar transistor (for example, the source region or drain region of an N-channel MOSFET). The minority carriers enter the $n^+$-type region of the switching MOSFET and capacitor of the memory cell or the $n^+$-type region of the MOSFET of a sense amplifier or the like, and invert (destroy) information to give rise to the so-called soft error.

Access time of the DRAM can be shortened by incorporating bipolar transistors into the peripheral circuits. At the same time, however, the soft errors develop conspicuously due to the minority carriers which are created within the substrate by the bipolar transistors or alpha particles. More specifically, the number of times that information passes between a data line and the capacitor increase, the consequently heighten the probability of the minority carries being trapped particularly in the source region or drain region of the switching MOSFET.

Accordingly, when the bipolar transistors are caused to coexist in the DRAM with the intention of attaining a higher operating speed and a higher density of integration, there is involved the problem that the electrical reliability of the DRAM lowers due to the soft errors.

A further problem addressed by the present invention involves injection of minority carriers arising from application of reverse biasing to provide isolation between semiconductor elements of the integrated circuit device. Since the input or output terminal of an LSI (large-scale integrated circuit) is directly connected with an external circuit, noise above the supply voltage or below 0 V (in general, surge noise such as overshoot or undershoot) might arise. Since the input or output node is connected to the diffusion layer within the chip in any form, the corresponding junction will then be forward-biased in the prior art. By way of example, when the minus surge noise is applied to the n-type diffusion layer indicated at the source S or drain D of the nMOS transistor in FIG. 29, the junction between the n-type diffusion layer and the substrate p-Sub is forward-biased, and a forward current flows from the substrate p-Sub toward the n-type diffusion layer. As a result, minority carries (electrons in a p-type substrate) are injected into the substrate p-Sub. Since the minority carriers have a means free path which is usually as long as several hundred $\mu m$, they reach another circuit part and incur, for example, the problem that a stored signal in a memory cell is destroyed in an SRAM or DRAM. The phenomenon of the minority carrier injection might be caused not only at the input or output node part, but also by a circuit operation inside the chip in such a manner that the potential of the diffusion layer or of the substrate p-Sub fluctuates locally due to capacitive coupling or due to saturated operation of the bipolar transistor. It is therefore impossible to realize high performance of the Bi-CMOS system.

SUMMARY OF THE INVENTION

An object of the present invention is to provide a semiconductor integrated circuit device which is immune against soft errors, which is high in the density of integration and low in power consumption and which is suited to a high speed operation, and a method of manufacturing the same.

Another object of the present invention is to provide a technique which can raise the operating speed and enhance the electrical reliability of a DRAM, or other memory device, having bipolar transistors.

A further object of the invention is to provide a semiconductor memory technique, wherein destruction of storage information caused by use of a Bi-CMOS logic circuit (switching circuit) in peripheral circuitry can be prevented, and also destruction of storage information due to other factors can be prevented.

A still further object of the present invention is to solve the problem arising due to reverse-biasing to provide isolation between elements, and to provide a semiconductor device which operates stably. Another object of the present invention is to provide a voltage application method by which a voltage to be applied to a substrate or an isolation region is freely set according to an intended use, as well as a device structure which makes the method possible.

The aforementioned and other objects and novel features of the present invention will become apparent from the description of the specification and the accompanying drawings.

Typical ones of the aspects of the present invention disclosed in the present application will be summarized below.

Under the memory cell of a memory device (illustratively a DRAM) having bipolar transistors and/or under the semiconductor region of the peripheral circuit thereof, a semiconductor region which has the same conductivity type as that of a substrate and an impurity concentration higher than that of the substrate is disposed. That is, a semiconductor region for forming the circuit element of the memory cell, or the semiconductor region of the circuit element of the peripheral circuit, is underlaid with a semiconductor region the conductivity type of which is opposite to that of the former semiconductor region. Moreover, other regions (e.g., a further semiconductor region) can be used in combination with the underlying semiconductor region to act as a shield to prevent minority carriers from entering the memory cell and/or from entering the semiconductor region electrically connected to the bit line. For example, a further semiconductor region can extend from the underlying semiconductor region to the surface of the semiconductor substrate, for example, the underlying semiconductor region and the further semiconductor region together acting as a shield to prevent minority carriers from entering the memory cell and/or bit line.

Thus, where the substrate is of p-type conductivity and the underlying layer is a $p^+$-type buried layer, a p-type region can be provided extending from the $p^+$-type buried layer to the substrate surface to act as such shield. For example, such p-type region can form part of the isolation region between the memory cell and n-type MISFET of the peripheral circuit, the p-type region extending from the $p^+$-buried layer to a field oxide film formed on the semiconductor substrate. Such p-type region, in combination with the underlying $p^+$-buried layer, can act as a shield both for cell mode soft error (e.g. soft error due to introduction of minority carriers into the capacitor of the one-MISFET type memory cell) and bit line mode soft error (e.g., soft error due to minority carriers entering the drain of the switching MISFET of the one-MISFET type memory cell).

As a further illustrative example, the underlying semiconductor region (for example, $p^+$-type buried layer) can be provided to contact a region of opposite conductivity type extending to the substrate surface (for example, an n-type well layer) so as to provide the shielding function.

Such combination of regions (for example, the $p^+$-type buried layer and p-type region; or the $p^+$-type buried layer and n-type well) can act to prevent soft error caused by minority carriers generated by the bipolar transistor (that is, parasitic bipolar transistor action).

In addition, a $p^+$-type buried layer is provided under the drain region of the switching MISFET of the memory cell, and under the MISFET of a sense amplifier of the peripheral circuitry, to avoid bit line mode soft error generated by α-particles.

According to the above expedient, the bipolar transistor is caused to coexist in the peripheral circuit of the DRAM, thereby to attain a higher operating speed, and the underlying semiconductor region and further region form a potential barrier to minority carriers created by the bipolar transistor, thereby to prevent soft errors ascribable to the minority carriers.

A further aspect of the present invention will be set forth. A first carrier absorbing area is formed between a peripheral circuit unit with a Bi-CMOS complex circuit as a switching circuit and a memory cell array unit so as to prevent minority carriers (electrons) from moving. The first carrier absorbing area has a function to reduce the effective current amplification factor of the parasitic bipolar transistor formed between the peripheral circuit unit and the memory cell array unit. As a result, partial destruction of the storage information caused by use of the Bi-CMOS type logical circuit in the peripheral circuit can be prevented.

A still further aspect of the present invention will be set forth. In the present invention, a voltage which is still negative (in general, when a p-type silicon substrate is used) or positive (in general, when an n-type silicon substrate is used) with respect to the operating voltage of circuitry is applied to a portion liable to the injection of minority carriers, for example, a substrate. Further, in the present invention, in order to solve problems ascribable to the method of applying the voltage as stated above, for example, the problem that voltages to be applied to individual devices increase to degrade the reliability of a device of low breakdown voltage such as a microminiature device, the isolation region of MOS transistors of identical conductivity type or bipolar transistors of identical conductivity type is divided into several isolated regions, to which suitable isolation voltages are applied according to the respective uses.

BRIEF DESCRIPTION OF THE DRAWINGS

FIG. 17 is a circuit diagram illustrating another memory cell information destruction mechanism clarified by the inventors;

FIG. 18 is a device sectional view of input protective element M105 and MOSFET M111 of memory cell MC111 shown in FIG. 17;

FIG. 34 is a sectional view showing an embodiment of a bipolar structure according to this third aspect of the present invention;

FIG. 35 is a sectional view showing an embodiment, according to this third aspect, of a bipolar-CMOS complex structure;

FIG. 48 is a sectional view showing another embodiment, according to this third aspect of the present invention, of the bipolar-CMOS complex dynamic memory;

FIG. 49 is a plan view with the embodiment of FIG. 48 seen from the front surface of a chip; and FIGS. 50(a)-50(d) illustrate sectional views showing an embodiment of principal steps for realizing the structure in FIG. 49.

DESCRIPTION OF THE PREFERRED EMBODIMENTS

Figure 1:
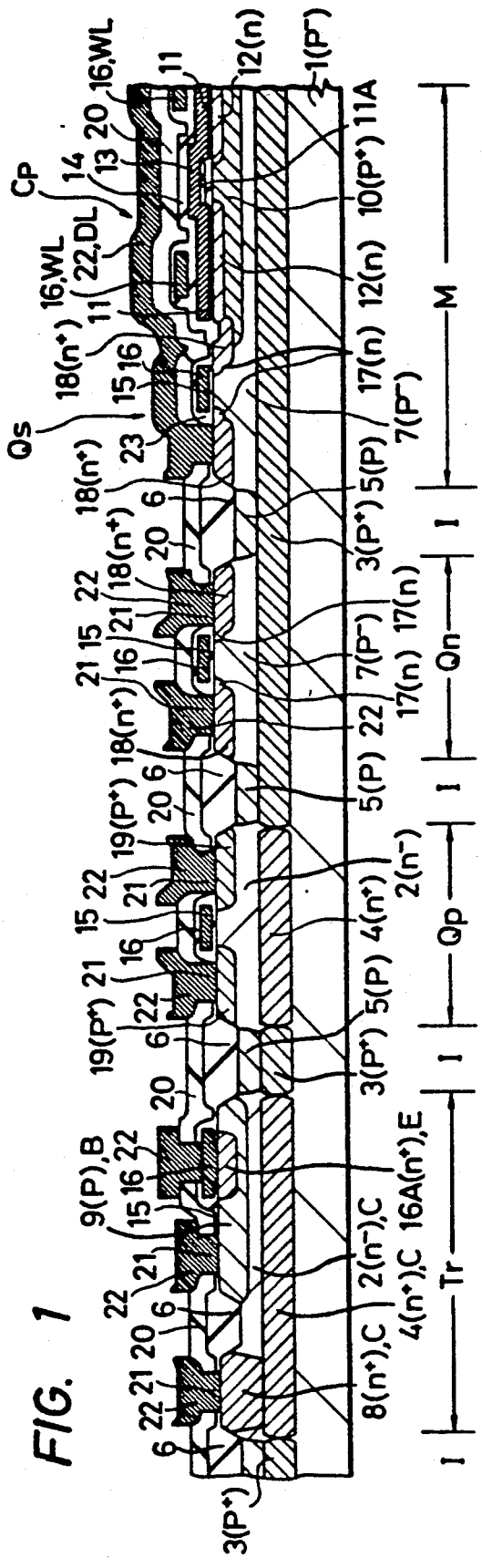
FIGS. 1-3 are sectional views each showing the structure of a DRAM having bipolar transistors in accordance with a first aspect of the present invention.

A DRAM having bipolar transistors which is an embodiment of the first aspect of the present invention is illustrated in FIG. 1 (sectional view).

Referring to the figure, numeral 1 designates a $p^-$-type semiconductor substrate, and numeral 2 an $n^-$-type epitaxial layer which is stacked on the main surface of the semiconductor substrate 1. In this embodiment, the semiconductor substrate 1 and the epitaxial layer 2 function as a substantial semiconductor substrate and construct a semiconductor body. The conductivity types as specified above are selected for realizing npn-type bipolar transistors of high performance which are electrically isolated from one another. The impurity concentration of the substrate 1 is selected on the order of $10^{13} - 10^{17}/cm^{-3}$ in consideration of the collector junction capacitance of the bipolar transistor, etc. The epitaxial layer 2 constructs a part of an n-type well region for forming a P-channel MOSFET $Q_p$, and a part of the collector of the bipolar transistor. The impurity consecration of the epitaxial layer 2 is set according to the desired characteristics of the respective transistors, and is selected on the order of $10^{15} - 10^{17}/cm^3$.

A minus potential of −2.5−−3.5 V is applied to the semiconductor substrate 1 by way of example for the purposes of preventing a malfunction ascribable to "undershoot" and reducing a pn-junction capacitance. The minus potential is supplied from a built-in substrate bias voltage generator or an external terminal to the semiconductor substrate 1.

An isolation region I for electrically isolating semiconductor elements (or circuit elements) is constructed of the semiconductor substrate 1, a p+-type buried semiconductor region 3, a p-type semiconductor region 5 and a field insulator film 6. The p+-type buried semiconductor region 3 and the p-type semiconductor region 5 in combination can act to shield the memory cell from minority carriers, as discussed further infra.

The buried layer 3 is interposed between the semiconductor substrate 1 and the epitaxial layer 2. The semiconductor region 5 is disposed in the main surface part of the epitaxial layer 2 overlying the buried layer 3. The filed insulator film 6 is disposed on the semiconductor region 5 and is made of, for example, a silicon oxide film formed by the local thermal oxidation of the main surface of the epitaxial layer 2. The semiconductor region 5 is formed by the ion implantation of boron in which an oxidation-impermeable film (silicon nitride film) for forming the field insulator film 6 is employed as a mask, and the subsequent annealing for oxidation. The impurity concentrations of the p+-type region 3 and the p-type region 5 are set on the order of $10^{16}$–$10^{19}$/cm³ so that the individual circuit elements may be effectively isolated.

The impurity concentration of the p+-type buried layer 3 is also selected in consideration of the lowering of the resistance of a p-type well region (to be described later) for an N-channel MOSFET and the reduction of soft errors in the N-channel MOSFET and a memory cell.

As shown on the left side in the figure, the bipolar transistor Tr is constructed of a collector region (C) which is composed of an n+-type buried semiconductor region 4, an n+-type semiconductor region 8 and the n-type epitaxial layer 2; a p-type base region (B) 9; and an n+-type emitter region (E) 16A. This bipolar transistor Tr is, in effect, constructed of a known vertical structure of the npn-type.

The n+-type buried layer 4 is interposed between the semiconductor substrate 1 and the epitaxial layer 2 in self-alignment to the p+-type buried layer 3. This n+-type buried layer 4 lowers the collector resistance to achieve a bipolar transistor of high performance, and simultaneously serves to lower the resistance of an n-type well region (to be described later), and the impurity concentration thereof is selected on the order of $10^{17}$–$10^{20}$/cm³. The n+-type buried region 8 is made larger as compared with the emitter and base regions in order to provide the collector electrode of the vertical npn-type bipolar transistor of high performance in the main surface of the substrate (the semiconductor body).

The n+-type region 8 serves to connect the collector electrode and the n+-type buried layer 4, and has its impurity concentration set on the order of $10^{17}$–$10^{21}$/cm³ to the purpose of lowering the collector resistance.

The p-type base region 9 is formed in self-alignment to the field insulator film 6 in a predetermined region within the n−-type epitaxial layer 2 forming the collector of the bipolar transistor, and has its impurity concentration set on the order of $10^{16}$–$10^{18}$/cm³.

The emitter region 16A is constructed in such a way that the impurity (for example, phosphorus or arsenic) of an electrode for an emitter, for example, polycrystalline silicon film 16 is diffused into the base region 9 through a contact hole provided in an insulator film 15. The impurity concentration of the emitter region 16A is set on the order of $10^{17}$–$10^{20}$/cm³. Alternatively, the emitter forming method may be such that the n+-type emitter region 16A is formed by diffusion from a vapor phase or by ion implantation, and that a conductive material such as aluminum is brought into electrical contact with the region 16A as an emitter electrode 22 directly through the intervention of a barrier metal such as platinum silicide. The semiconductor region 8 (collector region), the base region 9 and the emitter electrode 16 are respectively connected to the collector electrode 22, a base electrode 22 and the emitter electrode 22 through contact holes 21 provided in an interlayer insulator film 20.

In order to shorten the access time of the DRAM, the bipolar transistor Tr constitutes a timing generator, an address buffer circuit, an address decoder circuit, a data input/output circuit, a main amplifier or the like along with a CMOS circuit. Moreover, in the address buffer circuit and the data input/output circuit, the bipolar transistors facilitate the input and output operations of signals with TTL (Transistor-Transistor Logic) or ECL (Emitter Coupled Logic) levels. In particular, since the bipolar transistor Tr is a vertical npn-transistor of high performance, it can readily construct an ECL type differential amplifier. By applying this amplifier to the input or output circuit, ECL signals of small logic amplitudes can be achieved at high speed and at high reliability. In the data output circuit, the drivability of an external device is enhanced. In the address decoder circuit, especially the signal level of a word line to which a great capacitive load is parasitic can be raised at high speed by driving the word line by means of the bipolar transistor Tr.

As shown in the middle part of the figure, the N-channel MOSFET $Q_n$ constituting the peripheral circuit of the DRAM is constructed using the p-type well region composed of the buried semiconductor region 3 and a p−-type semiconductor region 7, and is composed of a gate insulator film 15, a gate electrode 16, and a source region and a drain region each of which is composed of a pair of semiconductor regions 17 and 18 of the n-type and n+-type respectively.

The p+-type buried layer 3 is formed in order to help prevent soft errors from developing in the MOSFET $Q_n$ (as will be described later). This is effective especially in the MOSFET $Q_n$ for constructing a sense amplifier. Moreover, since the p+-type buried layer 3 lowers the resistance of the p-type well, it is effective for preventing the occurrence of latch-up. The latch-up phenomenon is detailed in "Technical Digest of International Electron Device Meeting," 1982, pp. 454–477, etc. Furthermore, the existence of the p+-type buried layer 3 makes it easy to turn the overlying n-type epitaxial layer 2 into the p−-type semiconductor region 7 (having an impurity concentration on the order of $10^{15}$–$10^{17}$/cm³). As stated before, the impurity concentration of the p+-type buried layer 3 is set on the order of $10^{16}$–$10^{19}$/cm³.

The same potential as that of the substrate 1 is applied to the p-type well region. Though not shown, a wiring lead which is made the same layer as the electrode 22 and to which the substrate potential is applied is connected to a p+-type region which is formed within the p-type well by the same step as the of p+-type regions 19 to be described later.

The n-type semiconductor regions 17 are interposed between the n+-type regions 18 and a channel forming region, and constitute the MOSFET of the LDD (Lightly Doped Drain (structure stated in "IEEE Transactions on Electron Devices," Vol. ED-27, pp. 1359–1367, August 1980. The n-type regions 17 are formed by, e.g., ion implantation employing the gate electrode 16 as a mask and have their impurity concentration set on the order of $10^{15}$–$10^{17}$/cm$^3$. The n+-type regions 18 are formed by, e.g., ion implantation employing as a mask the gate electrode 16 and side-wall insulator films 23 which are formed on the sides of the gate electrode 16 in self-alignment thereto, and their impurity concentration is set on the order of $10^{17}$–$10^{21}$/cm$^3$.

As shown at the middle part in the figure, the P-channel MOSFET $Q_p$ constituting the peripheral circuit of the DRAM is constructed using the n-type well region composed of the buried semiconductor region 4 and the epitaxial layer 2, and is composed of a gate insulator film 15, a gate electrode 16, and the p+-type source and drain regions 19.

Likewise to the p+-type buried layer 3, the n+-type buried layer 4 lowers the resistance of the n-type well region and is therefore effective for the prevention of latch-up.

A power source potential $V_{cc}$ is applied to the n-type well region. Though not shown, a wiring lead which is made of the same layer as the electrode 22 and to which the power source potential is applied is connected to an n+-type region which is formed within the n-type well by the same step as that of the n+-type regions 18.

Electrodes 22 made of aluminum are connected to the source and drain regions of the MOSFETs $Q_n$ and $Q_p$ through contact holes which are formed in the insulator film 15 and the inter-layer insulator film 20 formed of, e.g., a PSG (phophosilicate glass) film on the whole surface of the substrate.

The gate electrode 16 is made of a polycrystalline silicon film. In this embodiment, the gate electrode 16 is formed by the same step as that of the emitter electrode 16. After the gate insulator film 15 has been formed, it is removed from the predetermined area for forming the emitter. In the predetermined area, from the polycrystalline silicon film 16 connected to the main surface of the substrate (epitaxial layer 2), an impurity is diffused into the base region 9, whereby the emitter region is formed.

The electrode 16 may well be made of a polycrystalline silicon film on which a film of a refractory metal (such as molybdenum, tungsten, titanium or tantalum) or a film of a silicide thereof is stacked.

In a case where the gate electrode 16 is formed by a step separate from that of the emitter electrode 16, it may well be a single layer of the refractory metal film or the silicide film mentioned above.

As shown on the right side in FIG. 1, the memory cell M of the DRAM is constructed of a series circuit which comprises a switching (memory cell selecting) N-channel MOSFET $Q_s$ and a capacitor $C_p$. This memory cell is formed in the p-type well region which is composed of the buried semiconductor region 3 and the semiconductor region 7.

The capacitor $C_p$ is chiefly constructed of a MIS type capacitance element which is configured of n-type semiconductor regions 12, a dielectric film 11 and a plate electrode 13, and to which a pn-junction capacitance element composed of the semiconductor regions 12 and a p+-type semiconductor region 10 is added. The impurity concentration of the n-type semiconductor regions 12 forming one electrode of the capacitor $C_p$ is set on the order of $10^{17}$–$10^{21}$/cm$^3$. The dielectric film 11 is made of, for example, a triple film which comprises a silicon oxide film formed by the thermal oxidation of the substrate, a silicon nitride film formed by CVD, and a silicon oxide film formed by the thermal oxidation of the silicon nitride film. The plate electrode 13 forming the other electrode of the capacitor $C_p$ is made of a polycrystalline silicon film which has its resistance lowered by introducing phosphorus, and it is a flat electrode which is common to the plurality of memory cells of an identical (single) memory cell array. The impurity concentration of the p+-type semiconductor region 10 is set on the order of $10^{16}$–$10^{19}$/cm$^3$. The p+-type region 10 is formed in order to reduce soft errors in the memory cell. That is, the p+-type region 10 is formed in order to increase the capacitance of the capacitor $C_p$ and to form a potential barrier to minority carriers. A potential (for example, 5 V=$V_{cc}$ for a high level or 0 V=$V_{ss}$ for a low level) corresponding to information "0" or "1" transmitted from a data line DL (the aluminum wiring layer 22) through the MOSFET $Q_s$ is applied to the semiconductor regions 12. By way of example, a potential ($\frac{1}{2} V_{cc} \approx 2.5$ V) intermediate between the information "8" and the information "1" is applied to the plate electrode 13.

An insulator film 14 is formed so as to cover the plate electrode 13, and effects the electrical isolation between this plate electrode 13 and a word line (WL) 16, WL extending over it. An insulator film 11A is formed so as to electrically isolate the capacitors $C_p$, along with the semiconductor region 10.

Likewise to the foregoing MOSFET $Q_n$, the MOSFET $Q_s$ is constructed of a gate insulator film 15, a gate electrode 16, a pair of semiconductor regions 17, and source and drain regions 18.

One of the source and drain regions 18 of the MOSFET $Q_s$ is electrically connected with the data line (DL) 22,DL.

At a position close to the bipolar transistor Tr there is arranged an n+-type semiconductor region (not shown) functioning as an injection source which injects minority carriers into the semiconductor substrate 1 owing to the operation of a parasitic bipolar transistor. This semiconductor region is, for example, a wiring layer or the source region or drain region of an N-channel MISFET. The parasitic bipolar transistor is constructed with its base region being the collector region composed of the buried layer 4 and the semiconductor region 8, its emitter region being the base region 9, and its collector region being the semiconductor substrate 1.

On the other hand, a buried layer 3 which has the same conductivity type as that of the semiconductor substrate 1 (of the semiconductor region 7) and an impurity concentration higher than that of the same is interposed between the semiconductor substrate 1 and the epitaxial layer 2 underlying the memory cell. Thus, a potential barrier can be formed against the minority carriers which are injected due to the operation of the parasitic bipolar transistor and toward the semiconductor substrate 1 form the n+-type semiconductor region arranged nearby, and against minority carries which are created within the semiconductor substrate 1 underneath the MOSFET $Q_s$ or the capacitor $C_p$ by alpha particles. Accordingly, the minority carriers can be prevented from entering the memory cell. In addition, when an electric field is applied to any of the n-type regions (source and drain regions, etc.) of the N-channel MOSFET etc. in the memory cell, a depletion layer spreads in the p-type well layer 7. As the region of this depletion layer spreads more, the electrons created by the alpha particles are collected more. In the case where the p+-type region 3 underlies the memory cell as in the present invention, the stretch of the depletion layer is checked by this p+-type region 3. Even when a voltage is applied, the depletion region does not spread beyond the p+-type region 3. Thus, the alpha particle-immunity of the DRAM can be enhanced. That is, the access time can be shortened, while at the same time the soft errors can be prevented to enhance the electrical reliability.

Besides, the buried semiconductor region 3 under the memory cell can be formed by the same manufacturing step as that of the buried semiconductor region 3 constructing the p-type well region of the MOSFET $Q_n$ and the buried semiconductor region 3 constructing the isolation region I. In other words, a separate manufacturing step for expressly forming the buried semiconductor region 3 under the memory cell can be avoided.

In the same manner as described above, soft errors in the N-channel MOSFET $Q_n$ of the peripheral circuit (especially, the sense amplifier) can be prevented. In a case where data read out from the memory cell to the data line DL has been supplied to the n-type semiconductor region of the MOSFET $Q_n$ connected to the data line DL, the inversion of the data in this region can be prevented.

Moreover, the existence of the n+-type buried layer 4 prevents the soft errors of the P-channel MOSFET $Q_p$ of the peripheral circuit attributed to holes.

Excepting the regions 2, 3, 4, 5 and 7, the memory cell M and the P- and N-channel MOSFETs $Q_p$ and $Q_n$ of the DRAM in FIG. 1 are substantially the same as those of a DRAM disclosed in U.S. patent application Ser. No. 855,418 filed on Apr. 24, 1986, and the contents thereof are incorporated herein by reference. Throughout this specification, the features of the above patent application cited as a reference shall be referred to as those of the present invention.

The second embodiment of the present invention comprises a DRAM which attains a rise in the operating speed of a peripheral circuit particularly in case of supplying a minus potential to a substrate. The DRAM being the second embodiment is illustrated in FIG. 2.

In the description of the second embodiment (et seq.), only the points of difference from the first embodiment will be elucidated.

Figure 2:
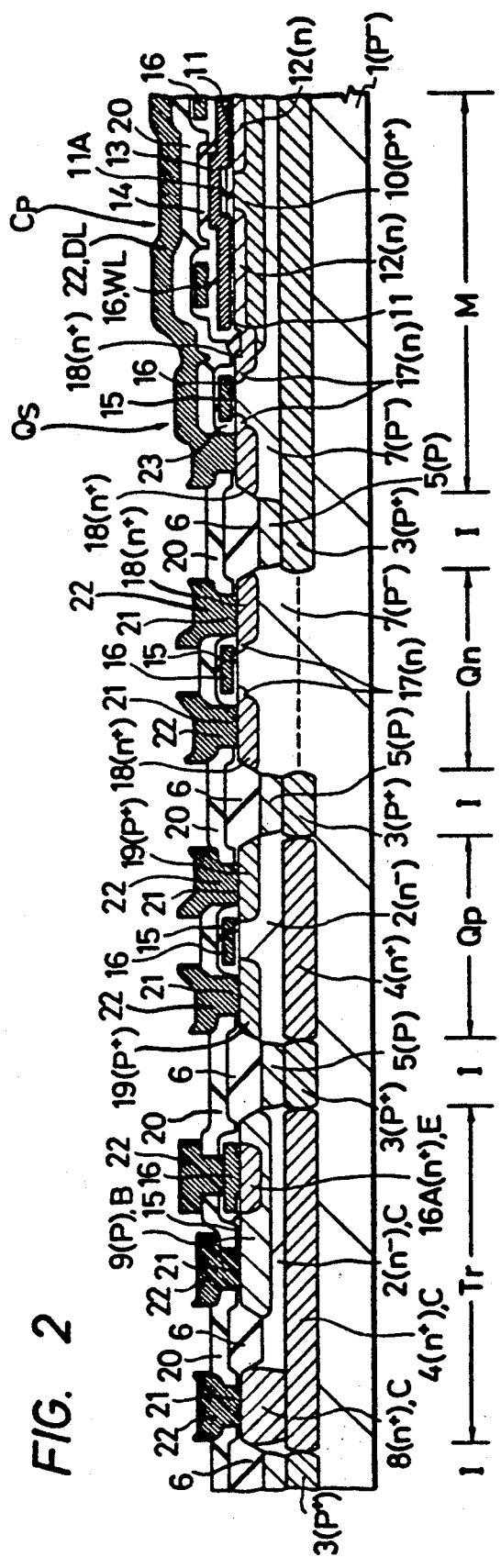

As seen from FIG. 2, the DRAM of the second embodiment is not provided with the p+-type buried layer 3 in the region for forming the N-channel MOSFET $Q_n$ constituting the peripheral circuit. Since the semiconductor substrate 1 is held at the minus potential, a depletion layer formed in the channel forming region of the MOSFET $Q_n$ is stretched deeper in the depth direction of the semiconductor substrate 1 (it does not touch the buried semiconductor region 3). For this reason, the fluctuation of the threshold voltage of the MOSFET $Q_n$ attributed to the fluctuation of the substrate potential can be lessened, that is, the substrate effect constant can be made smaller. Owing to the less fluctuation of the threshold voltage, the value of the threshold voltage in the ordinary state can be made small. In a case where the threshold voltage fluctuates greatly, the fluctuation in the minus direction renders the MOSFET "normally-on" and incurs a malfunction. After all, its is possible to reduce an impurity concentration within the depletion layer of the channel forming region and to lower the threshold voltage of the MOSFET $Q_n$. Owing to the lowering of the threshold voltage of the MOSFET $Q_n$, a raised switching speed can be attained, with the result that the operating speed of the peripheral circuit can be raised while substantially the same effects as those of the first embodiment are produced.

Figure 3:
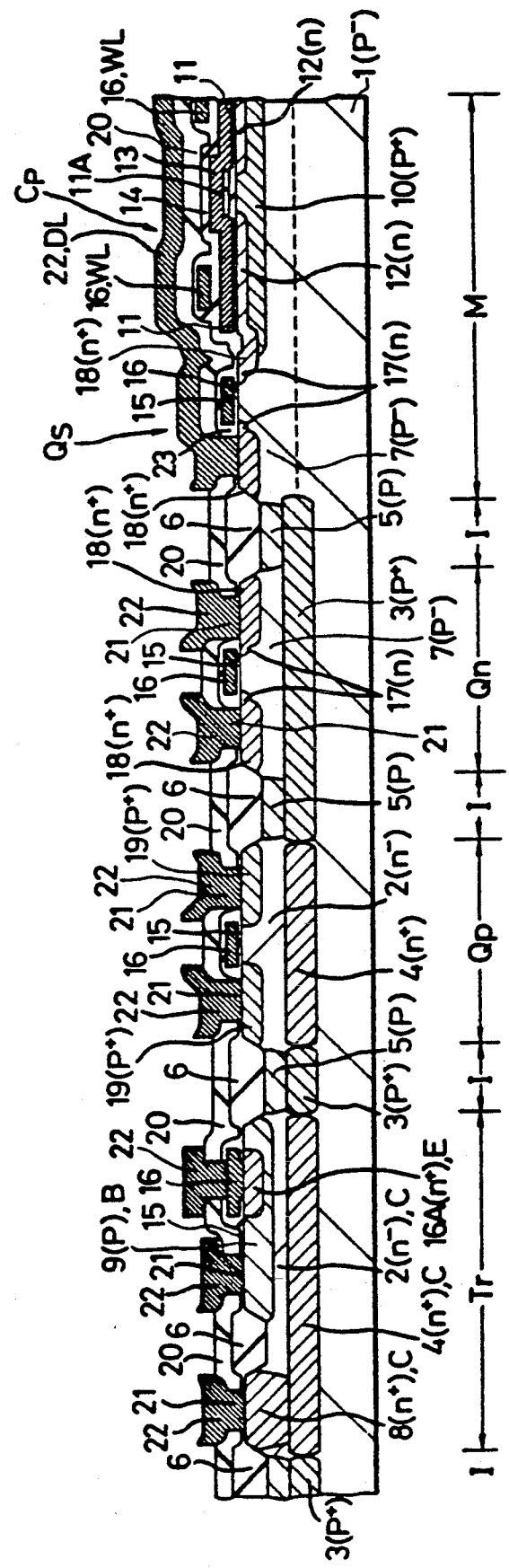

As illustrated in FIG. 3, the third embodiment of the present invention is an example of a DRAM in which, contrariwise to the second embodiment, the p+-type buried layer 3 is provided under the N-channel MOSFET $Q_n$ of the peripheral circuit and is not provided under the memory cell portion M.

The present embodiment has been realized with note taken of the fact that the probability at which minority carriers (electrons) forming the cause of soft errors are trapped is proportional to the area of (n+-type) semiconductor regions constituting a circuit element. More specifically, the area of the n+-type source and drain regions of the N-channel MOSFETs $Q_n$ of the peripheral circuit, especially one sense amplifier, is much larger than that of the n+type semiconductor regions within one memory cell. Thus, according to the present embodiment, the invasion of the minority carriers into the MOSFETs $Q_n$ of the peripheral circuit liable to the soft errors can be prevent by the p+-type buried layer 3, so that the soft errors in the peripheral circuit can be prevented.

In each of the DRAMs shown in FIGS. 2 and 3, the formation of the p+-type region 10 can be omitted.

Figure 4:
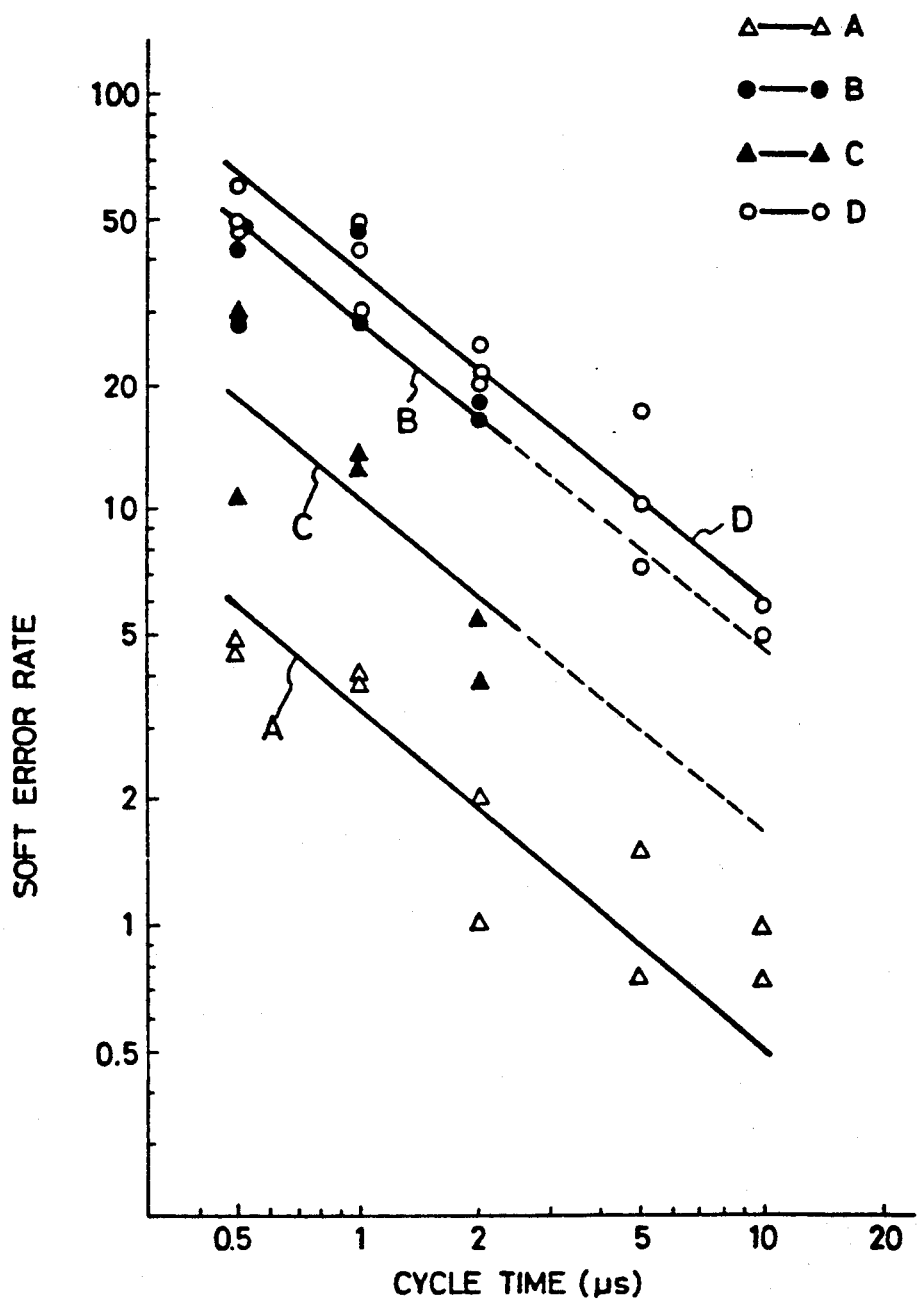
FIG. 4 is a graph showing the soft error rates of the DRAMs in FIGS. 1-3.

FIG. 4 is a graph showing improvements in the soft error rate which are attained by the present invention.

In FIG. 4, both the axis of ordinates and the axis of abscissas are graduate logarithmically. The axis of abscissas represents the operating cycle time of the DRAM, in other words, the interval of the falling edges of row address strobe signals $\overline{RAS}$ in the case where data is repeatedly read or written. The axis of ordinates represents the rate of occurrence of soft errors in a data line mode. The soft error rate is indicated by relative values with a predetermined value set at unity (a reference value).

Straight lines A, B and C denote the soft error rates of the DRAMs in FIGS. 1, 2 and 3, respectively. A straight line D denotes the soft error rate of a DRAM which is not formed with the p+-type buried semiconductor regions 3 in FIGS. 1-3.

In the DRAM having bipolar transistors, the soft error rate is improved in the case (straight line B) where the p+-type buried layer 3 is disposed under the memory cell portion M according to the present invention, as compared with the case (straight line D) where it is not formed. This is because the minority carriers can be prevented from entering the n-type region 12 of the capacitor $C_p$ and the n-type source and drain regions 17 and 28 of the MOSFET $Q_s$, namely, the semiconductor regions which are directly or indirectly coupled (connected) to the data line 22.

The soft error rate (straight line C) of the DRAM in FIG. 3 is lower than those of the DRAMs of the straight lines B and D. The area of the n+-type semiconductor regions of the MOSFETs of the sense amplifier is larger than that of the n+-type semiconductor regions within one selected memory cell. Among the peripheral circuits, principally the sense amplifier has the soft errors prevented, so that the soft error rate of the DRAM is improved.

The soft error rate (straight line A) of the DRAM in FIG. 1 is the most excellent. Herein, the soft error rate is improved in excess of the sum of the improvements in the soft error rates indicated at the straight lines B and C.

As the operating cycle time of the DRAM becomes longer, the soft errors in the data line mode decrease more. This is because the chances of trapping the minority carriers lessen outside the capacitor $C_p$ of the memory cell. Accordingly, the soft errors in the data line mode need to be reduced for the purpose of raising the operating speed of the DRAM. The present invention is effective for attaining the raised speed of the DRAM from this viewpoint, in addition to the use of the bipolar transistors.

Figure 5:
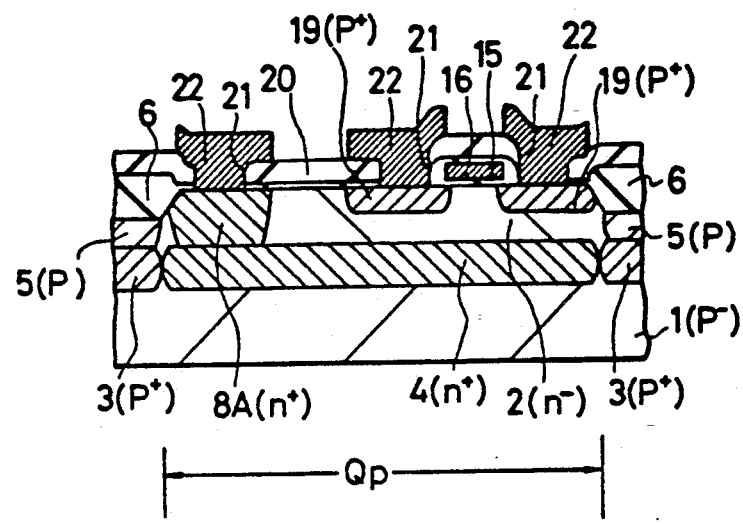
FIG. 5 is a sectional view showing another structure of a P-channel MOSFET which is included in each of the DRAMs in FIGS. 1-3.

In the first to third embodiments, the n-type well region for forming the P-channel MOSFET $Q_p$ may well be formed as shown in FIG. 5.

Referring to FIG. 5, a potential (the power source potential $V_{cc}$) to the n-type well region is supplied through an n+-type region 8A which is deeper than the n+-type region 18. The n+-type region 8A is formed by the same step as that of the n+-type region 8 which is the collector of the bipolar transistor. It is accordingly formed so as to lie in contact with the n+-type buried layer 4 of the n-type well region. Thus, the resistance of the n-type well region can be rendered still lower, and the occurrence of the latch-up phenomenon can be checked.

The construction of the memory cell may well be any of constructions illustrated in FIGS. 6-10. Each of these figures shows only the memory cell portion M and the N-channel MOSFET $Q_n$ of the peripheral circuit.

Figure 6:
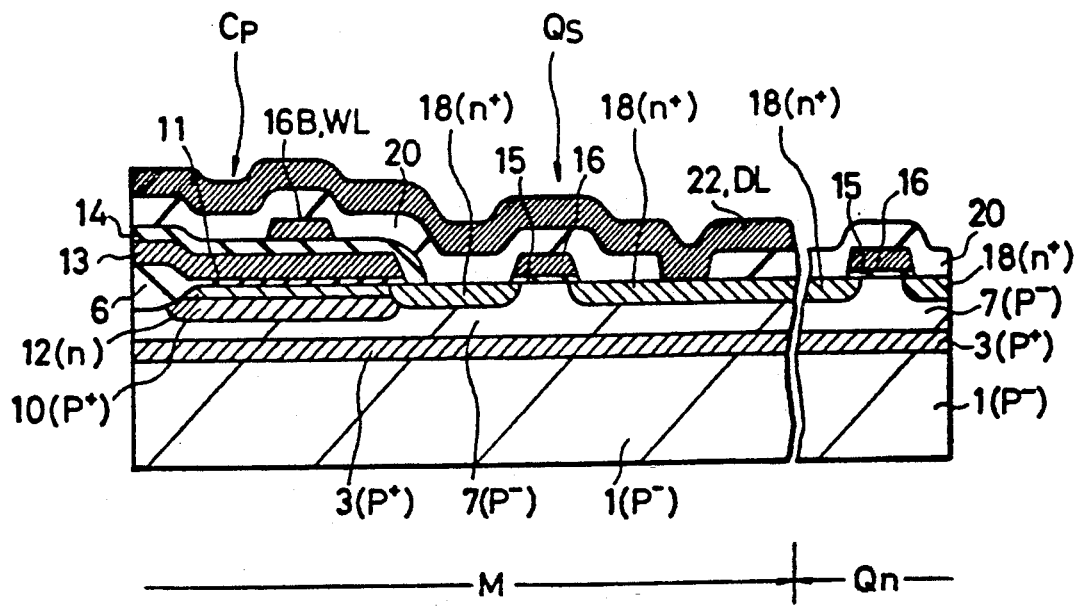
FIGS. 6-10 are sectional views each showing other structures of a memory cell and an N-channel MOSFET which are included in each of the DRAMs in FIGS. 1-3.

The memory cell in FIG. 6 is of the planar type similarly to those in FIGS. 1-3, but the capacitors $C_p$ of the adjacent memory cells are isolated by the field insulator film 6 and the p-type semiconductor region 5. This memory cell in FIG. 6 is an example in which the present invention is applied to a memory cell described in "1977 International Electron Devices Meeting, Technical Digest," pp.287–290. The MOSFET $Q_s$ does not have the side-wall insulator films 23, and accordingly has the single-drain structure in which the source and drain regions are made up of only the n+-type regions 18. Likewise, the MOSFET $Q_n$ is put into the single-drain structure.

In the memory cell of FIG. 6, the p+-type region 10 or both the n+-type and p+-type regions 12 and 10 may well be omitted. Here, when both the n+-type and p+-type regions 12 and 10 are omitted, the potential of the plate electrode 13 is set at the power source potential $V_{cc}$.

Figure 7:
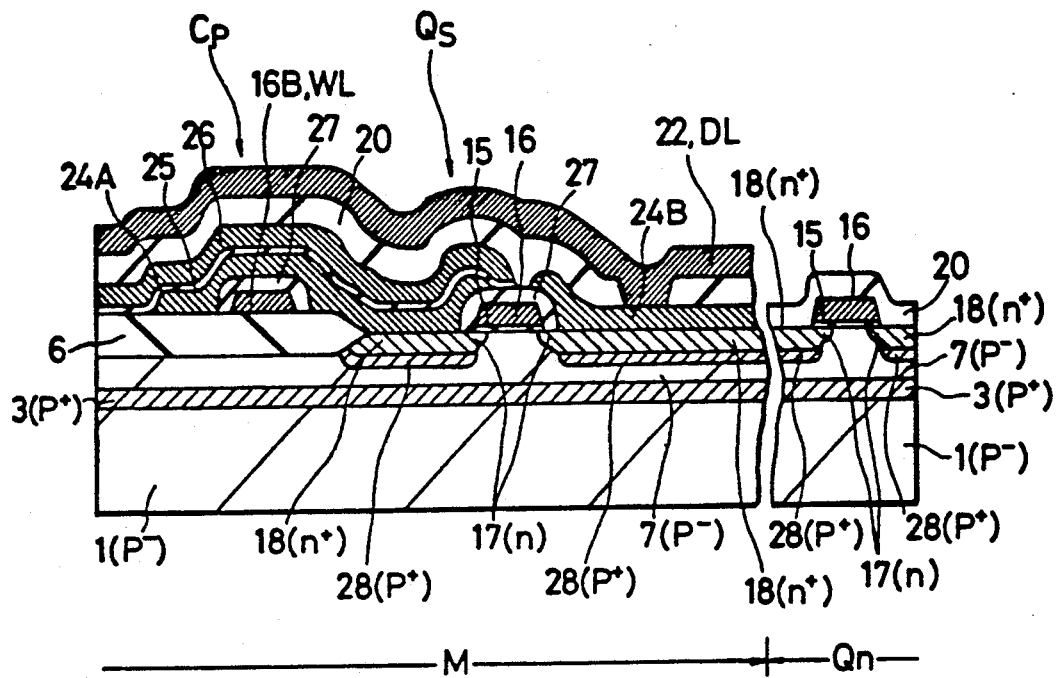

The memory cell in FIG. 7 is so configured that the capacitor $C_p$ is stacked on the main surface of the substrate. The capacitor $C_p$ is formed between an electrode 26 and an electrode 24A which is connected to one of the n-type regions (each being composed of the pair of regions 17 and 18) of a MOSFET and which is led out on the insulator film 6 for element isolation. The electrodes 24A and 26 are chiefly formed of polycrystalline silicon or the like. An insulator film 25 is the dielectric film of the capacitor, and is formed of a material similar to that of the insulator film 11. Shown at numeral 27 is an inter-layer insulator film.

In the construction of FIG. 7, the wiring layer 22 and the other pair of n-type regions 17 and 18 are connected through an electrode 24B which is formed simultaneously with the electrode 24A.

According to the construction of FIG. 7, the capacitor $C_p$ is formed in isolation from the silicon substrate, and hence, electrons do not gather in the capacitor portion to incur malfunctions. Such a memory cell is described in, for example, "IEEE Journal of Solid-Sate Circuits," Vol. SC-15, No. 4, Aug, 1980, pp. 661–667 or "International Solid-State Circuits Conference (ISSCC), Digest of Technical Papers," Feb. 1985, pp. 250–251.

In the memory cell of FIG. 7, electrons created within the substrate are prevented from collecting into the n+-type region 18 underneath the capacitor $C_p$. Thus, according to the present embodiment, the effect based on the isolation o the capacitor from the silicon substrate and the effect of the present invention contribute synergistically to raising the immunity against the soft errors still more.

The connection between the source or drain regions 18 of the MOSFET $Q_n$ and the electrode 22 (not shown) thereof may well be executed through the polycrystalline silicon film 24B as in the memory cell portion.

In the embodiment of FIG. 7, p+-type semiconductor regions 28 are provided under the n-type regions 18 (and/or 17) of the MOSFETs $Q_n$ and $Q_s$, to form potential barriers also in these parts. The regions 28 are set at an impurity concentration nearly equal to that of the region 10. The potential barriers are formed double by the regions 3 and 28, and the effect of the improvement in the soft errors becomes very great.

The measure of underlaying the n-type impurity layers with the p+-type regions 28 as in the present embodiment can be similarly applied to all the other embodiments. The p+-type regions 28 can also be formed either under the MOSFET $Q_s$ of the memory cell or under the MOSFET $Q_n$ of the peripheral circuit. The information of the p+-type regions 28 may well be omitted. Formation of the p+-type region 3, or both the p+-type regions 3 and 28 of the memory cell, in FIG. 7, can also be omitted.

The MOSFET $Q_s$ may well have the single-drain structure. On this occasion, the MOSFET $Q_n$ may be put into either the single-drain structure or the LDD structure.

Figure 8:
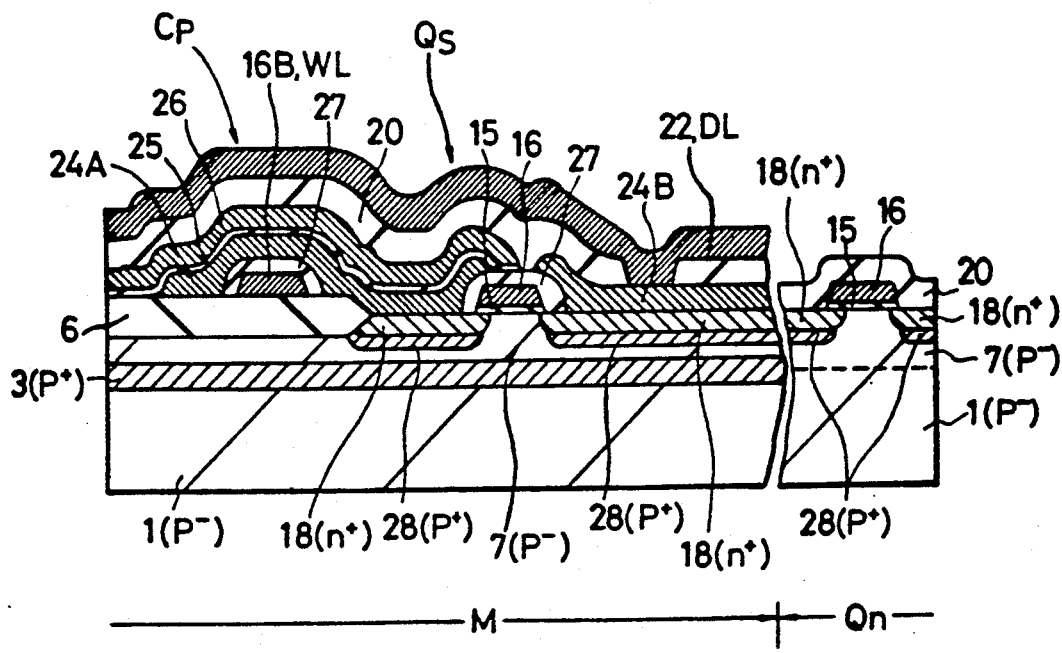

FIG. 8 shows an example in which the p+-type regions 28 stated above are formed in a case where, as in the DRAM of FIG. 2, the p+-type buried layer 3 does not exist under the MOSFET $Q_n$ (especially, under the n+-type regions 18) of the peripheral circuit. That is, this example avoids the rise of the threshold voltage attributed to the p+-type buried layer 3 and also improves the soft error rate by means of the p+-type region 28.

According to the present embodiment, problems which might be caused by the provision of the buried layer 3 can be solved. More specifically, in a case where the circuit performance changes drastically when, for example, the impurity of the buried layer 3 reaches the vicinity of the n-type regions 18 (and 17) or the gate of the MOSFET to lower the junction breakdown voltage though slightly or to raise the threshold voltage of the MOSFET though slightly, the buried layer 3 is not provided in the corresponding part only, whereby such a problem can be solved.

Figure 9:
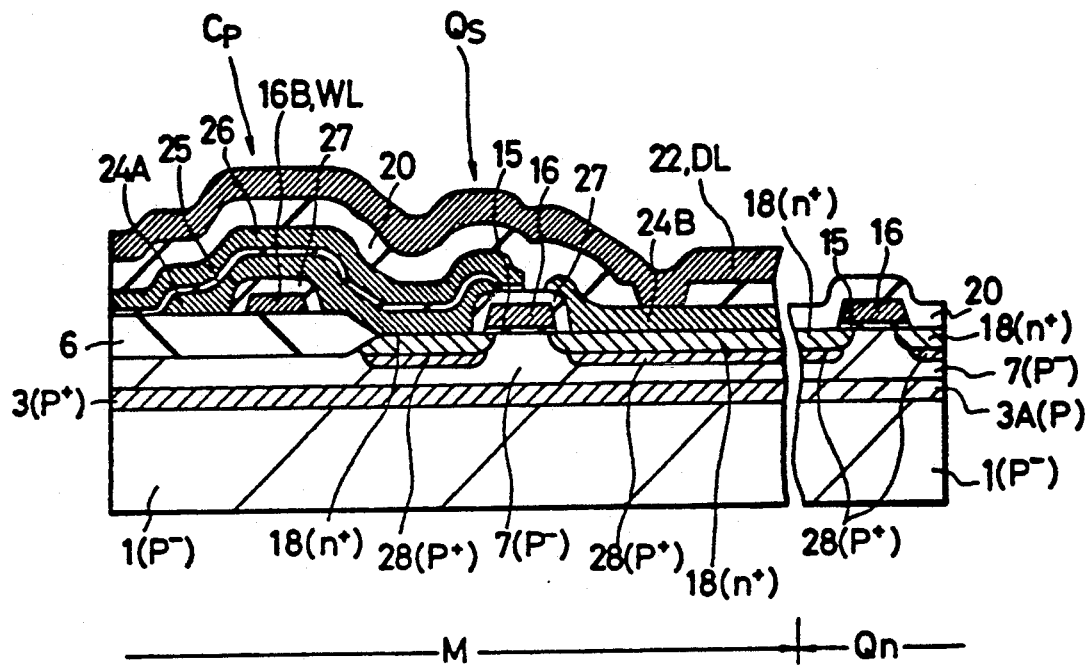

FIG. 9 shows an example in which the impurity concentration of the buried layer 3 is changed in selected parts, and the p-type buried layer 3 is endowed with different concentrations under the memory cell and under the MOSFET $Q_n$ of the peripheral circuit. By way of example, the impurity concentration of the p+-type buried layer 3A under the MOSFET $Q_n$ is set lower than that of the p+type buried layer 3, and higher than that of the substrate 1 and the region 7, in order to make the rise of the threshold voltage small. According to the present embodiment, the impurity concentrations can be set for the individual parts, so that a memory of higher performance as compared with the example of FIG. 7, with dispersions in the soft error characteristic and other electrical characteristics taken into consideration, can be realized.

Figure 10:
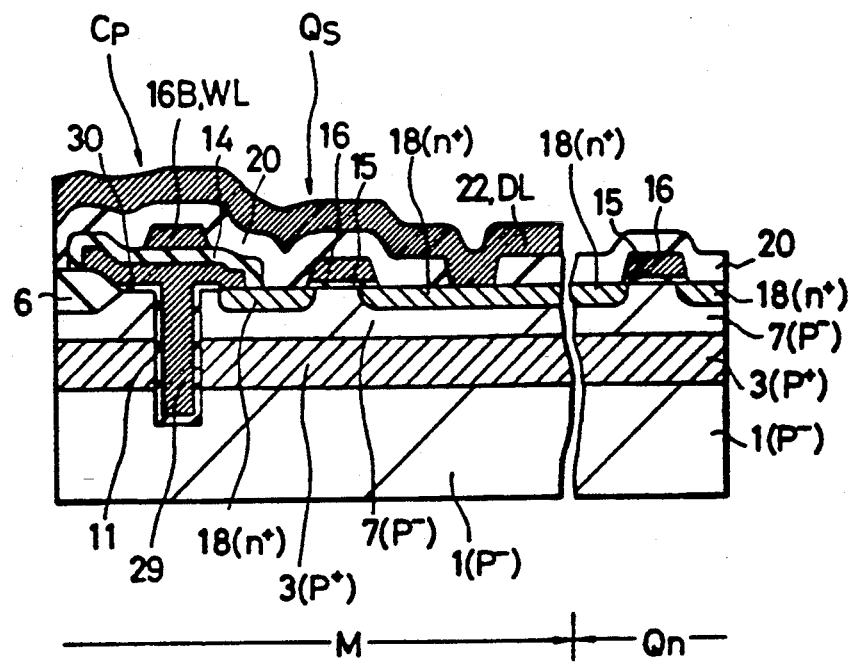

FIG. 10 shows an example in which the capacitor $C_p$ is formed by utilizing a trench or moat 29 extended in the depth direction from the main surface of the semiconductor substrate (body).

The capacitor $C_p$ is constructed of a polycrystalline silicon film 30 being one electrode, the dielectric film 11, and the semiconductor body being the other electrode. Unlike the electrode 13, the electrode 30 is formed independently for each memory cell and is connected to the n+-type region 18 of the MOSFET $Q_s$. The semiconductor body is used as the electrode common to all the memory cells, and has a fixed potential (for example, the ground potential $V_{SS}$ of the circuitry, or the minus substrate bias potential $V_{BB}$) applied thereto. Electrons created within the substrate 1 by the bipolar transistor Tr are prevented from entering the memory cell by the p+-type buried layer 3. That is, the $p^{30}$-type buried layer 3 and upper parts (shallower parts) can be utilized for the capacitor $C_p$ of slight soft errors.

The DRAM in FIG. 1 can be fabricated by combining methods of producing semiconductor integrated circuit devices as disclosed in U.S. patent aplication Ser. No. 554,794 filed on Nov. 23, 1983 and U.S. patent application Ser. No. 855,418 filed on Apr. 24, 1986, the contents of each of which are incorporated herein by reference. More specifically, the steps of forming the regions 2, 3, 4, 5 and 7 and the insulator film 6 on the semiconductor substate 1 conform to the patent application Ser. No. 554,794. The step of forming the bipolar transistor Tr is also taught in this patent application. On the other hand, the steps of forming the memory cell M and the MOSFET $Q_n$ and $Q_p$ are taught in the patent application Ser. No. 855,418. That is, after the semiconductor body has been formed in conformity with the former, the bipolar transistor Tr conforming to the former and the memory cell M and MOSFETs $Q_n$ and $Q_p$ conforming to the latter are formed in the body.

The DRAM in FIG. 2 or FIG. 3 can be formed in such a way that, when the impurity for the p+-type region 3 is to be introduced into the substrate 1, the region $Q_n$ or the region M is selectively covered with a mask of photoresist or the like.

To sum up, according to this first aspect of the present invention, it becomes possible to form a DRAM having bipolar transistors. The bipolar transistors are caused to coexist in the DRAM, whereby the operating speed of the DRAM can be raised, and at the same time, potential barriers are formed against minority carriers created by the bipolar transistors, whereby soft errors ascribable to the minority carriers can e prevented to enhance the electrical reliability of the DRAM.

Although, in the above, the invention made by the inventors has been concretely described in conjunction with embodiments, it is a matter of course that the present invention is not restricted to the foregoing embodiments but that it can be variously modified within a scope not departing from the purport thereof.

The bipolar transistor can adopt various structures.

Figure 11:
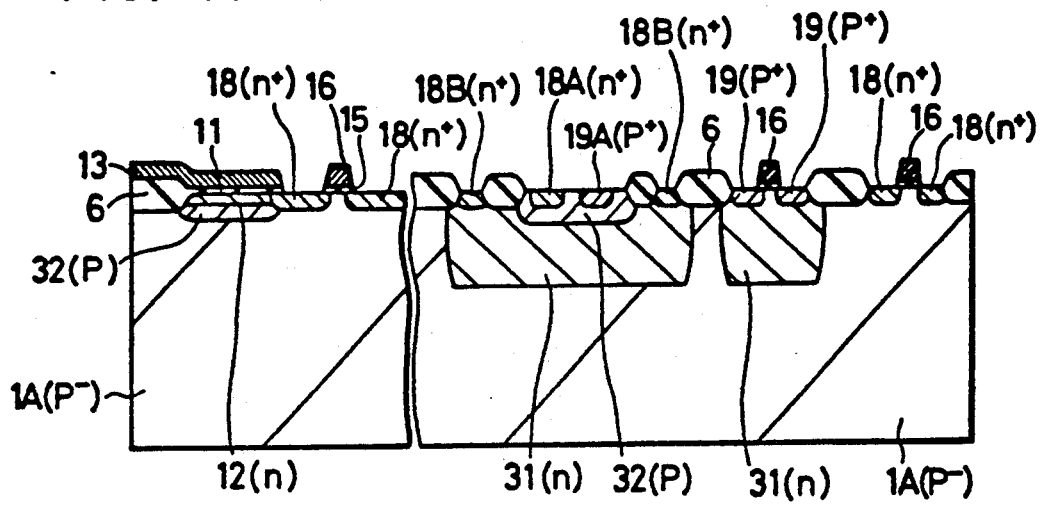
FIGS. 11 and 12 are sectional views each showing the structure of a DRAM having bipolar transistors which is another embodiment of this first aspect of the present invention.
Figure 12:
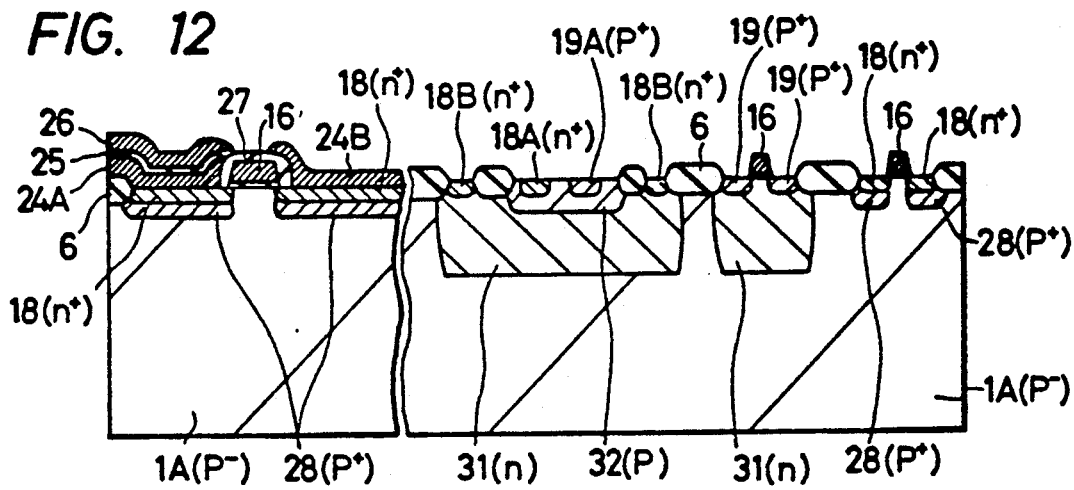

As shown in FIG. 11 or FIG. 12 by way of example, the bipolar transistor may well have a structure which includes a collector formed of an n-type well region 31, a p-type base region 32, and an n+-type emitter region 18A. An n+-type semiconductor region 18B and a p+-type semiconductor region 19A are regions for connecting electrodes (not shown) made of aluminum, and are respectively formed by the same steps as those of the source and drain regions of the N-channel and P-channel MOSFETs. The fact that the collector 31 is provided with the heavily-doped layers 18B in two places, is intended to reduce the resistance of the collector 31, thereby to prevent the bipolar transistor from being saturated due to the potential of the collector being lowered when current flows to this collector. Needless to say, if necessary, only one of the layers 18B may well be provided, or the resistance of the collector 31 may well be lowered still more with the heavily-doped layer 18B encircling the base 32. The lower resistance can also be attained in such a way that an n-type layer which is higher in the impurity concentration than the region 31 is interposed between the region 31 and the substrate 1.

By simplifying the structure of the bipolar transistor, the steps of forming the p-type and n-type buried layers, the epitaxial layer, etc. are dispensed with. That is, the manufacturing steps decrease in number and become simpler. The performance of this bipolar transistor is somewhat inferior to that of the bipolar transistor in FIG. 1.

A memory cell in FIG. 11 is the same as the memory cell shown in FIG. 6.

As will be discussed later, a p+-type region 32 for preventing soft errors in the memory cell is formed by the same step as that of the base region 32 of the bipolar transistor though this is not especially restrictive. The impurity concentration of the p+-type region 32 is set on the order of $10^{16}$–$10^{19}$/cm$^3$.

In FIGS. 11 et seq., insulator films, wiring etc. on the substrate are not shown.

It is also possible to form the p+-type buried layer 3 in the structure of FIG. 11. A memory cell and an N-channel MOSFET constituting a peripheral circuit in FIG. 12 are substantially the same as those in FIG. 9.

In the DRAM of FIG. 12, it is also possible to omit only p+-type regions 28 under the memory cell.

According to this embodiment, the DRAM having the bipolar transistors can be produced by that number of steps which is close to the number of manufacturing steps of a CMOS circuit. By taking the structure of FIG. 11 as an example, a manufacturing method will be briefly exemplified with reference to FIGS. 13A–13D.

Figure 13A:
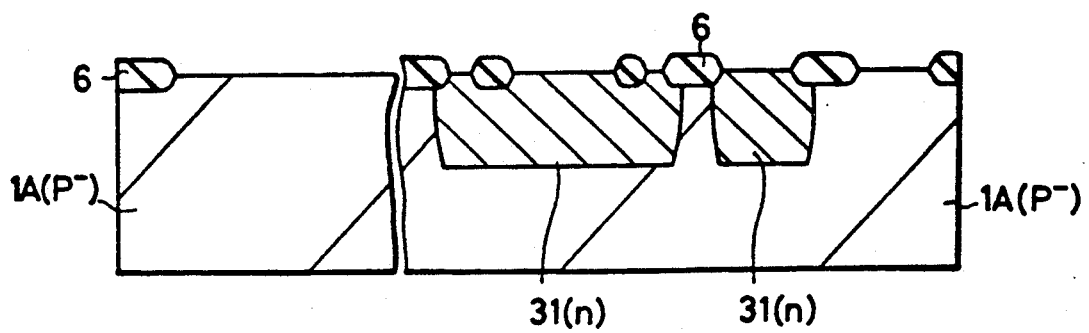
FIGS. 13A-13D are sectional views showing the outline of a manufacturing process for the DRAM in FIG. 11.

As shown in FIG. 13A, a silicon substrate 1A doped with a p-type impurity such as boron is prepared. The concentration of the impurity is usually set within a range on the order of $10^{13}$–$10^{17}$/cm$^3$. Subsequently, n-type regions (n-type wells) 31 are formed in the main surface of the silicon substrate 1A by ion implantation or conventional diffusion. At the next step, an insulator film 6 made of SiO$_2$ is formed by a known LOCOS (Local Oxidation of Silicon) process.

Figure 13B:
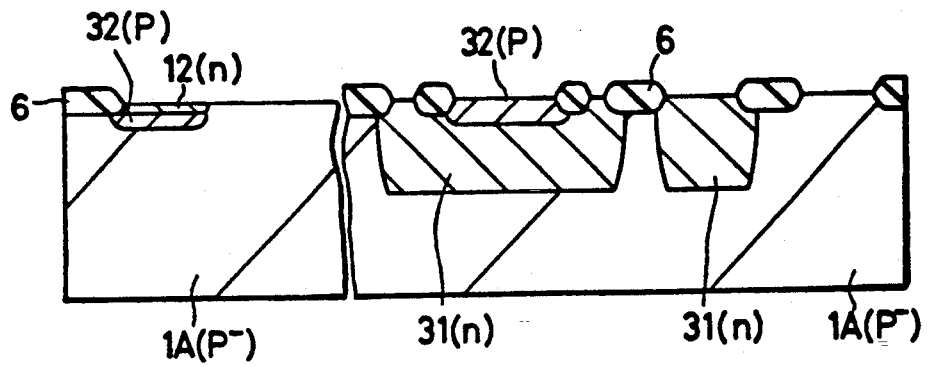

As shown in FIG. 13B, a p-type layer 32 to form a barrier and a p-type layer 32 to serve as the base of a bipolar transistor are simultaneously formed by the conventional diffusion or the ion implantation. Subsequently, an n-type layer 12 to serve as one electrode of a capacitor is formed.

Figure 13C:
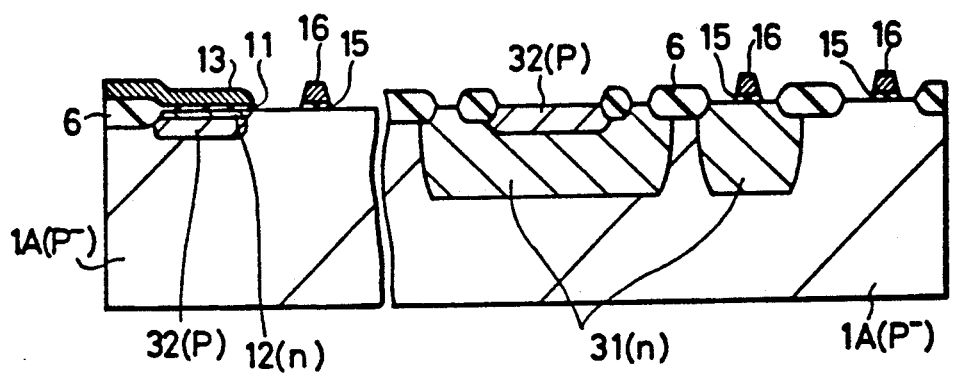

As shown in FIG. 13C, the insulator film 11 of the capacitor $C_p$ is formed by the oxidation of the surface of the silicon substrate 1A, and an electrode 13 is formed thereon. The material of the electrode 13 is, for example, polycrystalline silicon. Next, the gate insulator film 15 of a MOSFET $Q_s$ is formed by the oxidation of the surface of the silicon substrate 1A, and the gate electrode 16 thereof may be formed on the gate insulator film. Here, the insulator film 15 and the electrode 16 may be deposited on the whole surface of the silicon substrate 1A in a stacked state and be thereafter processed by known photoetching at the same time.

Figure 13D:
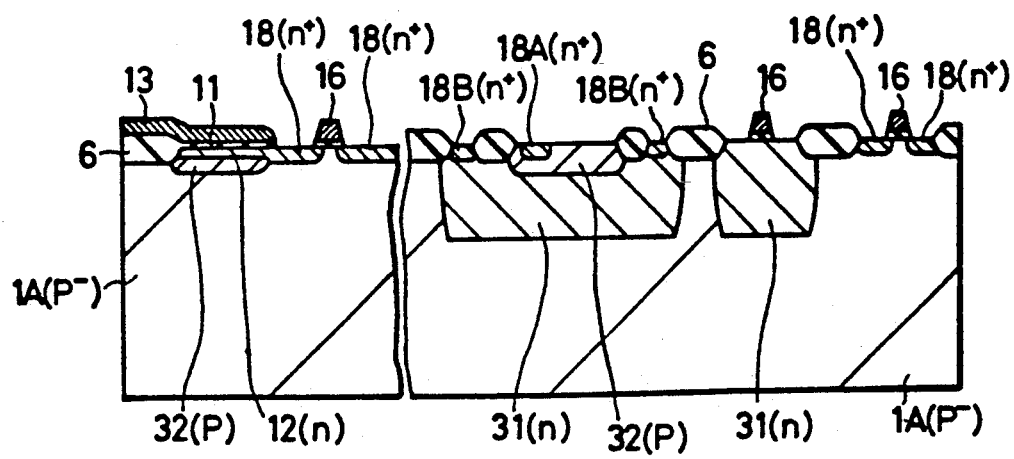

Subsequently, as shown in FIG. 13D, n+-type regions 18 to serve as the source and drain of an N-channel MOSFET, and an n+-type region 18A forming the emitter of the bipolar transistor and n+-type regions 18B constituting the collector portion thereof are simultaneously formed by ion implantation.

Thereafter, p+-type regions 19 to serve as the source and drain of a P-channel MOSFET and a p+-type region 19A within the base of the bipolar transistor are simultaneously formed by ion implantation. Then, the structure depicted in FIG. 11 is obtained. Although insulator films on the gate electrodes of the MOSFETs, wiring lines such as data lines, etc. have been omitted here, they can be readily formed by known steps.

According to the manufacturing method described above, the p-type layer functioning as the barrier and the p-type region 32 functioning as the base of the bipolar transistor can be formed by the identical step, and also the n-type well 31 for the P-channel MOSFET and the collector 31 of the bipolar transistor can be formed by an identical (single) step. Further, the n+-type regions 18 to serve as the source and drain of the N-channel MOSFET, and the n+-type region 18A forming the emitter of the bipolar transistor and the n+-type regions 18B constituting the collector portion thereof can be formed by an identical (single) step. Moreover, the p-type layers 19 serving as the source and drain of the P-channel MOSFET and the p+-type region 19A within the base of the bipolar transistor can be formed by an identical (single) step.

The bipolar transistor can adopt various configurations different form the foregoing structure.

The circuit elements may well be isolated by the p⁻-type semiconductor substrate 1 and the field insulator film 6 without providing the p+-type buried semiconductor regions 3 and the p-type semiconductor regions 5.

The peripheral circuits may well be constructed of N-channel MISFETs and bipolar transistors, not of the CMOS circuits.

Although the p-type buried layer 3 functioning as the potential barrier has been exemplified as being formed apart from the source and drain electrodes, etc. of the MOSFET, it may well be formed in close proximity thereto or in contact therewith in some cases.

The present invention is applicable, not only to the memory employing the 1-transistor and 1-capacitor type memory cell, but also to memories employing, for example, a 3-transistor type memory cell described in "Electronics," Feb. 16, 1970, pp. 109–115, etc. or a 4-transistor type memory cell described in "Fall Joint Computer Conference in 1970, Collection of Papers," pp. 54–62.

Before describing specific embodiments of the second aspect of the present invention, an outline of a Bi-CMOS static RAM (hereinafter referred to as "Bi-CMOS SRAM") with high speed and low power consumption will be first described; while not limited thereto, such Bi-CMOS SRAM is a type of device to which this second aspect of the present invention can advantageously be applied, and this second aspect of the present invention will be described in connection therewith.

Next, a detailed description of the novel information destruction mechanism clarified by the inventors, discussed briefly previously, will be described, and then specific embodiments will be described.

a) Outline of Bi-CMOS SRAM

In the circuit constitution of a Bi-CMOS SRAM as disclosed in previously mentioned U.S. patent application Ser. No. 701,226, a Bi-CMOS complex switching circuit is used in a peripheral circuit such as an address circuit or timing circuit, and a flip-flop type memory cell with a high resistance load is used in the memory cell.

Figure 14:
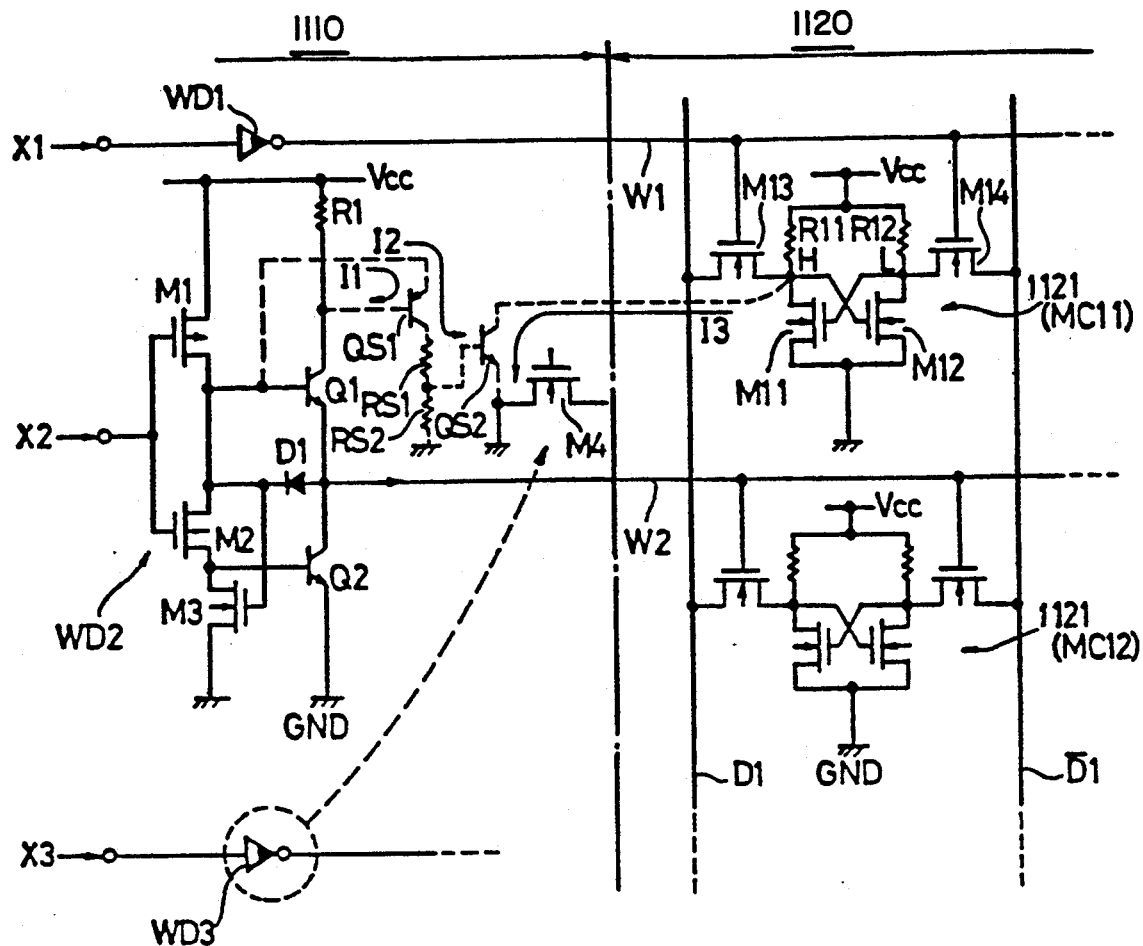
FIG 14 is a circuit diagram illustrating a memory cell information destruction mechanism clarified by the inventors.

FIG. 14 is a circuit diagram of a Bi-CMOS SRAM illustrating an example of circuit constitution of word line driver circuits $WD_1$, $WD_2$ of peripheral circuit 1110 and memory cells 1121, 1121.

As shown in FIG. 14, logical circuit (switching circuit) of the peripheral circuit unit 1110 comprises bipolar transistors $Q_1$, $Q_1$, P-channel MOS field effect transistor M1, N-channel MOS field effect transistors M2, M3 and diode $D_1$. The bipolar transistors $Q_1$, $Q_2$ are connected in totem pole connection, and constitute an output stage of the CMOS logical circuit (M1, M2). The MOS field effect transistors M1, M2 constitute a prestage drive circuit by CMOS. That is, the logical circuit (switching circuit) of the peripheral circuit unit 1110 includes the bipolar transistors and the MOS field effect transistors. R1 designated a series resistor in parasitic constitution as a device at the collector side of the bipolar transistor $Q_1$. In FIG. 14, $X_1$–$X_3$ designate internal address signals.

In the memory cell array unit 1120, a number of memory cells 1121 are arranged in matrix form of rows and columns. Word line W for selecting a presecribed memory cell from a plurality of memory cells 1121 and complementary data lines D, $\overline{D}$ are connected to each memory cell 1121. As shown in FIG. 14, a plurality of word liens $W_1$, $W_2$, ... and a plurality of complementary data liens $D_1$, $\overline{D_1}$ ($D_2$, $\overline{D_2}$) are formed perpendicular to each other. Although not shown, the complementary data lines $D_1$, $\overline{D_1}$ are connected through a column switch to a sense amplifier and output circuit. Each of the memory cells (MC11, MC12) 1121 includes a pair of n-channel MOS field effect transistors M11, M12 with each input and output cross-coupled, load resistors R11, R12 made of polysilicon having high resistance value in giga-hom unit and connected in series between the output of the n-channel MOS field effect transistor and the operation potential Vcc, and MOS field effect transistors M13, M14 as transfer switch connected between the complementary data line pair $D_1$, $\overline{D_1}$ and output of the n-channel MOSFET M11, M12. That is, the memory cell 1121 constitutes a sort of flip-flop type holding circuit.

In FIG. 14, MOSFET M4 is a Bi-CMOS complex circuit formed in the peripheral circuit unit 1110 or N-channel MOSFET contained in the CMOS circuit.

That is, the NMOSFET M4 represents transistor similar to the NMOSFET M3 of the word line driver circuit WD2 contained in the line driver circuit WD2 contained in the line driver circuit WD3 (WD1).

Figure 15:
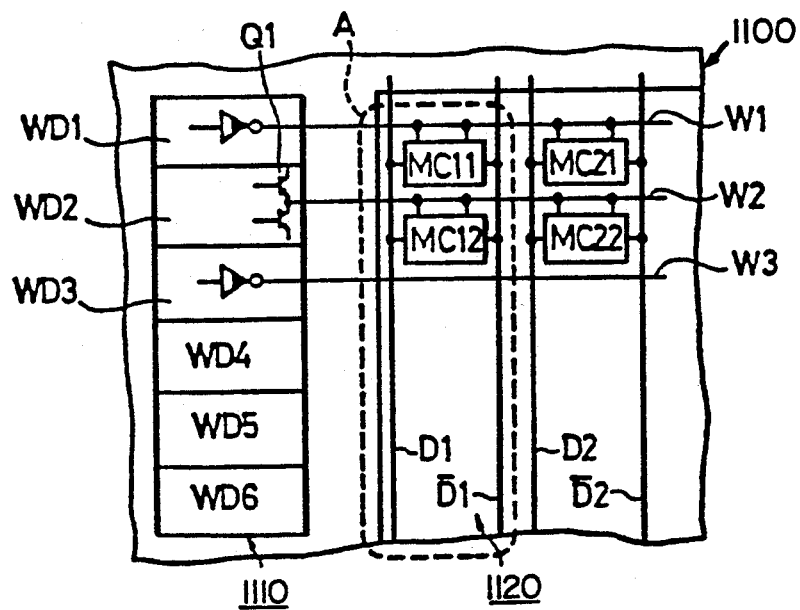
FIG. 15 is a device plane layout diagram corresponding to a part of the circuit diagram of FIG. 14.

FIG. 15 partially shows the layout arrangement of the peripheral circuit unit 1110 and the memory cell array unit 1120.

As shown in FIG. 15, the peripheral circuit unit 1110 is formed along the circumference of the memory cell array unit 1120.

As above described, the logical circuit of a Bi-CMOS type is used in the peripheral circuit unit 1110, whereby a static RAM can be realized having both high speed and low power consumption.

The word line drivers WD1-WD6 shown in FIG. 14, FIG. 15 are inverter circuits, and the transistors at the output stage are bipolar. This is shown by the black painting at output of the logical symbol of the inverter.

Figure 16:
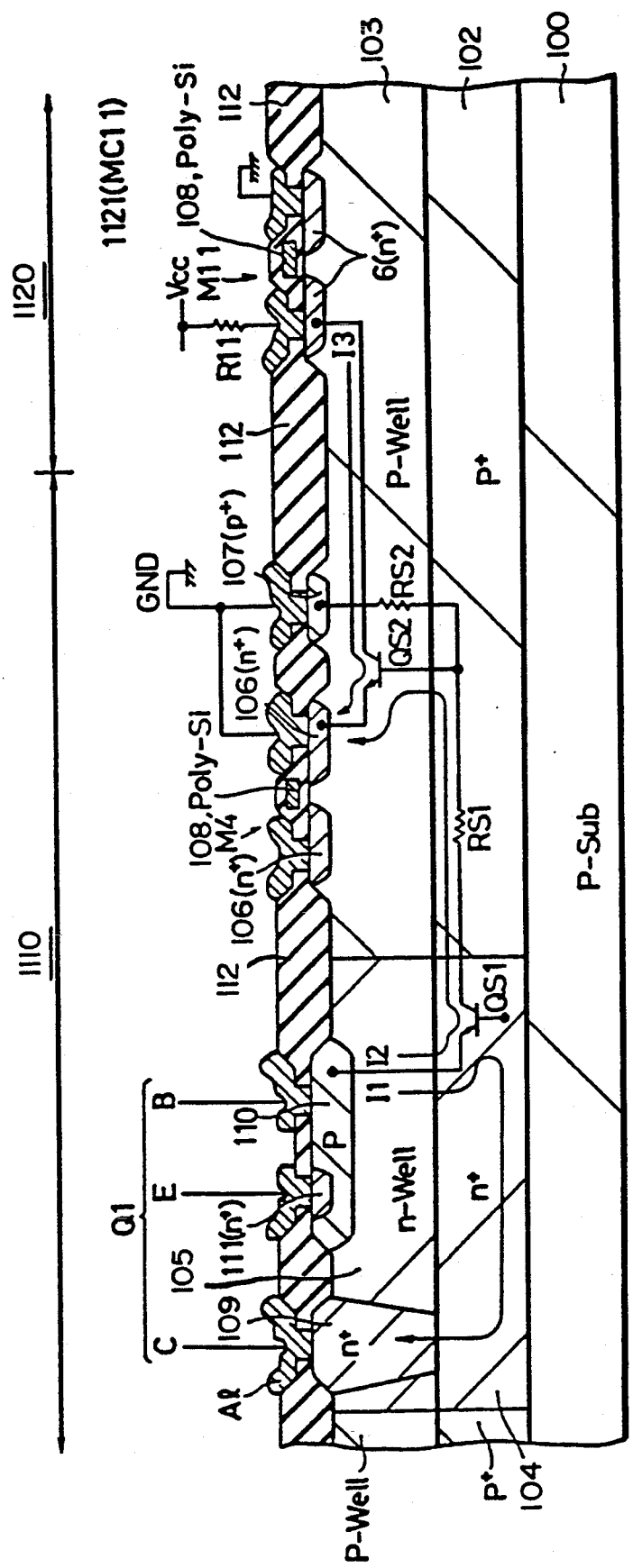
FIG. 16 is a device sectional view corresponding to the circuit diagram of FIG. 14 and the layout diagram of FIG. 15.

FIG. 16 shows a device sectional view of the bipolar transistor $Q_1$ of the word line driver WD2 in FIG. 15, the NMOSFET M4 with source at GND potential in another peripheral circuit, the NMOSFET M11 contained in the memory cell MC11, and the resistor $R_1$.

The Bi-CMOS static RAM 1100 shown in FIG. 16 is formed using p-type monocrystalline semiconductor substrate 100. On the p$^-$ type semiconductor substrate 100 are formed p$^+$ type buried layer 102, p type diffusion layer (well) 103, n$^+$ type buried layer 104 and n type well diffusion layer 105, and adoption of the double well system obviates the necessity of an isolation layer.

In order to constitute n-channel MOS field effect transistors M4, M11 on the p type well diffusion layer 103, a gate electrode 108 made of polysilicon, n$^+$ type source•drain diffusion layer 106 in self-aligning formation and p$^+$ type well connecting diffusion layer 107 are formed. The gate electrode 108 may be formed of conductive polysilicon, silicide, high melting point metal or by a combination of these. GND designates the grounding potential being the operation potential at low level.

In order to constitute bipolar transistor $Q_1$ on the n type well diffusion layer 105, n$^+$ type collector electrode drawing diffusion layer 109, p type base diffusion layer 110, n$^+$ type emitter diffusion layer 111 and source•drain of p-channel MOSFET (not shown) are formed. C designates the collector, E designates the emitter and B designates the base. Numeral 112 designates an oxide film (SiO2 film) to cover the substrate surface. The oxide film 112 is provided with an aperture for drawing electrode, and an aluminium electrode A1 as wiring is formed in the aperture. The emitter electrode E and the source•drain electrode of the NMOSFET M4, M11 may be formed by conductive polysilicon.

The Bi-CMOS structure can be formed according to the following process. The p type monocrystalline substrate 100 is prepared, and the surface oxide film with film thickness of about 430 Å is formed on the surface of the substrate 100. A nitride film (Si3N4) is formed selectively on the surface oxide film. Using the nitride film as an impurity introducing mask, antimony is introduced in the p type substrate 100 and the N type buried layer 104 is formed. Next, using the nitride film as an anti-oxidation mask, an oxide film with film thickness of about 4000 Å is formed on the N type buried layer 104 and then the nitride film is removed. Using the oxide film on the N type buried layer 104 as an impurity introducing mask, boron is ion-implanted in self-alignment and the p type buried layer 102 is formed. The surface oxide film is entirely removed, and an n type epitaxial layer is formed on the substrate 100 and further SiO2 film of about 950° C. is formed on the surface of the epitaxial layer. And then masking and processing similar to the forming process of the N type and P type buried layers are performed thereby the N type well layer 105 and the P type well layer 103 are formed. The N-channel MOSFET is formed in the P type well layer 104, and the P-channel MOSFET and npn bipolar transistor are formed in the N type well layer 105. A feature of the manufacturing process is that adoption of the double well system obviates the necessity of an isolation layer, and that the well layers 103, 105 and the buried layers 102, 104 can be formed using the same mask thereby the manufacturing masks may be reduced in number.

b) Novel Memory Cell Information Destruction Mechanism

I. As shown in FIG. 16, pnp type parasitic bipolar transistor Qs1 and npn type parasitic bipolar transistor Qs2 are latently formed in the semiconductor area extending from the peripheral circuit unit 1110 to the memory cell array unit 1120. Further the two parasitic bipolar transistors Qs1, Qs2 are connected to each other through resistors Rs1, Rs2 being parasitic in the diffusion layer.

In FIG. 14, if the source voltage Vcc is large, transient current flowing instantaneously through the bipolar transistor $Q_1$ at output stage increases during the switching of the CMOS type logic circuit. If the transient current increases, the bipolar transistor is significantly saturated instantaneously.

In FIG. 14 and FIG. 16, if the bipolar transistor $Q_1$ is significantly saturated even instantaneously, the p type base area 110 and the n type areas 104, 105 are biased forward. That is, the collector potential of the bipolar transistor $Q_1$ becomes lower than the base potential. Then current $I_1$ flows from base B side of the bipolar transistor $Q_1$ to collector C side. Base•emitter voltage of the pnp type parasitic bipolar transistor Qs1 is generated and therefore the transistor Qs1 is rendered on. Thereby collector current $I_2$ flows through the pnp type parasitic bipolar transistor Qs1. If the current $I_2$ flows, the potential of the substrate 100 rises by the parasitic resistors Rs1, Rs2 in the p type area (100, 102, 103). Further, the collector current $I_2$ supplies the npn type parasitic bipolar transistor Qs2 with base current. Base•emitter voltage of the npn type parasitic bipolar transistor Qs2 is generated and therefore the transistor Qs2 is rendered on. As a result, collector current $I_3$ flows through the npn type parasitic bipolar transistor Qs2. Then the collector current $I_3$ of the npn type parasitic bipolar transistor Qs2 flows from the drain of the MOS field effect transistor M11 to constitute the memory cell 1121.

In the upper memory cell MC11 shown in FIG. 14, assume that the NMOSFET M11 is rendered off and M12 is rendered on and data is held as shown in the figure. Drain potential of the MOS field effect transistor M11 in the memory cell 1121 is raised to the side of the source potential Vcc by the load resistor $R_{11}$ of polysilicon having every high resistance value. Consequently, even if the current $I_3$ drawn from the drain by the parasitic bipolar transistor Qs1, Qs2 is quite small, the drain potential of the MOS field effect transistor M11 is easily lowered and the potential held at high level (H) becomes low level (L) thereby the flip-flop is inverted and the storage information of the memory cell is destroyed. The information destruction is apt to be produced particularly at portion A in the memory cell array unit 1120 near the peripheral circuit unit 1110, as surrounded by a dotted line in FIG. 15.

In the semiconductor memory as above described, problems have been clarified by the inventors that when the operation source voltage Vcc, for example, is high, the bipolar transistor $Q_1$ is apt to be saturated and therefore the storage information may be partially destroyed.

II. In addition to the above description, the novel information destruction mechanism occurs further relating to the input protective element.

FIG. 17 is a circuit diagram illustrating a portion from input of the address signal Ai to the memory cell MC11, for example. The address signal Ai is applied to the input pad PAD, and then transmitted through the input protective resistor $R_{11}$ and the MOSFET M6, M7 of the CMOS circuit constituting the input buffer circuit to the word line drive circuit $WD_2$, thereby the word line drive circuit $WD_2$ is rendered on or off in response to the inputted address signal Ai. M5 designates the input protective element which protects destruction of the gate oxide film of the MOSFET M6, M7 of the CMOS circuit at a next stage from the static electricity.

FIG. 18 shows a sectional view of the input protective element M5 and the memory cell MC11 in FIG. 17. The input protective element M5 is composed of the n type source areas 120, 120 at the ground potential formed on the P-well layer layer 113, the n+ type drain area 121 connected electrically to the input pad PAD, and the P type layer 122 formed on the P-well layer 113 so as to make the P-well layer 113 the ground potential. The memory cell MC11 is similar to that shown in the sectional view of FIG. 16 and therefore the detailed description shall be omitted.

Around the input protective element M5 are provided the N type buried layer 104 formed to surround the MOSFET M5 and connected to the definite potential Vcc such as the operation potential, and the N-well layer 105. The N type buried layer 104 and the N-well layer 105 constitute a second minority carrier absorbing guard ring 114;

In FIG. 17 and FIG. 18, when a signal of negative potential is inputted to the input pad as shown in the figure, other novel information destruction will now be described. If the signal of negative potential is inputted to the input pad PAD, potential of the drain area 121 of the input protective element M5 becomes lower than the ground potential of the p type substrate 100, the p+ type buried layer 102, the p type well layer 103, thereby the p type areas 100,102,103 and the drain area 121 become in the forward bias state. As a result, a parasitic transistor Qs3 is formed using the N-well layer 105 of Vcc potential. The N buried layer 104 formed to surround the input protective element M5 as collector, the p type areas 100, 102, 103 as base, and the drain area 120 of the input protective element M5 as emitter, and base•emitter potential is established, thereby the transistor Qs3 is rendered on and collector current $L_4$ flows. If the value of the input signal of the negative potential is small, the N-well layer 105 being connected to the Vcc potential, the N type buried layer 104 can sufficiently absorb the minority carriers (electrons) injected from the n+ type layer 120 to the p type areas 100,102,103. If the negative potential of the input signal is large, however, electrons of the minority carriers cannot be sufficiently absorbed by the N-well layer 105 of the Vcc potential, the N type buried layer 104. As a result, as shown in FIG. 17, FIG. 18, the parasitic transistor Qs4 is formed using the p type areas 100,102,103 as base, drain area 121 of the input protective element M5 as emitter and drain (N+ area 106) of the MOSFET M11 of the memory cell MC11 holding the shown information as collector, and base•emitter potential of the transistor Qs4 is established, thereby collector current flows from the drain 106 of the MOSFET M11 of the memory cell. As a result, the information held in the memory cell MC11 is destroyed in similar manner to the above description.

c) Feature of the Second Aspect of the Invention

A feature of the second aspect of the present invention is that the current amplification factor $h_{fe}$ of the parasitic bipolar transistors Qs2, Qs4 using the drain of high potential of the MOSFET of the memory cell MC11 as collector is reduced or generation of the parasitic bipolar transistors Qs2, Qs4 is prevented, whereby the destruction of information in the memory cell is prevented.

More specifically, the following constitution is possible.

I. A first impurity introducing layer connected to defininte (fixed) potential (Vcc) is formed between a switching circuit (ex. word line drive circuit), including bipolar transistor and MOSFET, and a memory cell. N type layers 104a, 105a shown in FIG. 20, FIG. 21, FIG. 22 and N type layer 161 shown in FIG. 23 correspond to the first impurity introducing layer, i.e., a first minority carrier absorbing area 113.

As above described, the first minority carrier absorbing area is provided. Whereby the current amplification factor $h_{fe}$ of the parasitic bipolar transistors Qs2, Qs4 can be reduced. Consequently, even if a MOSFET with a drain of high potential in the memory cell exists around Bi-CMOS composite switching circuit as a peripheral circuit, the destruction of information in the memory cell can be prevented.

Figure 25:
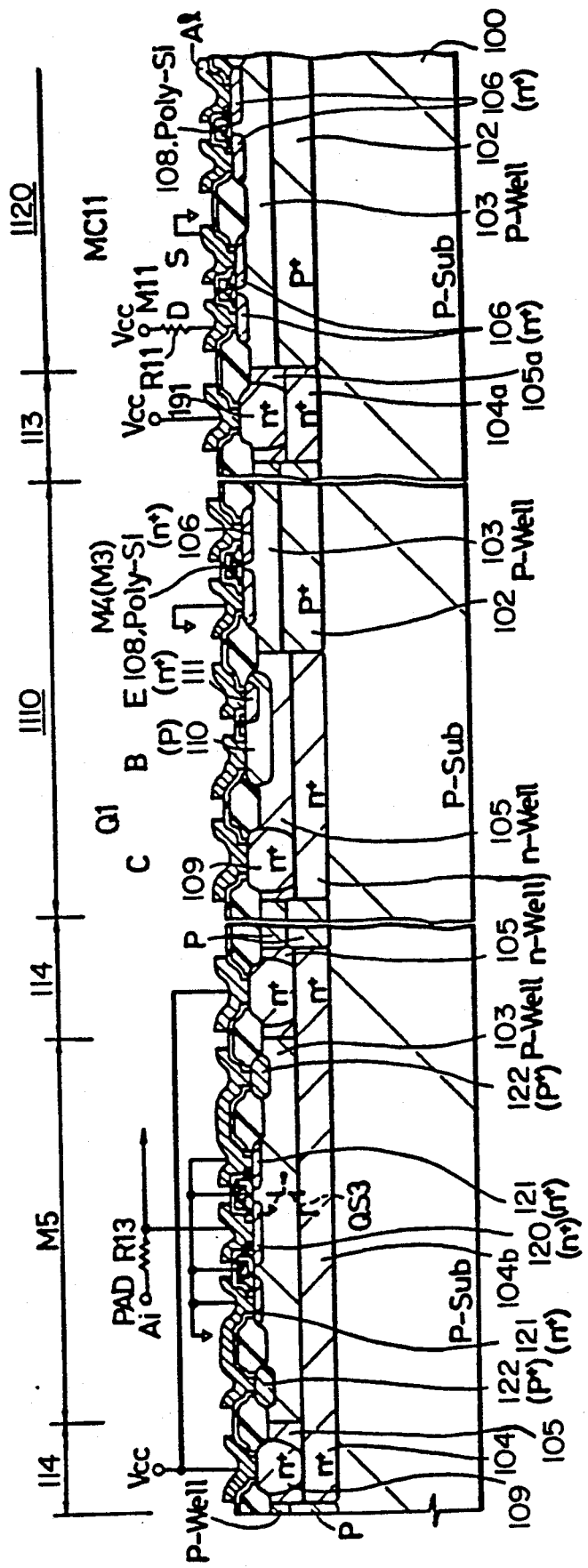
FIG. 25 is a device sectional view of a modification of FIG. 24, where n type buried layer 104b is formed under P-well layer 102 with formation of input protective element M105, and the P-well layer 102 is isolated electrically from p type substrate 101.
Figure 26:
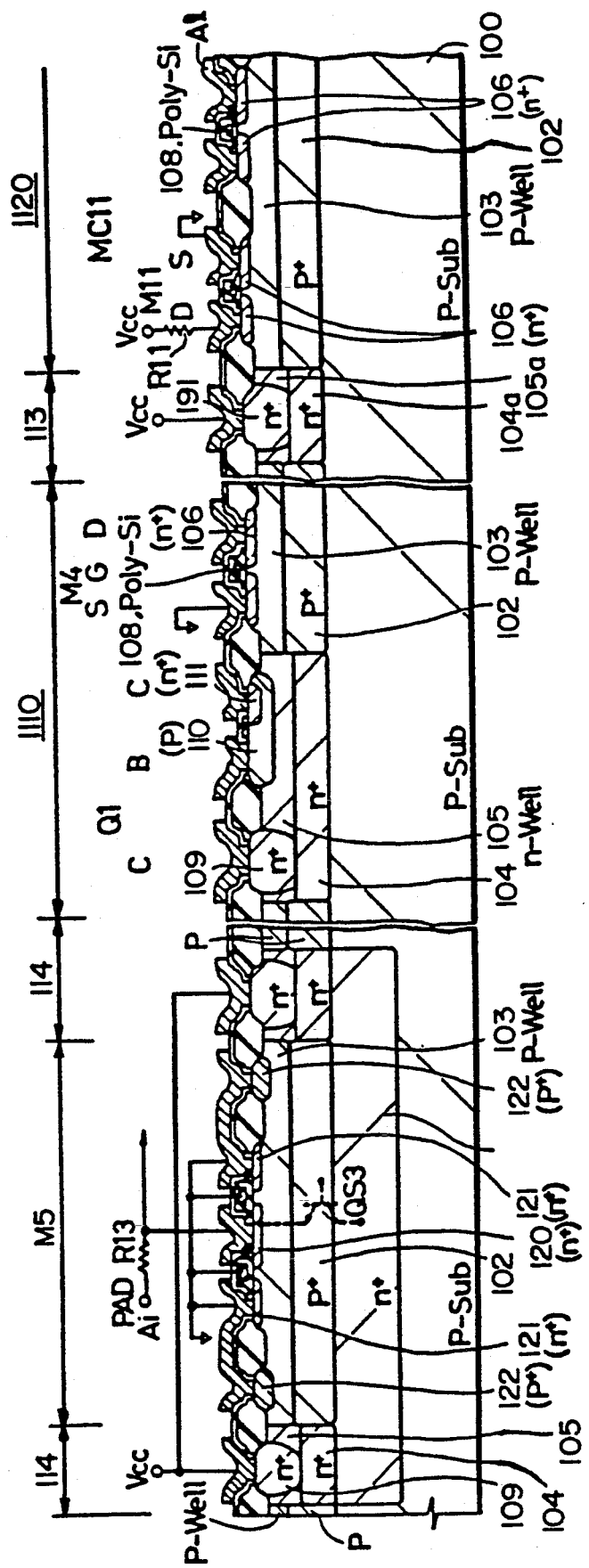
FIG. 26 is a device sectional view of a modification of FIG. 25, where n type buried layer 104c is formed so that the P-well layer 102 with formation of the input protective element M105 is isolated electrically from the p type substrate 101.
Figure 27:
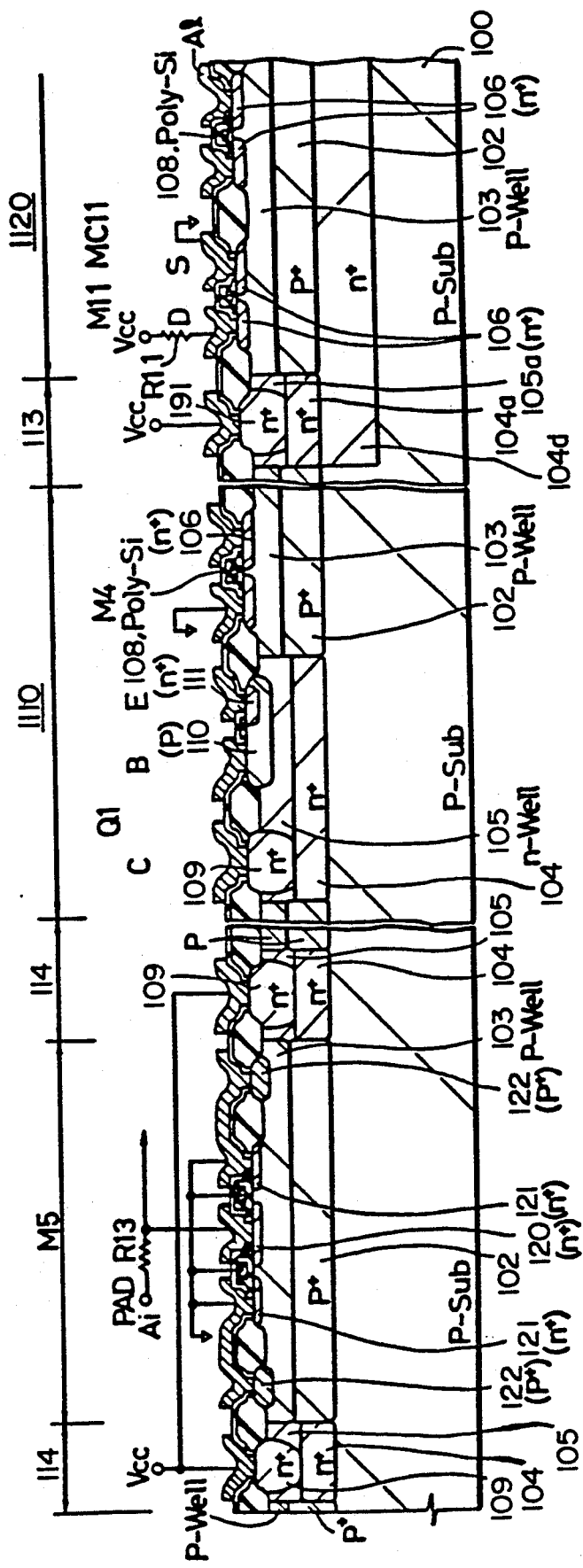
FIG. 27 is a device sectional view of a modification of FIG. 25 and FIG. 26, where P-well layer 103 with formation of memory array 1120 is isolated electrically from the p type substrate 101 by first minority carrier absorbing area 113 formed to surround memory array and N type area 104d.

II. In order to prevent generation of the parasitic bipolar transistors Qs2, Qs4 more effectively, as shown in FIG. 25, FIG. 26, the P-well layer 103 with the input protective element M5 formed thereon is surrounded by the N-well layer 105 (N type buried layer 104) as a second minority carrier absorbing area connected to Vcc potential and formed to surround the input protective element M5 and by the N type buried layer 104b (N type buried layer 104c) under the P-well layer 103 with the input protective element M5 formed thereon, and the P-well layer 103 with the MOSFET M5 formed thereon is independent electrically of other P type wells 103. Otherwise, as shown in FIG. 27, the P type well layer 103 with the memory cell MC11 formed thereon is surrounded by the N type impurity introducing layer 191, the N buried layer 104a, the N-well 105a connected to Vcc potential as the first carrier absorbing area 113 and by the N type buried layer 104d formed under the P type well layer 103 with the memory cell formed thereon and connected electrically to the N type buried layer 104a, the N type well layer 105a, and the P type well layer 103 with the memory cell formed thereon is independent electrically of other P type well layers 103.

In the above construction, since the moving path of the minority carriers can be interrupted, generation of the parasitic bipolar transistor Q4 or both parasitic bipolar transistors $Q_2$ and $Q_4$ can be prevented. As a result, the destruction of information in the memory cell can be prevented.

Embodiments of this second aspect of the invention will now be described.

EMBODIMENT 1

Typical embodiments of the second aspect of the invention will be described referring to the accompanying drawings.

In the drawings, the same reference numeral designates the same or like parts.

FIG. 19, FIG. 20, FIG. 21 and FIG. 22 show an embodiment of a semiconductor memory according to this aspect of the invention.

The semiconductor memory shown in FIG. 19–FIG. 22 is a static RAM using a Bi-CMOS type logical circuit in the peripheral circuit, and the basic constitution is similar to that shown in FIG. 14–FIG. 16.

Figure 22:
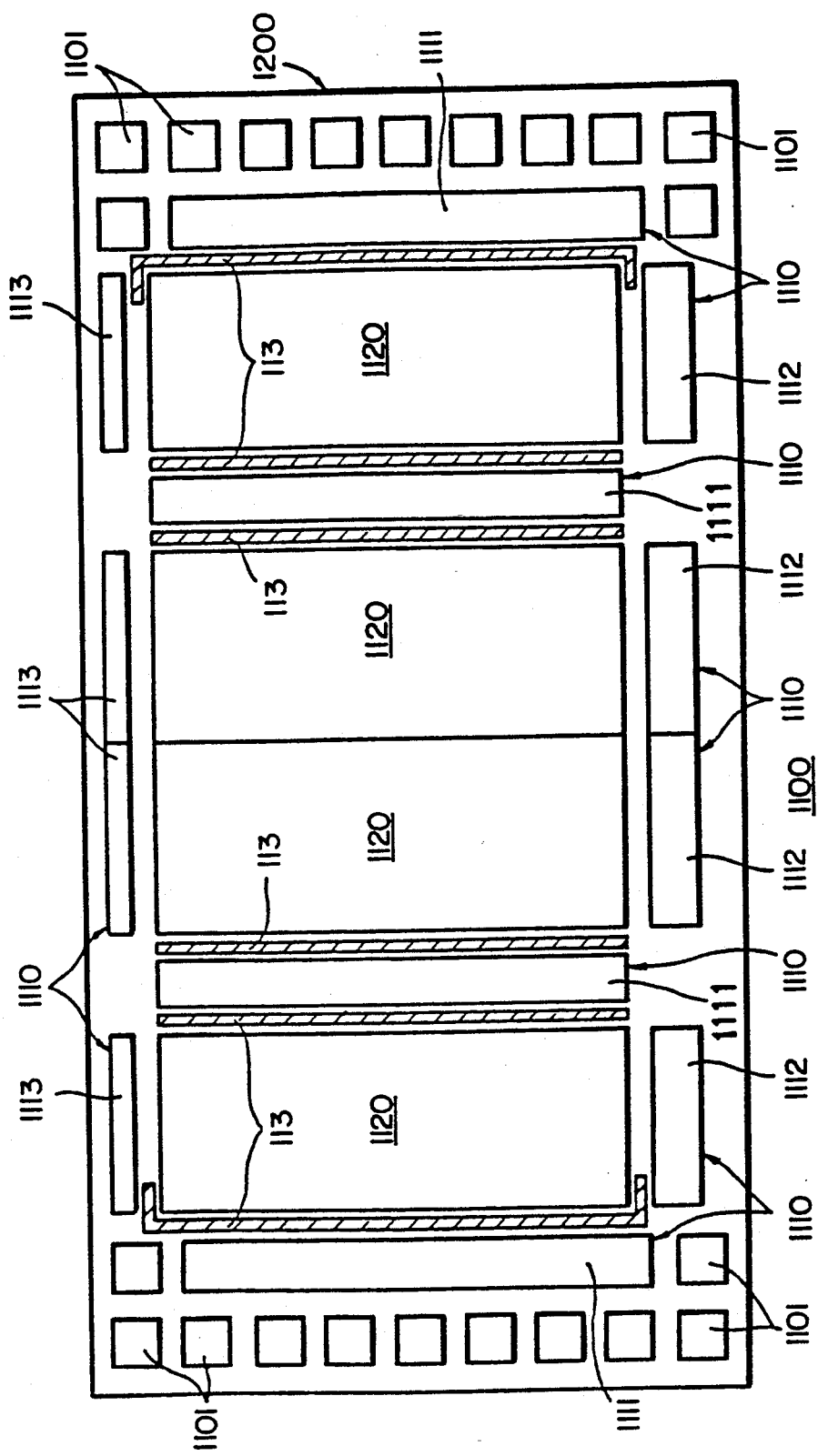
FIG. 22 is a whole device plane layout diagram of a memory in applied state of the first embodiment of this second aspect of the invention.

FIG. 22 shows the outline of whole constitution of the static RAM 1100.

As shown in FIG. 22, the static RAM 1100 is formed on a single semiconductor substrate 1200. Most of the area of the substrate 1200 is occupied by a memory cell array unit 1120. The memory cell array unit 1120 is divided into a plurality of surfaces, and a peripheral circuit unit 1110 is arranged around each divided surface of the memory cell array unit 1120 and therebetween. Further, a terminal pad PAD 1101 is arranged to the outside. The peripheral circuit unit 1110 comprises a word line decoder and driver unit 1111, a data line decoder and selective switch unit 1112, and a data line pull-up circuit unit 1113.

Figure 19:
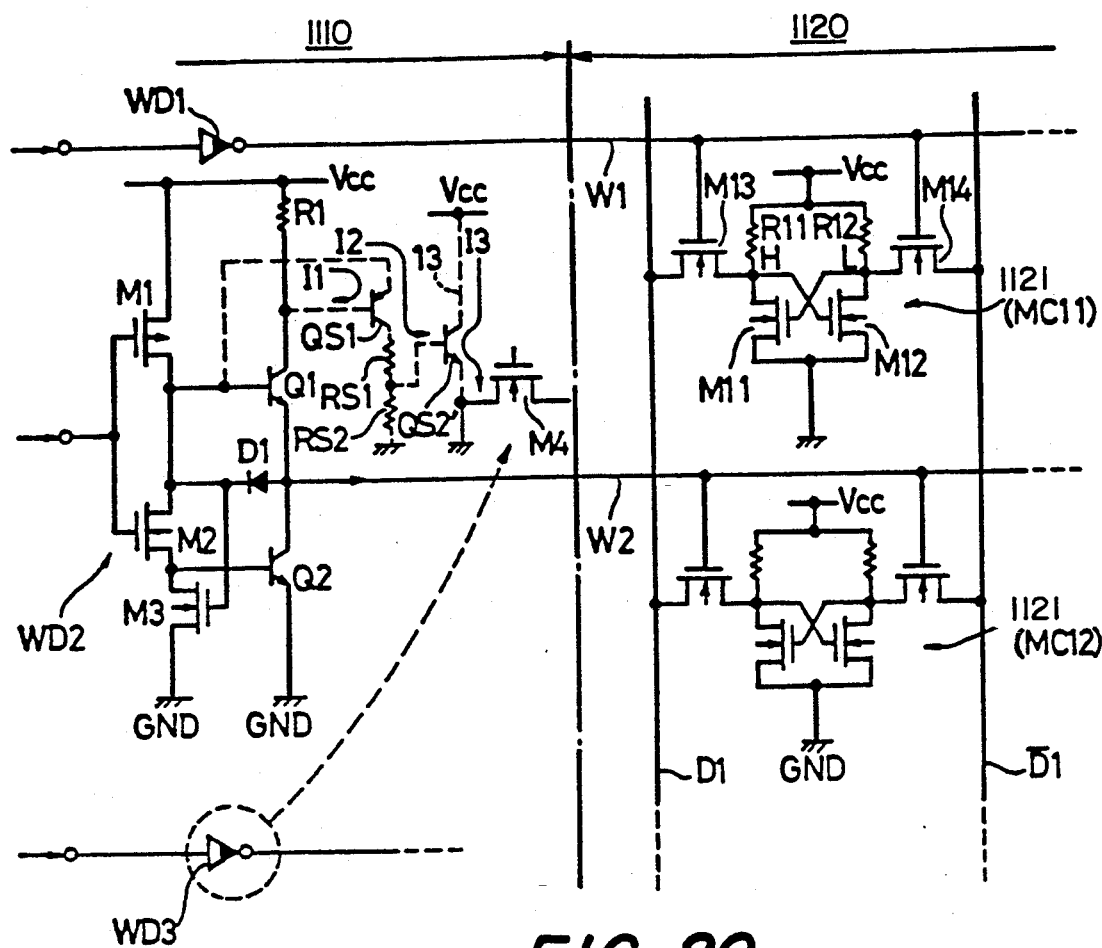
FIG. 19 is a circuit diagram corresponding to FIG. 14 in applied state of the invention.
Figure 20:
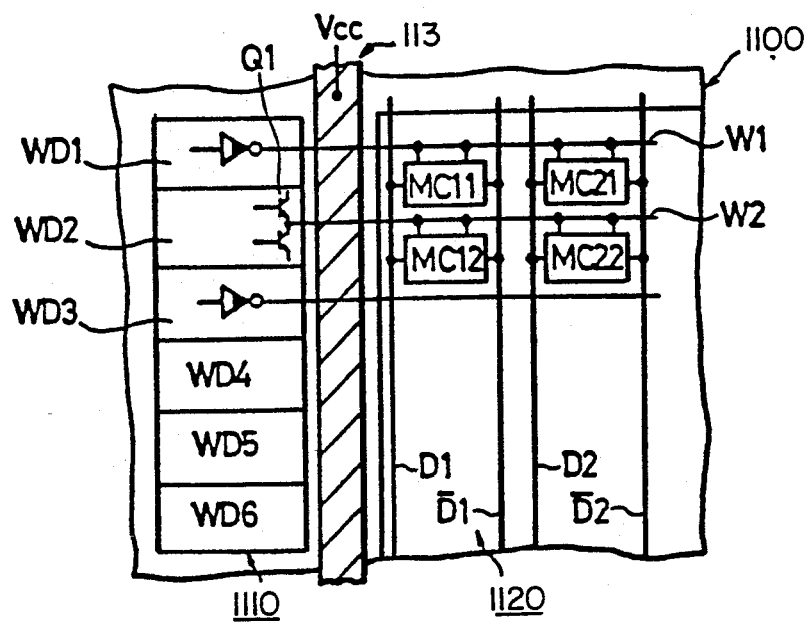
FIG. 20 is a device plane layout diagram in an applied state of a second aspect of the invention where first minority carrier absorbing area 113 connected to definite potential is formed between peripheral circuit 1110 and memory array 1120.
Figure 21:
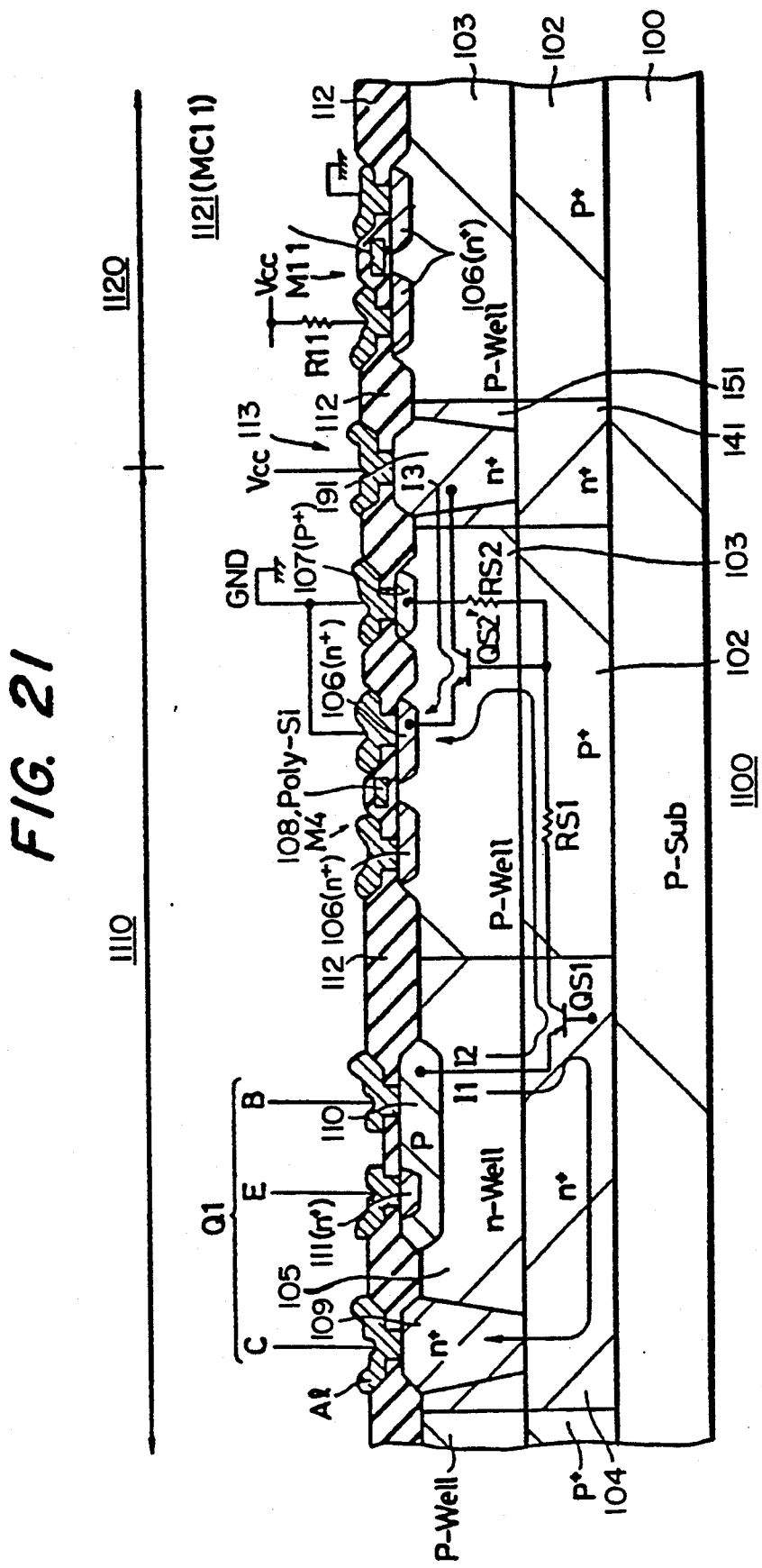
FIG. 21 is a device sectional view in applied state of a first embodiment of this second aspect of the invention.

In the static RAM 1100 shown in FIG. 19–FIG. 22, in addition to the constitution shown in FIG. 14–FIG. 16, a first minority carrier absorbing area 113 obstructing movement of carriers is interposed between the memory cell array unit 1120 and the peripheral circuit unit 1110. As shown in FIG. 21, the minority carrier absorbing area 113 is composed of n+ type diffusion layer 191 as a first impurity introducing layer and n+ type buried layer 141, n type well layer 151. The n+ type diffusion layer 191 is formed simultaneously with n+ type collector electrode drawing diffusion layer 109 of the bipolar transistor $Q_1$. The n+ type diffusion layer 191 as a guard band 113 is connected to the source potential Vcc.

If the guard band 113 is interposed between the memory cell array unit 1120 and the peripheral circuit unit 1110 as above described, it becomes difficult for the parasitic bipolar transistor Qs2 to be formed between the peripheral circuit unit 1110 and the memory cell array unit 1120. In place of this, as shown in FIG. 19, FIG. 20, FIG. 21, the parasitic transistor Qs2' is formed between the peripheral circuit unit 1110 and the guard band 113. In this case, before carriers (electrons) straying from the peripheral circuit unit 1110 side to the memory cell array unit 1120 side attain the memory cell 1121 (MC11), they are caught by the n+ type diffusion layer 191 constituting the guard band 113 whereby the effective current amplification factor of the parasitic bipolar transistor Qs2 between the peripheral circuit unit 1110 and the memory cell array unit 1120 can be reduced. As a result, partial destruction of the storage information caused by use of the Bi-CMOS type logical circuit in the peripheral circuit can be securely prevented. Thereby the range of the usable source voltage may be large.

In FIG. 22, the first minority carrier absorbing area 113 is formed only between the word line decoder and driver unit 1111 and the memory array 1120, because the final output stage of the word line decoder and driver circuit 1111 is constituted by the Bi-CMOS composite switching circuit shown by $WD_1$ in FIG. 19, and the bipolar transistor at the output stage circuit is arranged near the memory cell 1120. Since the final output stage of the data line decoder and selective switch unit (column switch) 1112, is not the Bi-CMOS composite switching circuit, the guard band 113 is not installed. However, if necessary, the guard band 113 may be preferably formed in ring shape so as to surround the memory arrays 1120, 1120, 1120, 1120 respectively.

Figure 23:
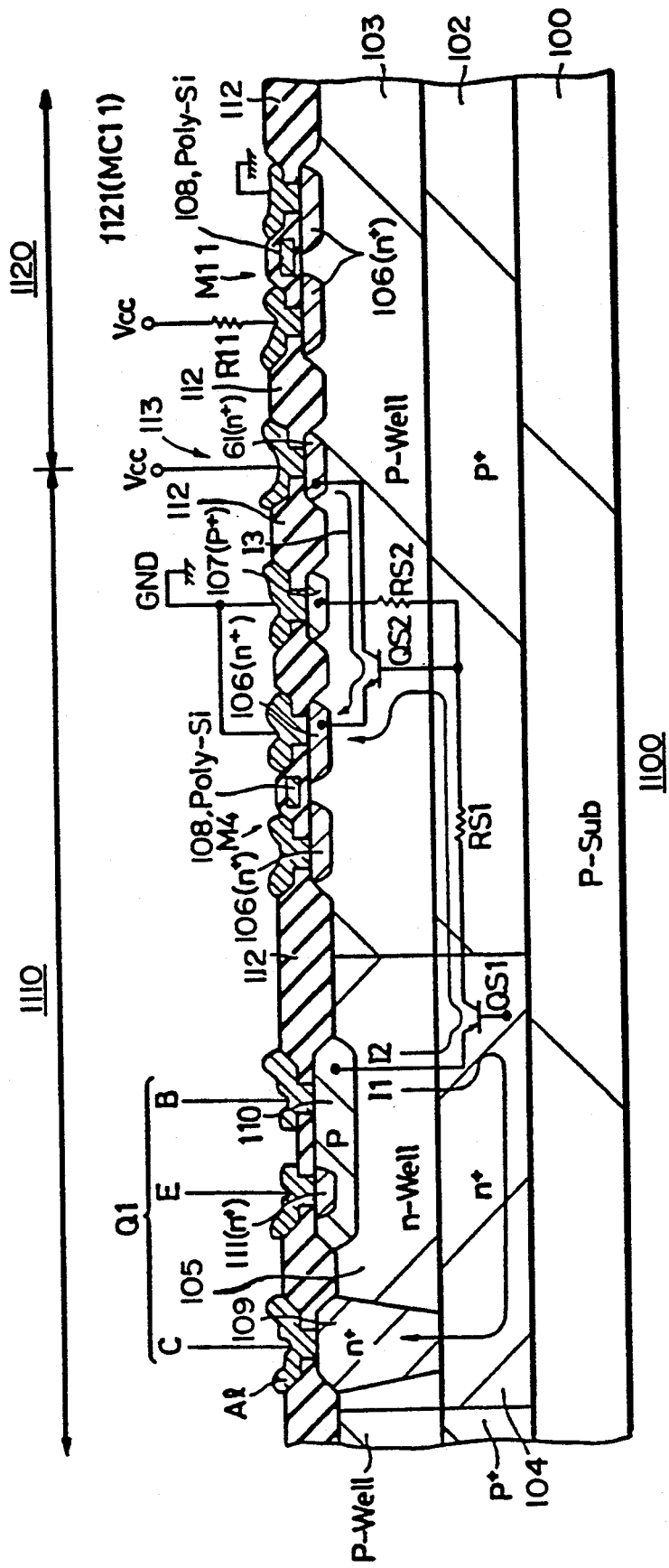
FIG. 23 is a sectional view of a modification of the first embodiment of this second aspect of the invention, where first minority carrier absorbing area 113 (161) is formed simultaneously to source/drain layer of NMOS-FET.

FIG. 23 shows a modification of the embodiment.

As shown in FIG. 23, the guard band 113 may be the n+ type diffusion layer 161 formed simultaneously with the n+ type source·drain diffusion layer 106. Also in this case, the n+ type diffusion layer 161 is connected to the source potential Vcc, whereby similar effect to that of the above embodiment can be obtained. The guard band 113 in FIG. 14 may be formed simultaneously with the collector diffusion layer 109 of the bipolar transistor $Q_1$. In this construction, the process can be simplified.

EMBODIMENT 2

A second embodiment of this second aspect of the invention will now be described referring to FIG. 24.

Figure 24:
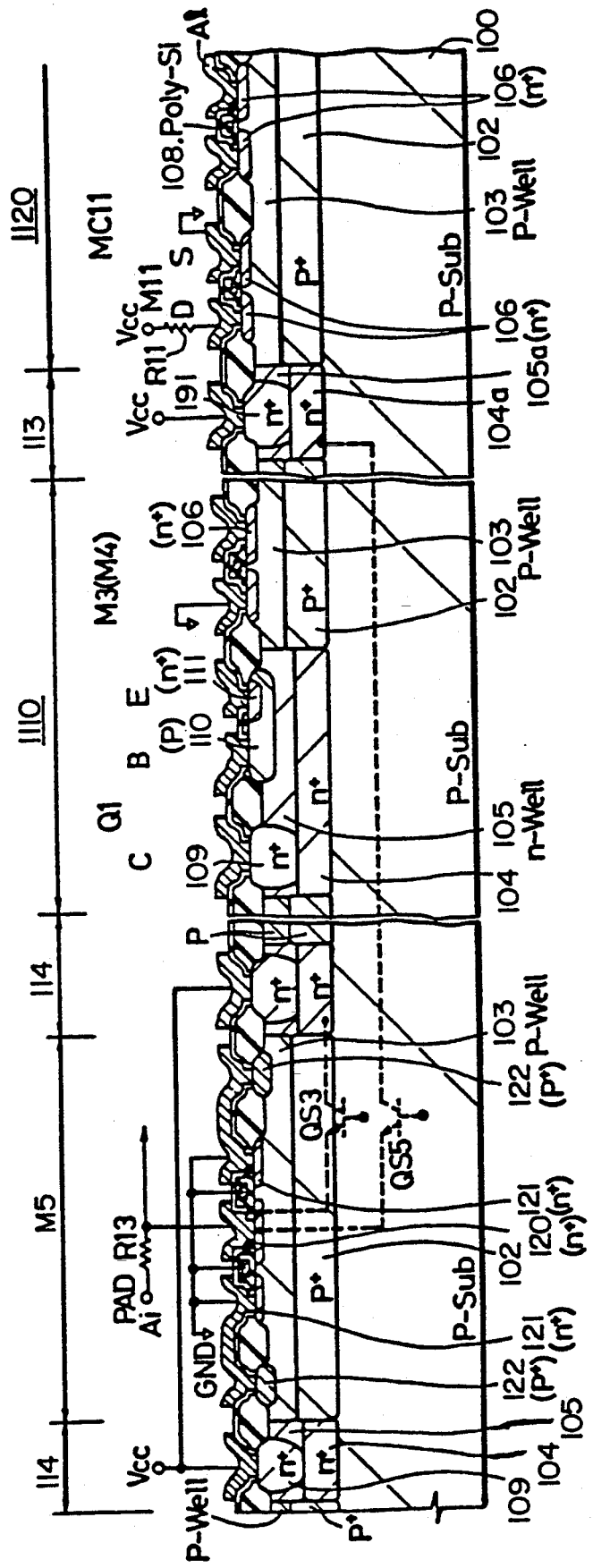
FIG. 24 is a device sectional view of a second embodiment of this second aspect of the invention, illustrating a second minority carrier absorbing area 114 formed to surround input protective element M105 and first minority carrier absorbing area 113 formed between peripheral circuit 1110 and memory array 1120.

FIG. 24 is a device sectional view of the input protective element M5 disposed near the input pad, the peripheral circuit unit 1110 including the Bi-CMOS composite switching circuit, and the memory array 1120 including the memory cell. FIG. 24 illustrates prevention of information destruction in the memory cell when a signal of negative potential is applied to the input pad PAD. FIG. 24 shows structure where the input protective element M5 show in FIG. 18 is added to the left of FIG. 21.

A feature of the second embodiment is in that the first minority carrier absorbing area 113 and the second minority carrier absorbing area 114 are formed. As a result, a signal of negative potential is inputted to the input pad PAD, and the potential of the drain n+ type layer 120 of the input protective element M5 becomes lower than the potential of the p type area 100, 102, 103. Even if the drain 120 and the p type areas 100, 102, 103 become in the forward bias state, the first and second minority carrier absorbing areas 113, 114 exist between the drain n+ type layer 120 and the drain n+ type layer 106 of the MOSFET 11 of the memory cell MC11 with drain D at high potential (refer to FIG. 18). Since the first minority carrier absorbing area 113 exists, the parasitic transistor Qs4 using the drain n+ type layer 106 shown in FIG. 18 as collector is not generated. In place of this, the parasitic npn bipolar transistor Qs5 using the n+ type buried layer 104a connected to a definite potential such as Vcc potential, the n type well layer 105a, the electrode drawing layer 191 as collector, the P type areas 100,102,103 as base, and the drain n type area 120 of the input protective element M5 as emitter is generated, and electrons as the minority carriers injected from the drain area 120 of the input protective element M5 to the p type areas 100,102,103 are caught by the parasitic transistor Qs3 shown in FIG. 18 and the parasitic transistor Qs5. As a result, the destruction of information in the memory cell MC11 can be prevented. Moreover, since the first minority carrier absorbing area (guard band) 113 exists between the peripheral circuit unit 1110 including the switching circuit as composite circuit of the bipolar transistor $Q_1$ and the MOS- FET M4, and the memory array 1120 including the memory cell MC11 disposed near the peripheral circuit unit 1110, destruction of the memory cell information caused by saturation of the bipolar transistor $Q_1$ shown in the embodiment 1 can be also prevented.

EMBODIMENT 3

FIG. 25 is a device sectional view illustrating a third embodiment of this second aspect of the invention, and shows corresponding parts to the device sectional view shown in FIG. 24.

A difference of FIG. 25 from FIG. 24 is in that the n type buried layer 104b as a second buried layer is formed under the p type well layer 102 with the input protective element M5 formed thereon, and contacted with the second minority carrier absorbing area 114. Since the second minority carrier absorbing area (guard ring) is formed in ring shape so as to surround the input protective element M5, the p type well layer 103 with the input protective element M5 formed thereon is independent electrically of the p type substrate 100. Consequently, even if the drain 120 of the input protective element M5 acquires a negative potential due to the static electricity, ions injected from the drain into the p type well layer 103 can be securely absorbed in the n+ type buried layer 102a with Vcc potential and the second minority carrier absorbing area 114. As a result, Qs4 among the parasitic transistors Qs3, Qs4 caused by the input protective element M5 shown in FIG. 18 is not at all generated and therefore the destruction of the memory cell information caused by the input protective element M5 can be prevented. Since the n+ type buried layer 104a can be formed simultaneously with other n+ type buried layers, the impurity diffusion process is not increased.

FIG. 26 shows a modification of FIG. 25, and more specifically shows another forming example of the type buried layer 104b in FIG. 25.

As seen from FIG. 26, a feature of the modification is in that the n type area 104c as a second buried layer is newly formed under the p type buried layer 102 so that the p type well 103 with the input protective element M5 formed thereon is made independent electrically of the p type substrate 100, and the n type area 104c is formed in a ring shape so as to surround the input protective element M5 and connect electrically to the second minority carrier absorbing area 114 connected to the Vcc potential. Consequently, the modification has similar effect to that described in FIG. 25, and further has advantages in that the device manufacturing process after forming the n+ type buried layer 104c is not different from the Bi-CMOS manufacturing process developed by the assignee of the present invention.

FIG. 27 shows another modification of FIG. 25, FIG. 26. A feature of the modification is that the n type area 104d as first buried layer connected to the first minority carrier absorbing area 113 is provided under the p type well 103, with the memory cell 1121 formed thereon, and the p type buried layer 102. In the case, the first minority carrier absorbing area 113 may be preferably formed in a ring shape so as to surround the memory array 1120. Because the potential of the p type areas 102, 103 with the memory cell 1121 formed thereon, and the potential of the p type substrate 100 (ground potential), can be separated using the first minority carrier absorbing area 113 formed in a ring shape and the n type area 104d, consequently, any of the parasitic transistors Qs2, Qs4 shown in FIG. 16, FIG. 18 is not formed and therefore the destruction of the memory cell information caused by saturation of the bipolar transistor $Q_1$ contained in the peripheral circuit unit 1110 or the negative potential input to the input protective element M5 can be prevented.

Further, this structure has the effect of preventing problems due to α-ray irradiation. If the α-ray is irradiated, an electron positive hole pair is generated in the substrate. The drain 106 of the MOSFET M11 of the memory call MC11 acquires a high potential, and when the information storing state is considered the electrons generated in the substrate are attracted by the drain of high potential, whereby the potential of the drain is reduced and the destruction of information in the memory cell is generated. In the device structure shown in FIG. 24, however, since the n type region 104d connected to the Vcc potential exists between the p type well 102 with the memory cell 1121 formed thereon and the p type substrate 100, the electron of the electron-positive hole pair formed by the α-ray irradiation is absorbed by the n type area 104d and therefore the destruction of the memory cell information can be prevented. Accordingly, reliability of the memory to the α-ray is improved.

As another constitution, adoption of both the n type buried layer 104c in FIG. 26 and the n type buried layer 104d in FIG. 27 is possible. An advantage of this case is in that, before forming the n type buried layer 104, impurity ions such as phosphorus to form the n type buried layers 104c, 104d are ion-implanted into the p type substrate 100 through the surface oxide film existing in a part of the n type buried layer forming portion. And then the nitride film is formed on the p type buried layer 102 forming portion (within the n type buried layer 104c, 104d forming portion), and using the nitride film as an impurity introducing mask antimony is introduced in the substrate 100 and the n type buried layer 104 is formed. And then the p type buried layer is formed as above described.

Figure 28A:
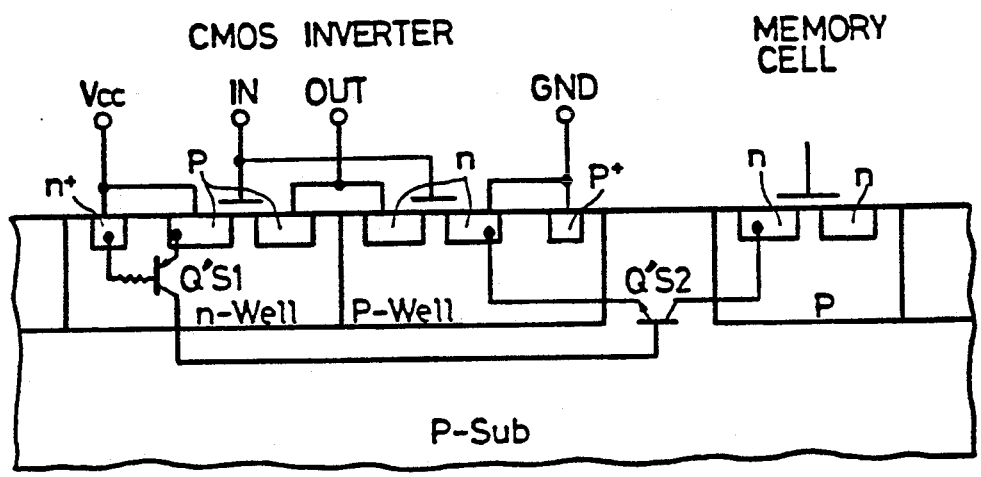
FIGS. 28(a) and (b) are device sectional views of a CMOS memory in an applied state of the invention.
Figure 28B:
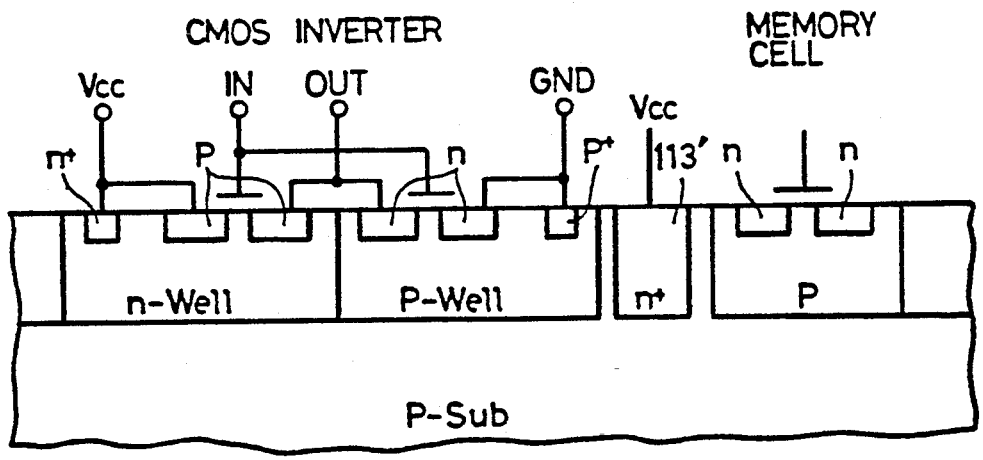

Although the second aspect of the invention has been specifically described on the basis of the embodiments, the second aspect is not restricted by the embodiments but various modifications without departing from the spirit of this aspect of the invention may be made. For example, the guard band 113 may be constituted by a groove or a separation diffusion layer. Furthermore, the invention may be applied not only to the Bi-CMOS-RAM but also to the MOS memory. For example, in order to prevent the mutual interference between the CMOS inverter and the memory cell as shown in FIG. 28(a), the guard band 13' shown in FIG. 15(b) may be provided.

The invention by the inventors has been described in the case of application to the technique of the Bi-CMOS type static RAM being the application field as the background of the invention. However, the invention is not restricted to this field but can be applied to the technique of the dynamic type RAM by the Bi-CMOS technique, for example.

Effects of this second aspect of the invention will now be described as follows:

(1) A first minority carrier absorbing area connected to definite potential such as Vcc is formed between a memory cell and switching circuit including npn bipolar transistor and NMOSFET, thereby in place of a parasitic bipolar transistor using a drain with high potential of a MOSFET of a flip-flop type memory cell as collector, p type substrate as base and source of the NMOSFET of the switching circuit as emitter, a new parasitic bipolar transistor using the first minority carrier absorbing area s collector and having base and emitter in similar constitution to the above-mentioned parasitic transistor is formed. Consequently, a positive hole is injected into the p-type substrate by saturation of the npn bipolar transistor in the switching circuit, and the newly formed parasitic bipolar transistor with short base width is rendered on, whereby only electrons as the minority carriers are absorbed by the first minority carrier absorbing area but the parasitic bipolar transistor with long base width using the drain of the MOSFET of the memory cell as collector is difficult to be rendered on. As a result, even if the Bi-CMOS composite switching circuit constituted by a composite circuit of the bipolar transistor and the MOSFET is disposed near the memory array, the parasitic bipolar transistor using the drain of the MOSFET of the memory cell as collector is prevented from being rendered on, whereby destruction of the information stored in the memory can be prevented.

(2) Since destruction of the information stored in the memory cell can be prevented according to item (1), reliability of the memory can be improved.

(3) Since the first impurity introduced to form the first minority carrier absorbing area can be introduced in the same process as that of the collector electrode drawing layer of the bipolar transistor, simplification of the process can be attained.

(4) A second carrier absorbing area formed to surround the input protective element and the first carrier absorbing layer is provided, whereby, among a plurality of parasitic bipolar transistors generated by undesirable potential applied to the input of the input protective element, generation of a parasitic bipolar transistor using the n type drain with high potential of the MOSFET in the memory cell as collector, the p type area as base and the n type drain of the input protective element as emitter can be prevented. In place of this, a new parasitic bipolar transistor using the second carrier absorbing area as collector and having base and emitter in similar constitution to the abovementioned parasitic bipolar transistor is generated. Consequently, generation of the parasitic bipolar transistor using the n type drain of the memory cell as an emitter can be prevented, whereby destruction of the information stored in the memory cell can be prevented.

(5) Since destruction of the information stored in the memory cell can be prevented according to item (4), reliability of the memory regarding the input voltage can be improved.

The details of the third aspect of the present invention will be described in conjunction with embodiments.

EMBODIMENT 4

Figure 30:
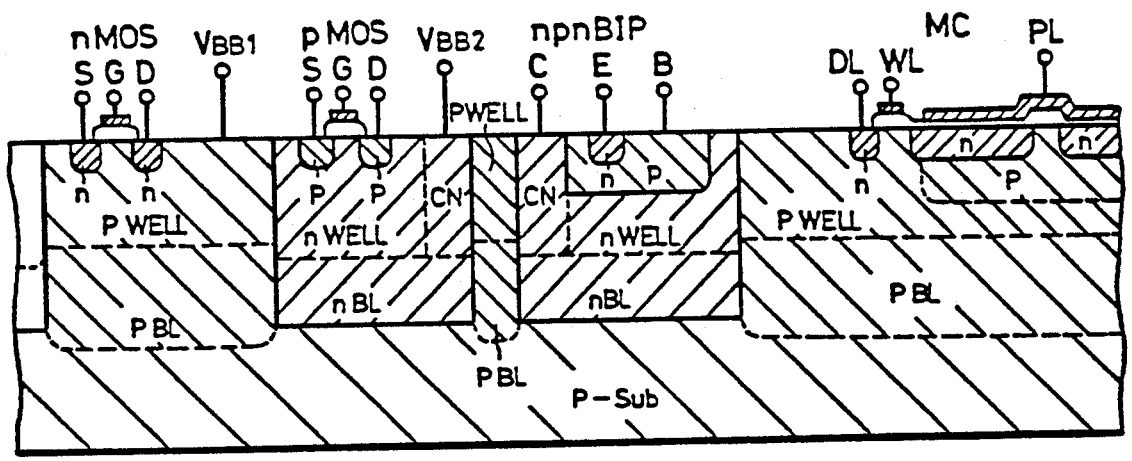
FIG. 30 is a sectional view showing a first embodiment of a third aspect of the present invention.

FIG. 30 shows one of the basic embodiments of the third aspect of the present invention, in which the BiCMOS system is applied to a dynamic RAM (DRAM) employing a 1-transistor type cell as a memory cell MC.

In the figure, the sectional structures of nMOS, pMOS and npnBIP transistors and the memory cell MC are illustrated. The information of the memory cell MC is read out to a data line DL or rewritten therein from the data line in such a way that a storage capacitance is formed between n-type diffusion layers and a plate (PL) and between the n-type diffusion layers and a p-type diffusion layer, and that charges stored in the storage capacitance are controlled by a gate WL to which a word line signal is applied. Besides, in the memory cell MC shown in the figure, the p-type diffusion layer is disposed underneath the n-type diffusion layers for storing the charges. This p-type diffusion layer serves to increase the storage capacitance, and also to shield the capacitor portion from minority carriers attributed to radiant rays such as alpha particles entering a substrate (to function as a barrier to the minority carriers), thereby to reduce a soft error rate ascribable to the entry of the radiant rays. Such a structure is detailed as the HiC type memory cell in "Technical Digest of International Electron Device Meeting," 1977, pp. 287-290, etc. Besides, the phenomenon of soft errors is detailed in "IEEE Transaction on Electron Device," Vol. ED-26, No. 1, Jan., 1979, pp. 2-9, etc.

As indicated in the figure, the silicon substrate used is a p-type substrate p-Sub. This is intended to employ npn BIP transistors of high performance and to isolate them efficiently. The impurity concentration of the substrate is usually selected on the order of $10^{14}$–$10^{16}$ (cm$^{-3}$) in consideration of the collector-substrate capacitance of the BIP transistor, etc. Symbols nBL and pBL denote buried layers of comparatively high concentrations, which reduce the collector resistance of the BIP transistor so as to realize high performance and simultaneously render the resistance values of well regions nWELL and pWELL smaller so as to prevent the occurrence of a latch-up phenomenon. The latch-up phenomenon is stated in "Technical Digest of International Electron Device Meeting," 1982, pp. 454-477, etc. The impurity concentrations of the buried layers nBL and pBL are respectively selected on the orders of $10^{18}$–$10^{20}$ (cm$^{-3}$) and $10^{16}$–$10^{18}$ (cm$^{-3}$). The buried layers can be realized by, for example, a method in which they are formed in the substrate p-Sub by diffusion beforehand, followed by the epitaxial growth of silicon and by the formation of the wells pWELL and nWELL, etc., or a method in which they are formed by the implantation of ions at comparatively high energy levels into the substrate p-Sub from the front surface thereof, and the details will be stated later. Either or both of these buried layers is/are omitted for some purposes. Symbol CN denotes a heavily-doped layer for lowering the resistance between the collector node C or a node $V_{BB2}$ and the buried layer nBL. Symbols nWELL and pWELL denote regions for forming the pMOS and nMOS transistors, respectively. For this example the collector layer of the BIP transistor is made of nWELL and nBL.

In the construction thus far described, according to this aspect of the present invention, a voltage which is higher or lower than the operating voltage range of the circuitry is applied as at least one of voltages for isolating the individual devices, $V_{BB1}$ (this voltage is generally called a "substrate voltage" as it is supplied to the substrate through the regions pWELL and pBL) and $V_{BB2}$ (generally called a "well voltage"). Whether such a voltage or voltages is/are applied as either or both of the isolation voltages, may be selected according to purposes. By way of example, under the condition that the circuitry operates between 0 V and $V_{CC}$ (for example, 5 V), a negative voltage below 0 V is applied as the substrate voltage $V_{BB1}$ and the voltage $V_{CC}$ is applied as the well voltage $V_{BB2}$. Thus, the value of the substrate voltage $V_{BB1}$ is set so that the substrate and the n-type diffusion layer within the region pWELL, for example, may not be forward-biased even when a minus voltage is applied from inside or outside the semiconductor device to the n-type diffusion layer by any cause, thereby making it possible to perfectly solve the phenomenon in which the minority carriers are injected into the substrate and incur the malfunction of the circuitry as the problem of the prior art. This effect is especially remarkable in the DRAM of the type storing information in the form of charges as shown in FIG. 30, but it is a matter of course that marked effects are obtained also in other devices such as a logic LSI, SRAM and ROM. Although, in the above, the well voltage $V_{BB2}$ has been set at the supply voltage $V_{CC}$, a similar effect can be obtained even when a voltage higher than the supply voltage $V_{CC}$ is applied as the well voltage $V_{BB2}$ according to purposes. Moreover, according to the present invention, the well regions pWELL and nWELL and the diffusion layers lying in contact with them are not forward-biased, so that the occurrence of the latch-up phenomenon can be prevented. Furthermore, the reduction of junction capacitances becomes possible.

Although the example employing the p-type substrate has been taken in the present embodiment, an n-type substrate may well be employed in, e.g., a case of using a p-n-p BIP transistor. It is needless to say that, on that occasion, the signs of applied voltages ought to made opposite. In addition, although the HiC type cell has been illustrated as the memory cell, the embodiment as left intact is also applicable to cases of employing various planar type or vertical type memory cells (such as CCC and STC cells) described in "IEEE PROC.," Vol. 130, pt. I, No. 3, JUNE 1983, pp. 127–135; "1984, 1985 International Solid-State Circuit Conference," Digest of Technical Papers; etc. It is as stated before that the DRAM is not restrictive, but that the embodiment as left intact is also applicable to other general LSIs such as SRMAs, ROMs and logic LSIs. Besides, although the voltage higher or lower than the operating voltage range of the circuitry is required in the present invention, it can be generated within the semiconductor device by any of methods described in Japanese Utility Model Registration Application No. 54-82150; or 1976 ISSCC Digest of Technical Papers," pp. 138–139; etc., and hence, it can also be realized without externally feeding a dedicated voltage. The substrate voltage $V_{BB1}$ may well be applied from the rear surface of the substrate.

The embodiment thus far described has referred to the method in which the voltage is uniformly applied to the substrate p-Sub or the well region nWELL within the chip, thereby to solve the problem of the prior art. Next, there will be elucidated a case where unequal isolation voltages are applied in conformity with the purposes of circuit blocks within a chip. For example, an input circuit block as to which the injection of minority carriers is problematic or a circuit block which needs to reduce its junction capacitance has the isolation voltage higher or lower than the operating voltage range of the circuitry applied thereto as explained in connection with FIG. 30. On the other hand, in the block of the memory cell in FIG. 30, it is desired that the concentration of the p-type impurity layer forming the storage capacitance be heightened to increase the storage capacitance and also to augment the shield effect against the minority carriers created by the entry of alpha particles. It is also desired that devices be microminiaturized to attain a higher density and a higher speed. In these blocks, the breakdown voltages of the devices become lower. Therefore, the highest or lowest voltage within the operating voltage range of circuitry is applied as the isolation voltage of such a block likewise to the prior art. There will be described embodiments on a method which applies any desired voltages according to purposes in this manner, and a semiconductor structure which makes the method possible.

The techniques to be discussed hereinafter can be applied without any change, not only to LSIs of the BiCMOS system, but also to those of the conventional pMOS, nMOS or CMOS system. Therefore, various examples of applications shall be explained without sticking to the BiCMOS system.

EMBODIMENT 5

Figure 31:
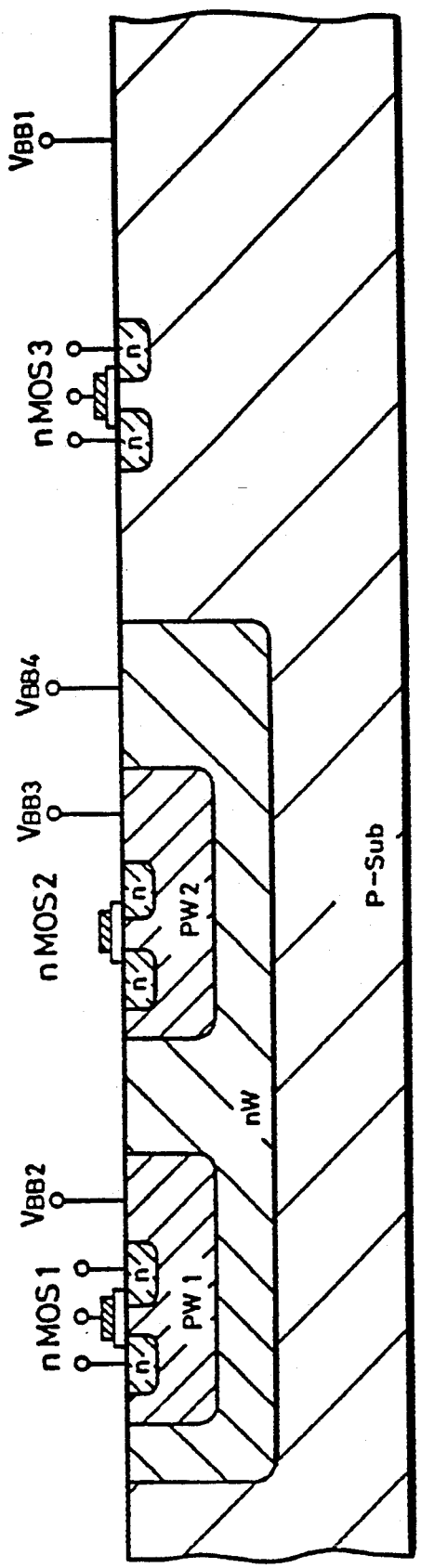
FIG. 31 is a sectional view showing a second embodiment of this third aspect of the present invention.

FIG. 31 illustrates the application of the above measure to an integrated circuit of nMOS transistors. A construction in the figure is such that a p-type substrate (p-Sub) is formed therein with an n-well layer NW, in which p-well layers PW$_1$ and PW$_2$ are further formed. The nMOS transistors formed in the two p-wells and the substrate p-Sub are respectively denoted by symbols nMOS1, nMOS2 and nMOS3. In this structure, voltages $V_{BB1}$, $V_{BB2}$ and $V_{BB3}$ independent of one another can be applied to the isolation layers of the three sorts of nMOS transistors, and they can be selected at suitable voltages according to circuit uses.

On the other hand, the supply voltage $V_{CC}$ or a voltage which is at least higher than both the voltages $V_{BB2}$ and $V_{BB3}$ is applied as $V_{BB4}$ to the n-well layer NW. Although the single nMOS transistor has been shown in FIG. 31, one well usually has a plurality of nMOS transistors in each of three isolation layers.

In addition, although two p-wells and the single n-well have been shown in FIG. 31, this embodiment is also applicable to a combination wherein a plurality of n-wells are provided and wherein one or more p-wells are designed in each of the n-wells. It is also possible to construct all the nMOS transistors in a p-well. Further, the present invention can be readily applied to a pMOS integrated circuit merely by altering the conductivity types of the substrate, wells and MOS transistors and reversing all the potential relations. The voltage $V_{BB1}$ may be applied to the substrate either from the front surface or from the rear surface thereof.

EMBODIMENT 6

Figure 32:
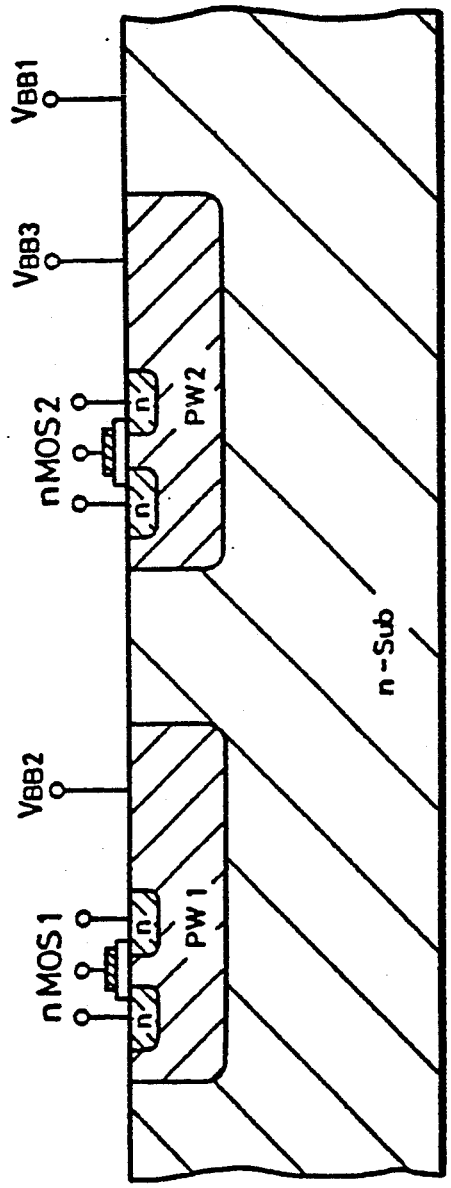
FIG. 32 is a sectional view showing a third embodiment of this third aspect of the present invention.

FIG. 32 shows an embodiment in which the third aspect of the present invention is applied to an nMOS integrated circuit employing an n-type substrate. Referring to the figure, two p-wells (PW$_1$, PW$_2$) are formed in the n-type substrate (n-Sub), and nMOS transistors are formed in the respective p-wells. In the illustrated construction, voltages $V_{BB2}$ and $V_{BB3}$ unequal to each other are applied to the respective wells PW$_1$ and PW$_2$ by applying the present invention. As these voltages $V_{BB2}$ and $V_{BB3}$, the optimum voltages can be applied depending upon the circuit portions. By way of example, the ground potential GND can be applied as the voltage $V_{BB3}$, and a still lower voltage of $-3$ V as the voltage $V_{BB2}$. A voltage $V_{BB1}$ to be applied to the substrate n-Sub may be the supply voltage $V_{CC}$, or a voltage higher than both the voltage $V_{BB2}$ and $V_{BB3}$.

Although only the two p-wells each including the single nMOS transistor therein have been shown in FIG. 32, the embodiment is readily applicable to the combination between any desired number of p-wells and any desired number of nMOS transistors. On this occasion, two or more voltage values as desired may be selected for the applied voltages of the plurality of p-wells in conformity with uses. Besides, a pMOS integrated circuit can be fabricated by inverting the conductivity types of the substrate, the wells, sources and drains. At this time, positive voltages unequal to each other are applied as the voltages $V_{BB2}$ and $V_{BB3}$, and the voltage GND or a voltage lower than both the voltages $V_{BB2}$ and $V_{BB3}$ is applied as the voltage $V_{BB1}$.

EMBODIMENT 7

Figure 33:
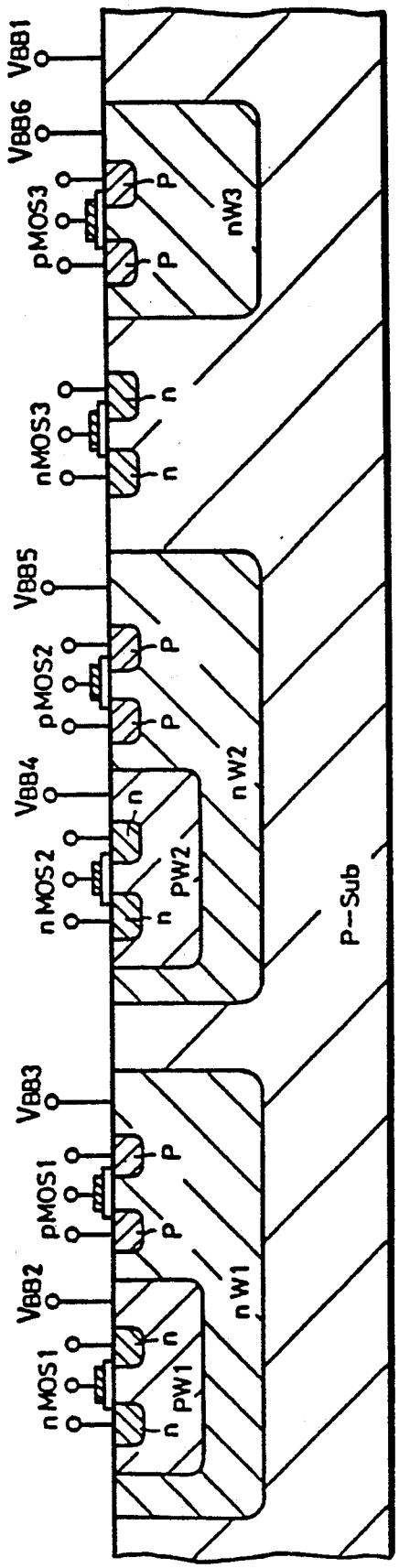
FIG. 33 is a sectional view showing an embodiment of a CMOS structure according to this third aspect of the present invention.

FIG. 33 illustrates an embodiment in which the present invention is applied to a CMOS (complementary MOS) structure. Referring to the figure, three n-wells ($NW_1$, $NW_2$, $NW_3$) are formed in a p-type substrate, and p-wells ($PW_1$, $PW_2$) are further formed in the respective n-wells $NW_1$ and $NW_2$. Thereafter, nMOS transistors (nMOS1, nMOS2, nMOS3) are respectively formed in the p-wells ($PW_1$, $PW_2$) and the substrate p-Sub. Besides, pMOS transistors (pMOS1, pMOS2, pMOS3) are respectively formed in the n-wells ($NW_1$, $NW_2$, $NW_3$). In this construction, voltages $V_{BB2}$, $V_{BB4}$ and $V_{BB1}$ are applied to the p-type isolation layers for the nMOS transistors. On the other hand, voltages $V_{BB3}$, $V_{BB5}$ and $V_{BB6}$ are applied to the n-type isolation layers for the pMOS transistors. As three voltages $V_{BB2}$, $V_{BB4}$ and $V_{BB1}$ or as three voltages $V_{BB3}$, $V_{BB5}$ and $V_{BB6}$, voltages of at least two values unequal to each other are applied according to circuits used. By way of example, voltages of GND (0 V) and −3 V are applied as the voltages $V_{BB2}$, $V_{BB4}$ and $V_{BB1}$, while voltages of $V_{CC}$ (+5 V) and $V_{CC}+\alpha$ (+7 V) are applied as the voltages $V_{BB3}$, $V_{BB5}$ and $V_{BB6}$. In this way, the voltages as desired can be applied to the individual isolation layers of the nMOS and pMOS transistors. Although, in FIG. 33, only one MOS transistor has been shown in each of the wells, a plurality of MOS transistors may well be provided as are necessary. In addition, although the numbers of the wells are 3 as the n-wells and 2 as the p-wells in FIG. 33, they may be increased or decreased as are necessary. Further, it is to be understood that the present invention is also applicable to a construction wherein the polarities of the substrate and the wells are inverted. That is to say, p-wells are first formed in an n-type substrate and wherein n-wells are subsequently formed.

While the embodiments described above concern the construction employing only the MOS transistors, there will now be described examples in each of which the present invention is applied to an integrated circuit employing bipolar transistors or an integrated circuit having both bipolar and MOS transistors.

EMBODIMENT 8

FIG. 34 illustrates an embodiment in which the present invention is applied to an integrated circuit employing bipolar transistors. Referring to FIG. 34, three n-p-n bipolar transistors (npn1, npn2, npn3) and one p-n-p bipolar transistor (pnp1) are formed. In a conventional bipolar integrated circuit, a plurality of n-p-n transistors are constructed in a p-type substrate p-Sub likewise to the transistor npn3 in this figure and are fed with a common substrate voltage as a voltage $V_{BB1}$ from the front surface or rear surface of a chip. When the magnitude of the voltage $V_{BB1}$ is set at the lowest potential GND (0 V) in circuitry or at a still lower potential, the plurality of bipolar transistors can be isolated from one another. In the present invention, p-type isolation layers separated from the substrate p-Sub are further provided as indicated by symbols $PW_1$ and $PW_2$, and the n-p-n transistors (npn1, npn2) are formed therein. The p-layers have voltages $V_{BB2}$ and $V_{BB3}$ applied thereto. The values of the voltages $V_{BB2}$ and $V_{BB3}$ can be set independently of the voltage $V_{BB1}$. A voltage $V_{BB4}$ is applied to an n-type layer (nW) for isolating the substrate p-Sub and the p-layers. When a voltage $V_{BB4}$ (for example, equal to the supply voltage $V_{CC}$) is higher than the three voltages $V_{BB1}$, $V_{BB2}$ and $V_{BB3}$, the transistors npn1, npn2 and npn3 can be perfectly isolated from one another. The p-n-p transistor (pnp1) in the figure can be constructed by employing some of layers used for forming the transistors npn1 and npn2. When the conductivity types of all the layers including the substrate are reversed, unequal voltages can be applied to n-type isolation layers forming a plurality of p-n-p transistors.

EMBODIMENT 9

Next, there will be elucidated an example in which the present invention is applied to the so-called BiCMOS structure having both CMOS and bipolar transistors in a chip. FIG. 35 illustrates the embodiment in which nMOS transistors (nMOS1, nMOS2, nMOS3) and pMOS transistors (pMOS1, pMOS2) are formed in a p-type substrate p-Sub as in FIG. 33, and in which an n-p-n bipolar transistor (npn1) is further formed. As in the foregoing, voltages $V_{BB1}$, $V_{BB2}$ and $V_{BB3}$ can be independently set as the isolation voltages of the nMOS transistors. In addition, voltages $V_{BB4}$ and $V_{BB5}$ can be independently set as the isolation voltages of the pMOS transistors. The substrate voltage $V_{BB1}$ of the transistor nMOS3 is applied to the isolation region of the bipolar transistor, but this voltage $V_{BB1}$ can be set as an isolation voltage dedicated to the bipolar transistor int he absence of the transistor nMOS3. In addition, when a structure similar to that of the transistor npn1 in FIG. 34 is incorporated int he construction of FIG. 35 isolation voltages unequal to each other can be fed to the bipolar transistors. Besides, a p-n-p transistor can be formed as in FIG. 34. Also, when the conductivity types of the substrate, the wells, the sources and drains of the MOS transistors, and the collector, emitter and base of the bipolar transistor are all inverted, a p-n-p transistor and a CMOS structure can be constructed, and the plurality of isolation voltages of the present invention can be applied to such a construction.

EMBODIMENT 10

Figure 36:
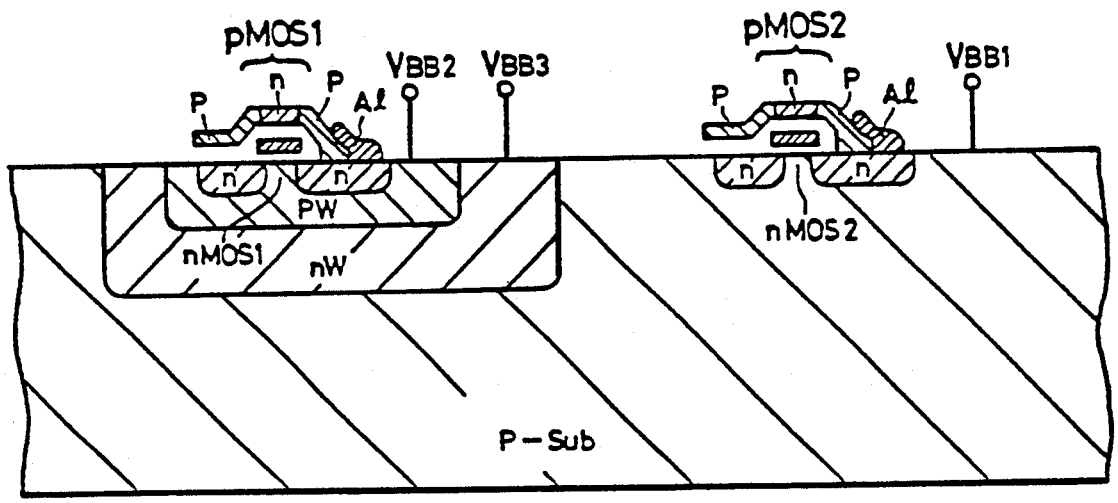
FIG. 36 is a sectional view showing an embodiment, according to this third aspect, of an SOI structure.

FIG. 36 shows an embodiment in which the present invention is applied to the nMOS portion of a stacked CMOS structure. The figure shows the example which is formed with nMOS transistors on the side of substrate, and with pMOS transistors on the substrate by the so-called SOI structure wherein polycrystalline Si is grown on an insulator film. By combining such a configuration with a p-well (pW) and an n-well (nW), independent voltages $V_{BB2}$ and $V_{BB1}$ can be applied to the respective isolation portions of the transistor nMOS1 formed in the p-well and the transistor nMOS2 formed in the substrate p-Sub. In addition, when the conductivity types of the substrate and the wells are rendered opposite, it is possible to form pMOS transistors on the substrate side and nMOS transistors on the polycrystalline Si side and to apply separate isolation voltages to the isolation portions of the pMOS transistors.

EMBODIMENT 11

Figure 37:
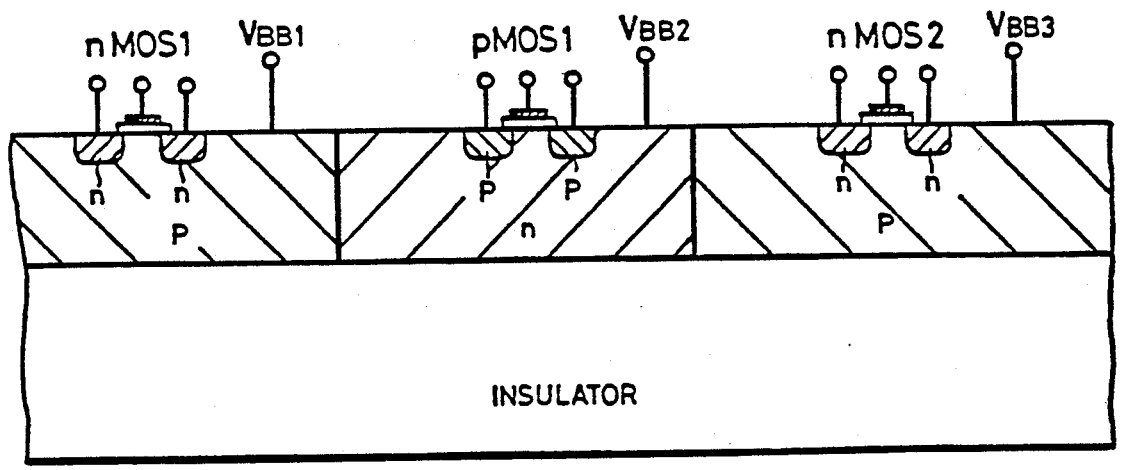
FIG. 37 is a sectional view showing an embodiment of an SOS structure in this third aspect of the present invention.

FIG. 37 illustrates an embodiment in which nMOS and pMOS transistors are constructed on an insulating substrate written as INSULATOR in the SOI (Silicon on Insulator) or SOS (Silicon on Sapphire) structure, and in which the present invention is applied to such a construction. On the insulating substrate, p-type Si (or n-type Si) is formed by crystal growth, whereupon an n-type (or p-type) impurity is introduced into the p-layer deeply enough to reach the substrate, thereby to isolate a plurality of p-type (or n-type) regions. The nMOS transistors are formed int he isolated p-type regions, and the pMOS transistor is formed in the n-type region. Voltages $V_{BB1}$ and $V_{BB3}$ are applied to the respective p-type regions in conformity with the uses of circuits, while a voltage $V_{BB2}$ is applied to the n-type region. The number of the p-type and n-type isolation regions in FIG. 37 can be selected as desired, and it is also possible to employ only either pMOS transistors or nMOS transistors.

EMBODIMENT 12

Thus far, the various structures for the substrate voltage isolation have been described with preference to FIG. 30 and FIGS. 31–37. Now, there will be described embodiments in which these structures are applied to semiconductor memories.

Figure 38:
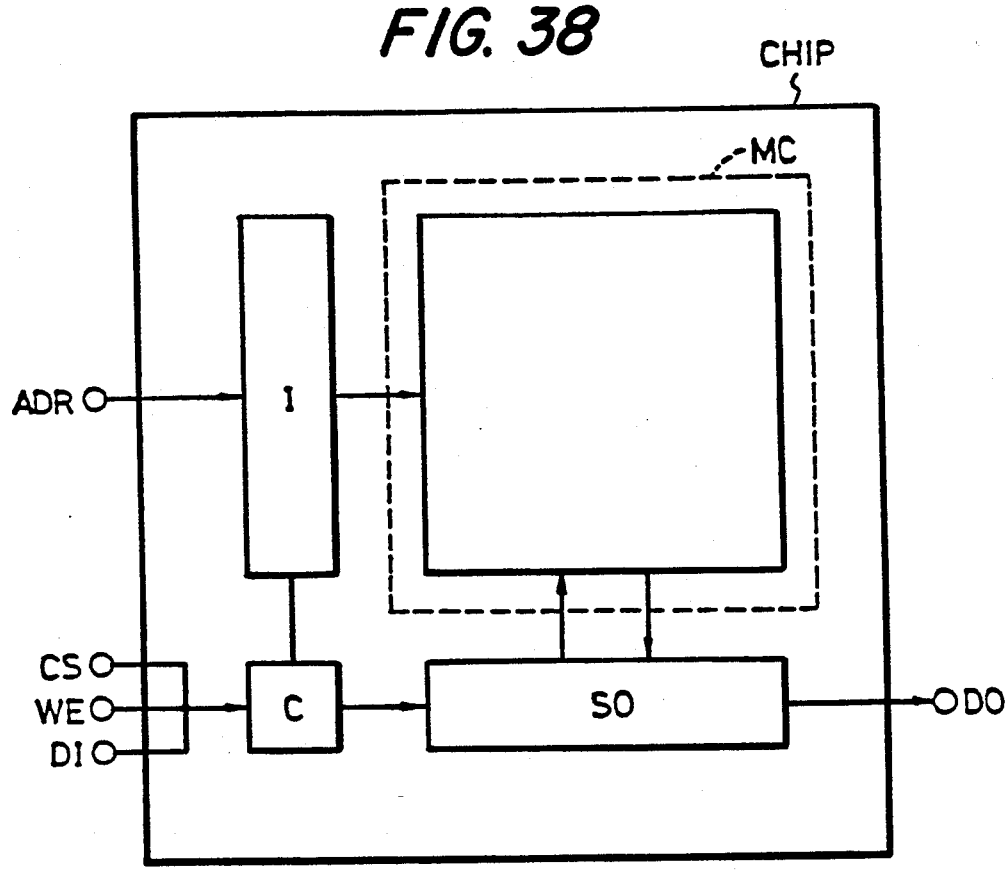
FIG. 38 is a block diagram of a memory.

FIG. 38 is a block diagram of any of general memories (including a dynamic RAM, a static RAM, a ROM, etc.). Symbol ADR denotes an address input, symbol CS a chip select input, symbol WE a write enable input, symbol DI a data input, and symbol DO a data output. The designations of these signals are mere examples, and other designations are sometimes used.

A block I indicates an address buffer as well as a decoder and a driver. A block C indicates a control circuit and a write circuit. A block MC indicates a memory cell array. A block SO indicates a sense circuit and an output circuit. One embodiment of the third aspect of the present invention consists in applying the different voltage to the memory cell array MC enclosed with a broken line or to the other portion.

Figure 39:
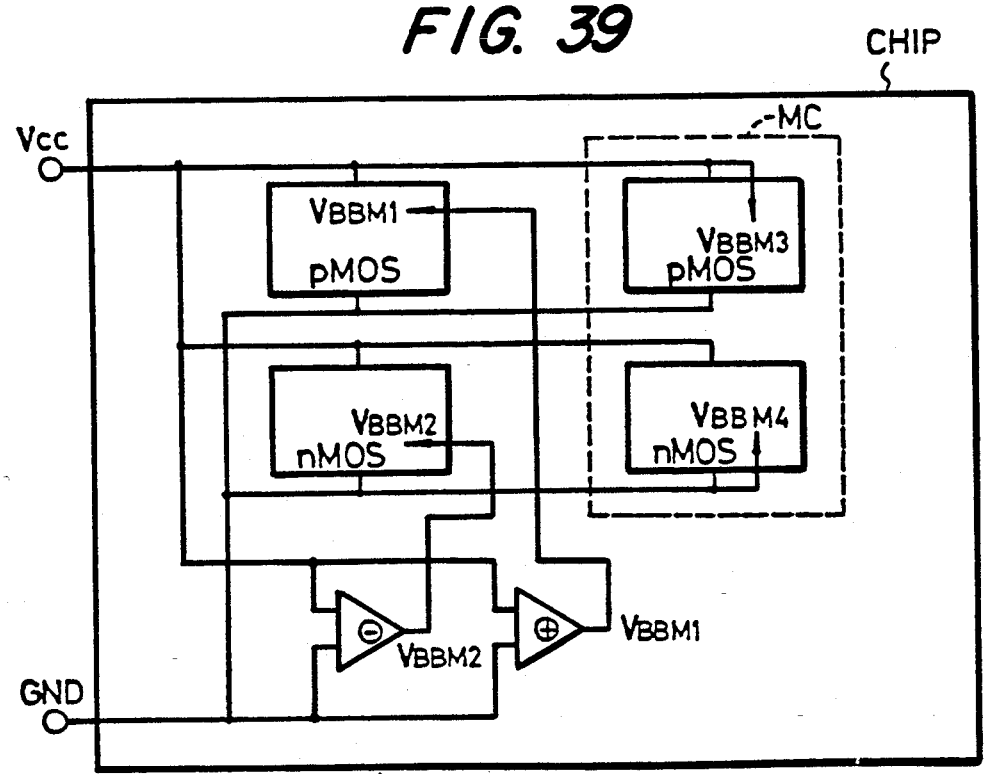
FIG. 39 is a diagram showing an embodiment for the application of a substrate isolation voltage to a memory.

Referring to FIG. 39, a chip which includes the two blocks isolated as in FIG. 38 has a built-in substrate bias voltage generator, and the two outputs $V_{BBM1}$ and $V_{BBM2}$ of the bias voltage generator are applied to the peripheral circuits other than the memory cell array, while a supply voltage $V_{CC}$ and the ground potential GND are applied to the memory cell array as $V_{BBM3}$ and $V_{BBM4}$ respectively. The circuit arrangement of the substrate bias voltage generator has already been disclosed in "1976 ISSCC," pp. 138–139 or Japanese Patent Application Laid-open No. 51-117584. In this construction, by way of example, the isolation region (n-well) of the pMOS transistor of the peripheral circuit is fed with the voltage $V_{BBM1}$ (+7 V) and the isolation region (p-well) of the nMOS transistor thereof with the voltage $V_{BBM2}$ (−3 V), while the n-well of the pMOS transistor of the cell array is fed with the voltage $V_{CC}$ and the p-well of the nMOS transistor thereof with 0 V. By supplying the voltage of large absolute values to the isolation regions of the input and output circuits in this manner, the memory becomes stable against the overshoots and undershoots of input and output signals, junction capacitances (the capacitances between the sources or drains of MOS transistors and a substrate, and the capacitances between the collectors of bipolar transistors and the substrate) can be reduced, and an impurity concentration profile less prone to soft errors can be selected for the cell array. By the way, the designations of isolation voltages for use in the following embodiments shall correspond to the symbols $V_{BBM1}$, $V_{BBM2}$, $V_{BBM3}$ and $V_{BBM4}$ in FIG. 39 in accordance with the roles thereof.

Figure 29:
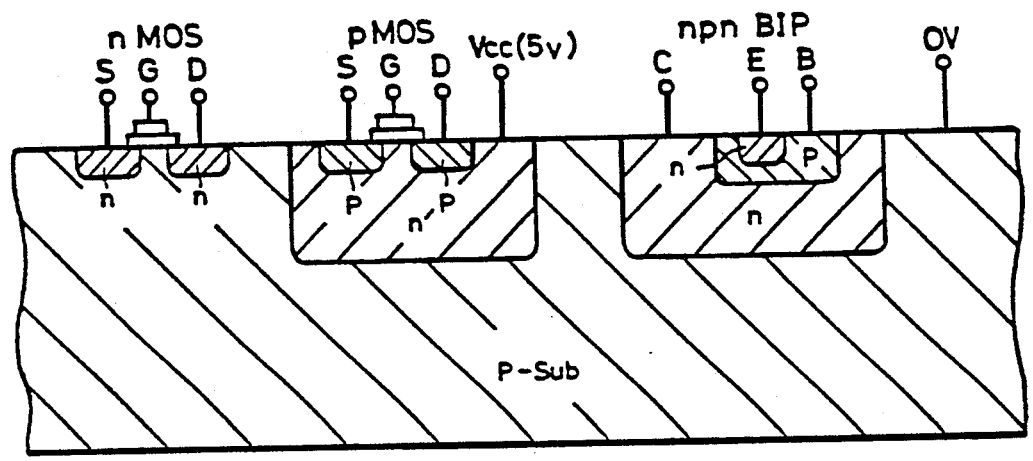
FIG. 29 is a sectional view showing a prior art.

Sectional views of embodiments of chips which are obtained for the embodiment of the chip setup in FIGS. 38 and 39 will be elucidated below. Each of them illustrates the sectional structure of the portion so the input circuit and dynamic memory cell of a MOS dynamic RAM in correspondence with the prior-art example in FIG. 29. Although the memory cell is the dynamic cell here, the present invention is similarly applicable to an MOS static memory cell and a bipolar static memory cell.

EMBODIMENT A

Figure 40:
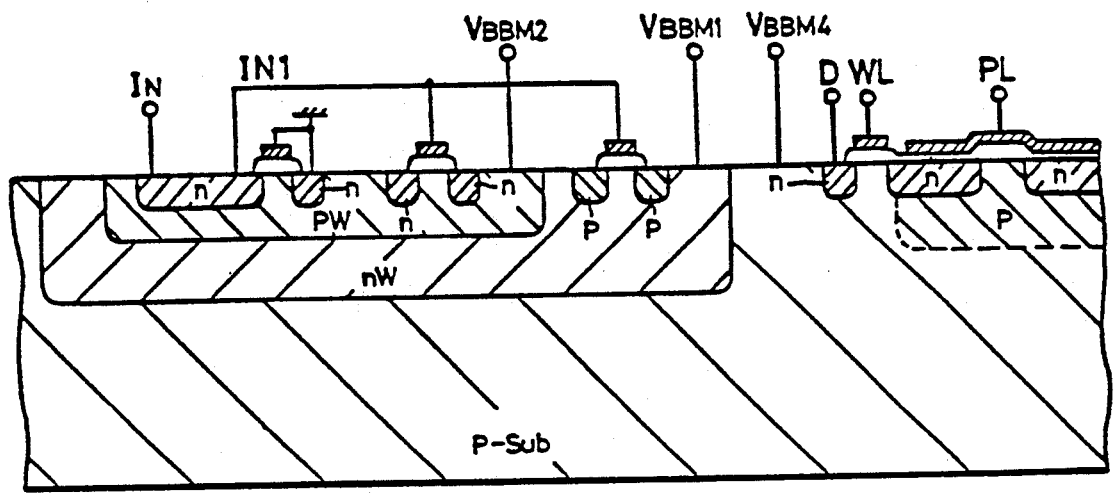
FIGS. 40-44 are sectional views each showing an embodiment of a MOS dynamic memory.

In an embodiment in FIG. 40, the nMOS transistors of an input protection circuit (an n-type diffused resistor and an nMOS diode) and an input circuit are formed in a p-well (pW), the pMOS transistor of the input circuit is formed in an n-well (nW), and a memory cell made of an nMOS transistor is formed in a p-type substrate p-Sub. In the present embodiment, the p-well of the input circuit and the substrate p-Sub are isolated. Therefore, the values of the isolation voltages $V_{BBM2}$ and $V_{BBM4}$ of the respective regions can be independently set. Accordingly by way of example, the voltage $V_{BBM2}$ can be selected at −3 V in order to satisfy the specifications of the input circuit, and the voltage $V_{BBM4}$ can be selected at 0 V from the viewpoint of the soft-error immunity of the memory cell. A broken line under the memory cell indicates a p-type high impurity concentration layer. In this way, the disadvantage of the prior-art example elucidated in FIG. 29 can be prevented to provide a stable dynamic memory.

EMBODIMENT B

Figure 41:
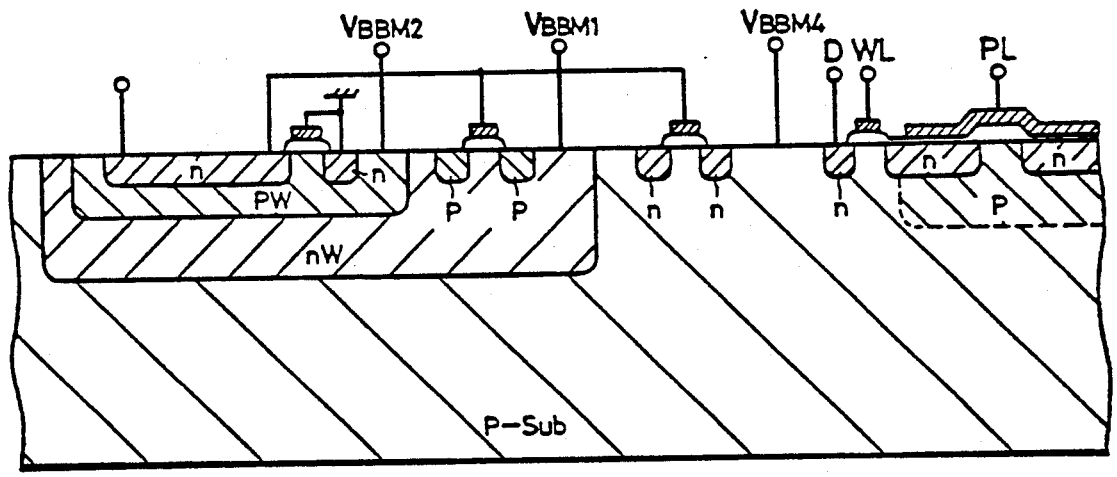

In FIG. 41, only the n-type diffused resistor and nMOS diode of an input protection circuit are provided in a p-well, and the nMOS transistors of any other peripheral circuits are formed in a p-type substrate p-Sub likewise to a memory cell. Besides, a pMOS transistor can be formed in an n-well. A voltage $V_{BBM2}$ (for example, −3 V) is applied to the p-well under the n-type diffused resistor and nMOS diode which are input protection devices, while a voltage $V_{BBM4}$ (for example, 0 V) is applied to the substrate p-Sub of the nMOS transistors of the input circuit and the memory cell. A p-type high concentration layer is provided under the memory cell as in FIG. 40. A voltage $V_{BBM1}$ is applied to the n-well. The present embodiment is advantageous over the embodiment of FIG. 40 in that, since only the input protection devices are provided in the well, the layout is simplified, and that, since the nMOS transistors other than the input protection diode are formed under the same concentration condition over the cell and the peripheral circuit, the control of threshold voltages $V_{TH}$ is easy.

EMBODIMENT C

Figure 42:
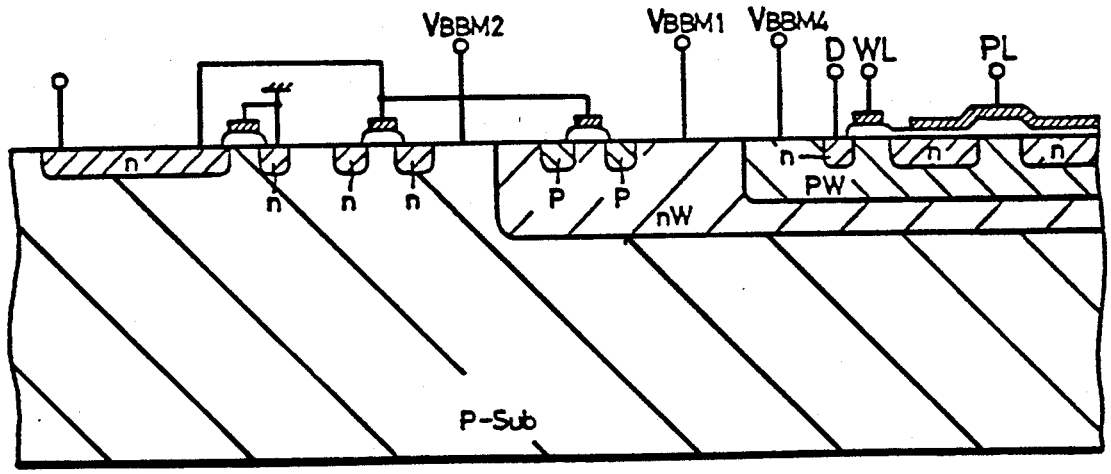

FIG. 42 illustrates an embodiment in which a memory cell is formed in a p-well (pW), while the nMOS transistors of an input protection circuit and any other peripheral circuit are formed in a p-type substrate p-Sub. In the present embodiment, the p-well of comparatively high concentration is provided under the memory cell, and it acts as the substitute of the high concentration layer indicated by the broken line in FIG. 40 or 41.

EMBODIMENT D

Figure 43:
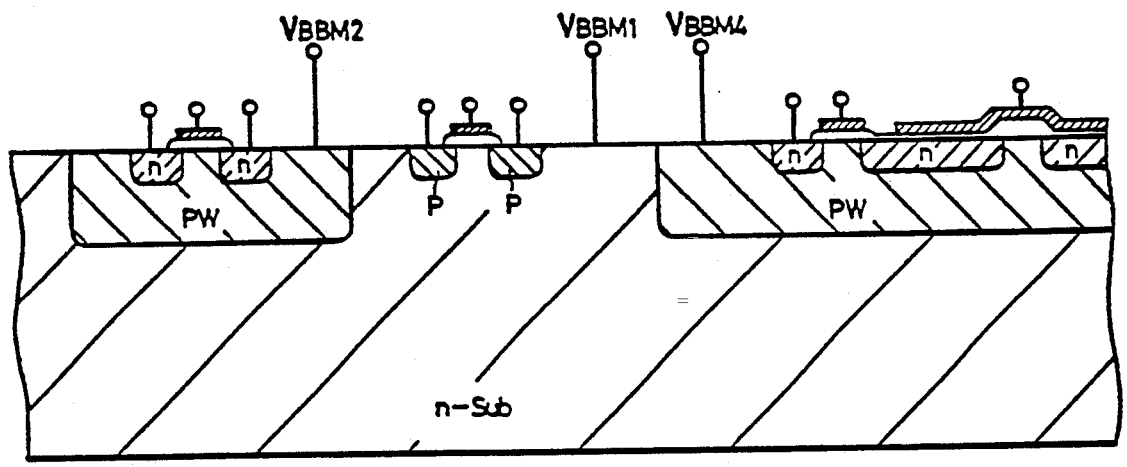

FIG. 43 illustrates as embodiment which employs an n-type layer as a substrate and in which a peripheral circuit and a memory cell are formed in p-wells. Whereas the embodiments of FIGS. 40–42 have the double well structure, a well configuration of single layer suffices in the present embodiment. A voltage $V_{BBM2}$ (for example, $-3$ V) is applied to the p-well of the nMOS transistor of the peripheral circuit, while a voltage $V_{BBM4}$ (for example, 0 V) is applied to the p-well of the nMOS transistor of the memory cell. In addition, a voltage $V_{BBM1}$ (for example, a supply voltage $V_{CC}$) is applied to the substrate n-Sub. In the p-well to which the voltage $V_{BBM2}$ is applied, only an input protection circuit may be formed, or peripheral circuits such as an address buffer may well be included.

EMBODIMENT E

Figure 44:
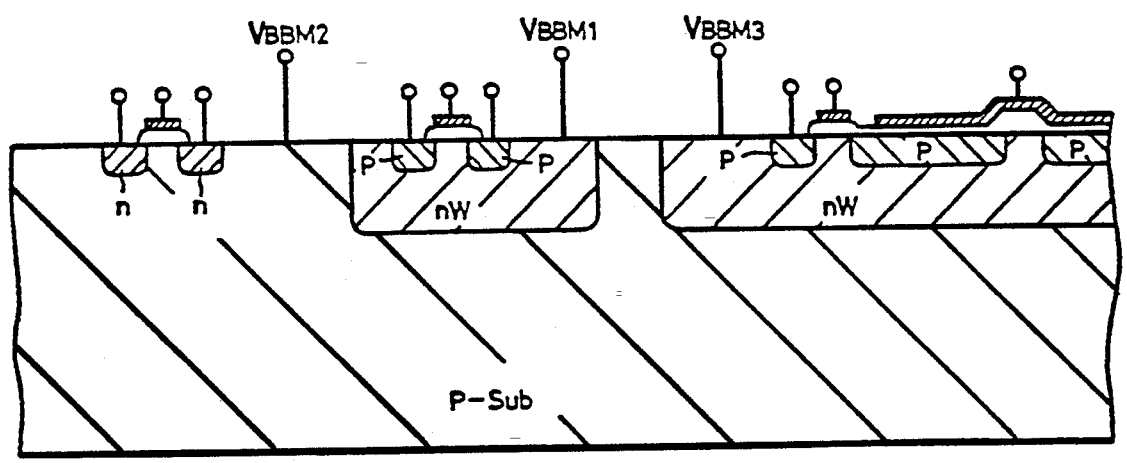

FIG. 44 illustrates an example in which a pMOS memory cell is formed on a p-type substrate p-Sub. A voltage $V_{BBM2}$ (for example, $-3$ V) is fed to the substrate of the nMOS transistor of a peripheral circuit, and a voltage $V_{BBM1}$ (for example, $+7$ V) is applied to the n-well of the pMOS transistor of another peripheral circuit, thereby to reduce the source and drain junction capacitances of the pMOS transistor. A voltage $V_{BBM3}$ (for example, a supply voltage $V_{CC}$) is applied to the n-well of the memory cell. Thus, it is possible to construct a memory in which the input circuit is immune against undershoots and can attain a high speed, while the memory cell is less prone to soft errors.

EMBODIMENT 13

In the above, Embodiments A–E applied to the MOS memories (SRAM, DRAM) have been described as the practicable configurations of Embodiment 12 with reference to FIGS. 40–44. Next, embodiments in each of which the present invention is applied to a memory by the use of the BiCMOS construction of FIG. 35 having both bipolar and MOS devices will be described with references to FIGS. 45–50. Among the embodiments, those to FIGS. 45–47 employ epitaxial layers, and those of FIGS. 48–50 don't employ epitaxial layers.

EMBODIMENT F

Figure 45:
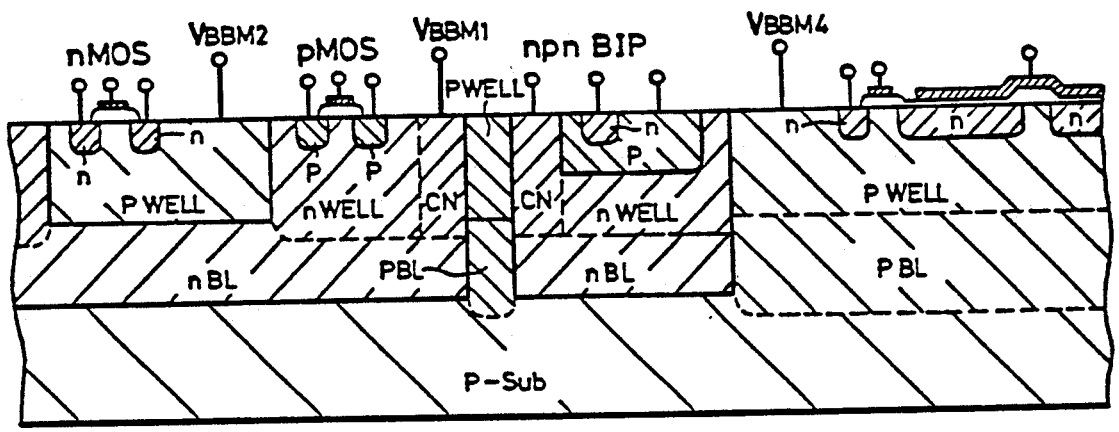
FIGS. 45 and 46 are sectional views each showing an embodiment of a bipolar-CMOS complex dynamic memory.

FIG. 45 shows the nMOS, pMOS and n-p-n bipolar transistors of peripheral circuits, and a dynamic type nMOS memory cell as viewed from the left.

Under the nMOS memory cell, a p-type buried layer (pBL) of high impurity concentration is put to intensify the soft-error immunity. This layer pBL is also used for the isolation of an n-type buried layer.

Although the nMOS transistor of the peripheral circuit is formed in a p-well, this p-well can be omitted when a p-type epitaxial layer is employed. An n-type buried layer nBL of high concentration is provided under this p-well layer, and an n-layer (CN) of high concentration is added for feeding a voltage to the layer nBL. Besides, the p-well has its side surrounded with an n-well thereby to be isolated from a p-type substrate p-Sub. A voltage $V_{BBM2}$ (for example, $-3$ V) is applied to the nMOS transistor of the peripheral circuit, and the voltage $V_{BBM1}$ (for example, a supply voltage $V_{CC}$) to the n-well of the pMOS transistor. A common voltage $V_{BBM4}$ is applied to the isolation layer of the n-p-n bipolar transistor and that of the nMOS transistor of the memory cell. Buried layers nBL and pBL provided under a well serve to reduce the collector resistance of the bipolar transistor, and are also effective to prevent latch-up through the decrease of a substrate resistance.

EMBODIMENT G

Figure 46:
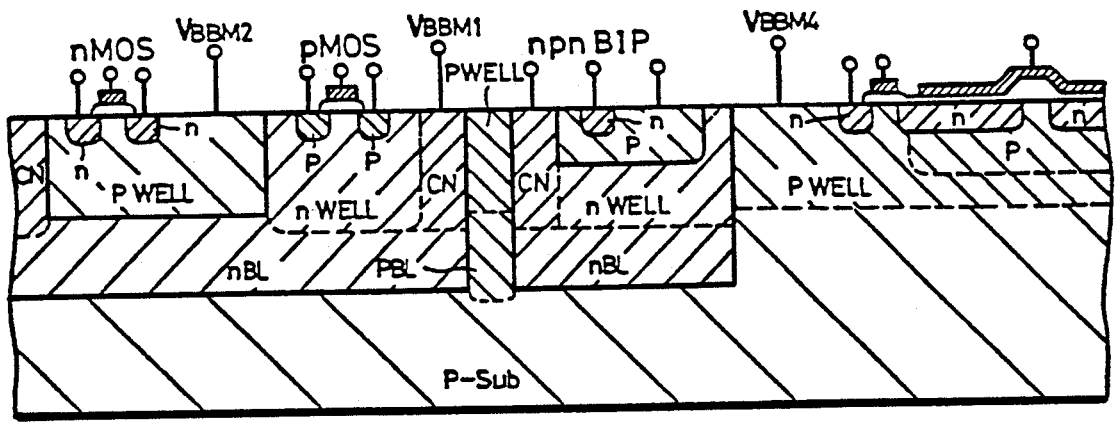

FIG. 46 illustrates an embodiment in which a memory cell is formed in a p-type substrate p-Sub, and the difference of which from the embodiment of FIG. 45 consists only in a construction under the memory cell. With the construction in FIG. 45, the buried layer pBL of high concentration might rise and cause the threshold voltage $V_{TH}$ of the nMOS transistor to fluctuate. In contrast, according to the construction in FIG. 46, a p-type high concentration layer indicated by a broken line is provided only under a storage capacitor so as to prevent the buried layer from rising to the channel part of the nMOS transistor of the memory cell.

Figure 47:
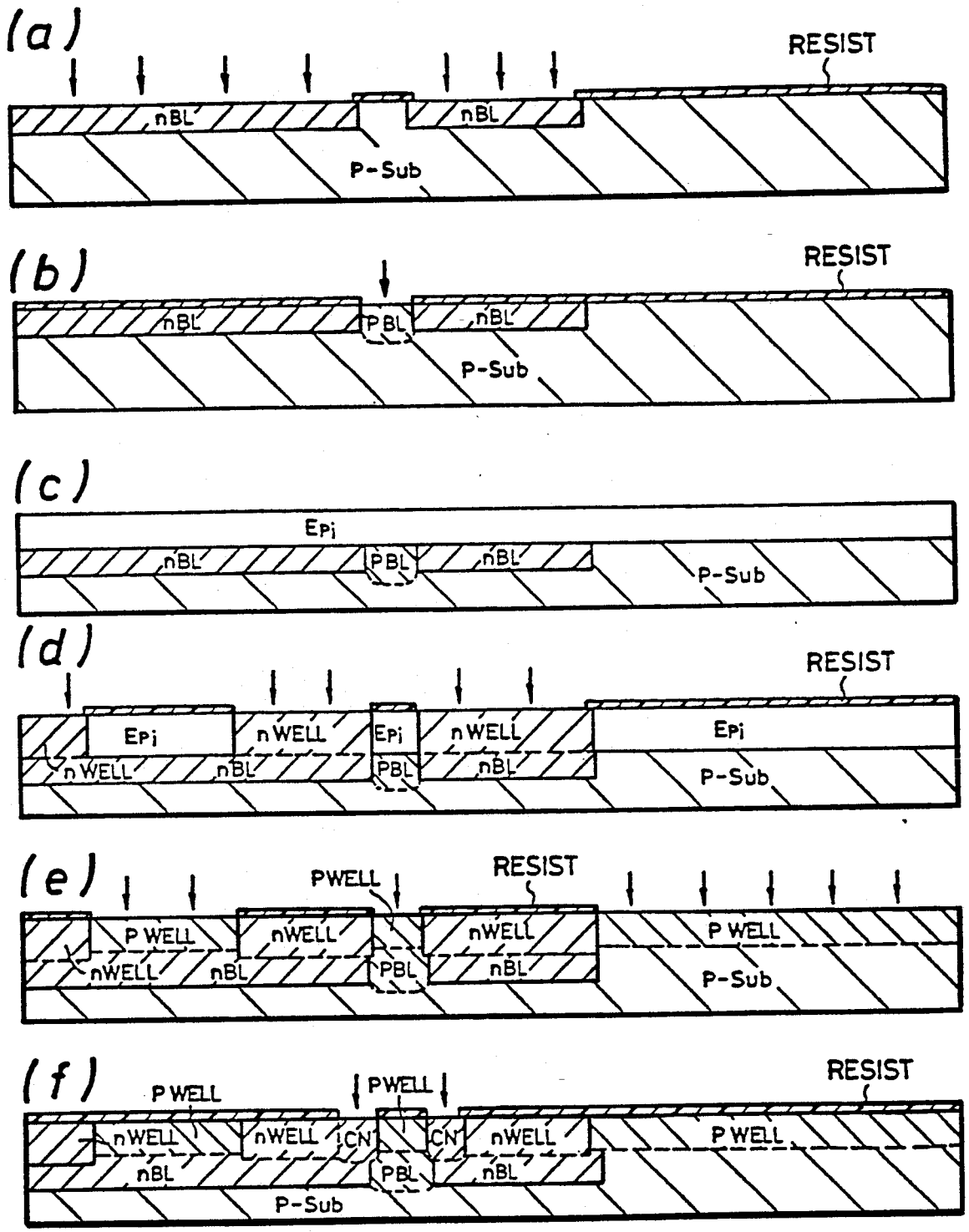
FIGS. 47a-47f illustrates sectional views showing an embodiment of principal steps for realizing the structure in FIG. 46.

Next, principal steps for realizing the sectional structure of FIG. 46 are illustrated in FIG. 47. At (a) in FIG. 47, n-type buried layers nBL are formed in the front surface of a p-type substrate, and at (b), a p-type buried layer pBL is further formed. Thereafter, a layer Epi is formed by epitaxial growth at (c), and n-wells (nWELL) and p-wells (pWELL) are formed in the layer Epi by steps (d) and (e). At (f), layers CN heavily doped with an n-type impurity are formed so as to connect with the underlying layers nBL. Though not shown in the drawing, the plate of a memory cell, the gates of MOS transistors, the source and drain layers of the MOS transistors, and if necessary, the emitter layer of a bipolar transistor are thereafter formed. Further, steps such as the formation of contact holes and metallization are thereafter required. In the illustration of FIGS. 45 and 46, the layers CN and nBL reduce the collector resistance of the bipolar transistor. On the other hand, the contact interfaces between the sources and drains and the wells of the MOS transistors and between the base and the collector of the bipolar transistor do not establish the contacts between layers of very high concentrations, and they can have their breakdown voltages held at degrees necessary for circuit operations.

EMBODIMENT H

The above has been an example of the process employing an epitaxial layer, and embodiments which do not employ the epitaxial layer will now be described with reference to FIGS. 48–50. These embodiments form a high concentration layer in the place of a p-type substrate at a fixed depth by the use of implantation. For this reason, they can curtail the cost of manufacture as compared with the case of employing the epitaxial layer.

FIG. 48 is a sectional view, and the corresponding conceptual diagram seen from the front surface of a chip is shown in FIG. 49. An nMOS transistor nMOS1 has its p-type isolation layer (pWELL) enclosed with an n-layer (CN or n-well), thereby to be isolated from a p-type substrate p-Sub.

The principal steps of a process for realizing the structure of FIGS. 48 and 49 are shown in FIG. 50. At (a), an n-layer of high concentration is provided in a substrate p-Sub at a fixed depth from the front surface thereof by ion implantation. Thereafter, an n-well and a p-well are formed at (b) and (c). The p-well can be omitted in the case of the p-type substrate p-Sub. At (d), n-layers (CN) of high concentration are formed so as to reach the n-type buried layer nBL. Steps after (d), for forming MOS and bipolar devices and metallization are similar to conventional steps.

As described above in conjunction with many embodiments, according to this third aspect of the present invention, independent voltages as desired can be applied to the substrate and isolation layer of a MOS device and the isolation layer of a bipolar device, and the optimum voltages conforming to the purposes of the circuits of the devices can be selected. Thus, the setting of concentration profiles, the setting of isolation voltages, etc. can be freely done in order to cope with the problems of the undershoots of inputs and outputs, junction capacitances, and soft errors.

Heretofore, the injection of minority carriers ascribable to surge noise etc. has arisen at a p-n junction constituting a MOS transistor or a BiP transistor formed in a silicon substrate, and it has formed the cause of such a problem as the destruction of a stored signal in an SRAM or a DRAM.

Such a phenomenon degrades the reliability of the semiconductor device and is unfavorable.

The present invention can prevent the phenomenon, is applicable to various products including MOS, BiP, CMOS, Bi-MOS and Bi-CMOS devices and is capable of enhancements in the reliability etc., so that it can be effectively utilized.

While we have shown and described several embodiments in accordance with the present invention, it is understood that the same is not limited thereto but is susceptible to numerous changes and modifications as known to one having ordinary skill in the art and we therefore do not wish to be limited to the details shown and described herein, but intend to cover all such modifications as are encompassed by the scope of the appended claims.

We claim:

1. A memory device comprising:
    (1) a semiconductor substrate, of a first conductivity type, having a main surface;
    (2) a memory array formed on said main surface of said substrate and including a plurality of MOS memory cells, the MOS memory cells being adapted to hold information;
    (3) a peripheral circuit formed on said main surface of said substrate, said peripheral circuit having at least one bipolar transistor;
    (4) a buried layer, provided under at least one of the memory array and peripheral circuit, of the same conductivity type as that of the substrate and having an impurity concentration higher than that of the substrate;
    (5) a further region, which together with said buried layer, acts as a shield so as to prevent minority carriers in the substrate from entering the memory array and destroying the information;
    (6) an input protective element positioned near the peripheral circuit; and
    (7) an n+-region comprising an n+-guard ring formed in the substrate around the input protective element, and an n+ buried layer formed beneath the input protective element,
    wherein said substrate is of p-conductivity type, and wherein said buried layer of said first conductivity type is a p+ buried layer.

2. A memory device according to claim 1, wherein said p+-buried layer is located at least under said memory array.

3. A memory device according to claim 2, wherein said at least one bipolar transistor includes an npn bipolar transistor having an n+-buried layer.

4. A semiconductor integrated circuit device comprising:
    a semiconductor body having a main surface;
    a semiconductor element which is capable of information storage, formed in a first portion of said main surface of said semiconductor body;
    a first semiconductor region of a first conductivity type formed in a second portion of said main surface of said semiconductor body, said second portion being different from said first portion;
    a second semiconductor region, of a second conductivity type opposite to said first conductivity type, formed in said first semiconductor region of said first conductivity type, said second semiconductor region being coupled to a bonding pad formed over the main surface of said semiconductor body, said second semiconductor region forming a p-n junction with said first semiconductor region;
    a buried semiconductor layer provided under said first semiconductor region and being at least positioned underneath said second semiconductor region, said buried semiconductor layer being of the same conductivity type as that of said first semiconductor region and having an impurity concentration higher than that of said first semiconductor region; and
    a third semiconductor region of said second conductivity type formed in said second portion of said main surface of said semiconductor body, said third semiconductor region having a first sub-region and a second sub-region, wherein said first sub-region is provided under said buried layer, wherein said second sub-region contacts said first sub-region and extends up to the main surface of said semiconductor body, and wherein said second sub-region surrounds said first semiconductor region.

5. A semiconductor integrated circuit device according to claim 4, wherein said third semiconductor region is connected to a fixed potential.

6. A semiconductor integrated circuit device according to claim 5, wherein said third semiconductor region acts as a shield so as to prevent minority carriers generated in said first semiconductor region from entering said first portion of said main surface of said semiconductor body and destroying the information stored by said semiconductor element.

7. A semiconductor integrated circuit device according to claim 4, wherein said semiconductor element comprises a flip-flop circuit having a pair of inverters which are input and output cross-coupled.

8. A semiconductor integrated circuit device according to claim 7, wherein said pair of inverters include MOS field effect transistors.

9. A semiconductor integrated circuit device according to claim 4, wherein said semiconductor element comprises a MOS memory cell, and wherein said MOS memory cell is a flip-flop memory cell including a MOS field effect transistor and a resistor.

10. A semiconductor integrated circuit device according to claim 4, wherein said buried semiconductor layer prevents said second semiconductor region and said first sub-region of said third semiconductor region from causing a punch-through effect.

11. A semiconductor integrated circuit device according to claim 4, wherein said second semiconductor region is a doped semiconductor region of a MOS field effect transistor used as a protective element for protecting an internal circuit formed on the main surface of said semiconductor body.

12. A semiconductor integrated circuit device according to claim 4, wherein said first conductivity type is p-type and said second conductivity type is n-type.

13. A semiconductor integrated circuit device according to claim 4, wherein said bonding pad is a terminal for electrical connection with a device which is external to said semiconductor integrated circuit device.

14. A semiconductor integrated circuit device comprising:
   a semiconductor substrate of a first conductivity type;
   an epitaxial semiconductor layer forming an interface with the semiconductor substrate, and having a main surface opposite to a surface of the semiconductor layer forming the interface with said semiconductor substrate, said epitaxial semiconductor layer together with said semiconductor substrate forming a semiconductor body;
   a semiconductor element which is capable of information storage, formed in a first portion of said main surface of said epitaxial semiconductor layer;
   a first semiconductor region of said first conductivity type formed in a second portion of said main surface of said epitaxial semiconductor layer, said second portion being different from said first portion;
   a second semiconductor region, of a second conductivity type opposite to said first conductivity type, formed in said first semiconductor region, said second semiconductor region being coupled to a bonding pad formed over the main surface of said epitaxial semiconductor layer and forming a p-n junction with said first semiconductor region;
   a buried semiconductor layer disposed at the interface between said semiconductor substrate and said epitaxial semiconductor layer, said buried semiconductor layer being provided under said first semiconductor region and being at least positioned underneath said second semiconductor region, said buried semiconductor layer being of the same conductivity type as that of said first semiconductor region and having an impurity concentration higher than that of said first semiconductor region; and
   a third semiconductor region of said second conductivity type formed in said semiconductor body, said third semiconductor region having a first sub-region provided under said buried semiconductor layer and a second sub-region formed in said second portion of said epitaxial semiconductor layer, wherein said second sub-region contacts said first sub-region and extends up to the main surface of said semiconductor body, and wherein said second sub-region surrounds said first semiconductor region.

15. A semiconductor integrated circuit device according to claim 14, wherein said third semiconductor region is connected to a fixed potential.

16. A semiconductor integrated circuit device according to claim 15, wherein said third semiconductor region acts as a shield so as to prevent minority carriers generated in said first semiconductor region from entering said first portion of said main surface of said epitaxial semiconductor layer of said semiconductor body and destroying the information stored by said semiconductor element.

17. A semiconductor integrated circuit device according to claim 14, wherein said semiconductor element comprises a flip-flop circuit having a pair of inverters which are input and output cross-coupled.

18. A semiconductor integrated circuit device according to claim 17, wherein said pair of inverters include MOS field effect transistors.

19. A semiconductor integrated circuit device according to claim 14, wherein said semiconductor element comprises a MOS memory cell, and wherein said MOS memory cell is a flip-flop memory cell including a MOS field effect transistor and a resistor.

20. A semiconductor integrated circuit device according to claim 14, wherein said buried semiconductor layer prevents said second semiconductor region and said first sub-region of said third semiconductor region from causing a punch-through effect.

21. A semiconductor integrated circuit device according to claim 14, wherein said second semiconductor region is a doped semiconductor region of a MOS field effect transistor used as a protective element for protecting an internal circuit formed on the main surface of said semiconductor body.

22. A semiconductor integrated circuit device according to claim 14, wherein said first conductivity type is p-type and said second conductivity type is n-type.

23. A semiconductor integrated circuit device according to claim 14, wherein said bonding pad is a terminal for electrical connection with a device which is external to said semiconductor integrated circuit device.

24. A memory device comprising:
   (1) a semiconductor substrate, of a first conductivity type, having a main surface;
   (2) a memory array formed on said main surface of said substrate and including a plurality of MOS memory cells, the memory cells being adapted to hold information;
   (3) a peripheral circuit formed on said main surface of said substrate, said peripheral circuit having at least one bipolar transistor;
   (4) a buried layer, provided under at least one of the memory array and peripheral circuit, of the same conductivity type as that of the substrate and having an impurity concentration higher than that of the substrate;
   (5) a further region, which together with said buried layer, acts as a shield so as to prevent minority carriers in the substrate from entering the memory array and destroying the information;
   (6) an input protective element positioned near the peripheral circuit; and
   (7) an n+-region comprising an n+-guard ring formed in the substrate around the input protective element, and an n+ buried layer formed beneath the input protective element,
   wherein said further region is a semiconductor region of a second conductivity type, opposite to the first conductivity type, and wherein said buried layer of said first conductivity type is contacted with said semiconductor region of said second conductivity type.

25. A memory device according to claim 24, wherein said peripheral circuit includes a MISFET of said first conductivity type, and wherein said MISFET of said first conductivity type is located in said semiconductor region of said second conductivity type.

26. A memory device according to claim 25, wherein said buried layer of said first conductivity type is a p+ buried layer and said semiconductor region of said second conductivity type is an n-well, and wherein said MISFET of the peripheral circuit located in the semiconductor region of said second conductivity type is a p-channel MISFET.

27. A memory device according to claim 24, wherein said semiconductor region of a second conductivity type is a well region.

28. A memory device comprising:
(1) a semiconductor substrate, of a first conductivity type, having a main surface;
(2) a memory array formed on said main surface of said substrate and including a plurality of MOS memory cells, the memory cells being adapted to hold information;
(3) a peripheral circuit formed on said main surface of said substrate, said peripheral circuit having at least one bipolar transistor;
(4) a buried layer, provided under at least one of the memory array and peripheral circuit, of the same conductivity type as that of the substrate and having an impurity concentration higher than that of the substrate;
(5) a further region, which together with said buried layer, acts as a shield so as to prevent minority carriers in the substrate from entering the memory array and destroying the information; and
(6) an input protective element positioned near the peripheral circuit,
wherein said further region is a semiconductor region of a second conductivity type, opposite to the first conductivity type, and wherein said buried layer of said first conductivity type is contacted with said semiconductor region of said second conductivity type.

29. A memory device comprising:
(1) a semiconductor substrate, of a first conductivity type, having a main surface;
(2) a memory array formed on said main surface of said substrate and including a plurality of MOS memory cells, the memory cells being adapted to hold information:
(3) a peripheral circuit formed on said main surface of said substrate, said peripheral circuit having at least one bipolar transistor;
(4) a buried layer, provided under at least one of the memory array and peripheral circuit, of the same conductivity type as that of the substrate and having an impurity concentration higher than that of the substrate;
(5) a further region, which together with said buried layer, acts as a shield so as to prevent minority carriers in the substrate from entering the memory array and destroying the information; and
(6) an input protective element positioned near the peripheral circuit,
wherein said substrate if so p-conductivity type, and wherein said buried layer of said first conductivity type is a p+ buried layer.

30. A memory device according to claim 27, wherein a MISFET of the peripheral circuit is located in said well region.

31. A memory device according to claim 30, wherein said buried layer is a p+-buried layer, and said well region is an n-well, and wherein said MISFET of the peripheral circuit located in the well region is a P-channel MISFET.

* * * * *